(12) United States Patent
Kawaguchi et al.

(10) Patent No.: US 11,672,112 B2
(45) Date of Patent: Jun. 6, 2023

(54) SEMICONDUCTOR MEMORY DEVICE WITH PROTRUDING SEPARATING PORTIONS

(71) Applicant: Kioxia Corporation, Minato-ku (JP)

(72) Inventors: Genki Kawaguchi, Yokkaichi (JP); Yasuhito Yoshimizu, Yokkaichi (JP); Yusuke Shima, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 259 days.

(21) Appl. No.: 16/986,853

(22) Filed: Aug. 6, 2020

(65) Prior Publication Data
US 2021/0043640 A1 Feb. 11, 2021

(30) Foreign Application Priority Data
Aug. 8, 2019 (JP) .............................. JP2019-146505

(51) Int. Cl.
| G11C 5/06 | (2006.01) |
| H01L 27/11556 | (2017.01) |
| H01L 27/11582 | (2017.01) |
| G11C 16/04 | (2006.01) |
| G11C 5/02 | (2006.01) |

(52) U.S. Cl.
CPC ........ H01L 27/11556 (2013.01); G11C 5/025 (2013.01); G11C 5/06 (2013.01); G11C 16/0408 (2013.01); G11C 16/0466 (2013.01); G11C 16/0483 (2013.01); H01L 27/11582 (2013.01)

(58) Field of Classification Search
CPC ......... H01L 27/11556; H01L 27/11582; H01L 27/11565; H01L 27/1157; H01L 27/11524; G11C 5/025; G11C 5/06; G11C 16/0408; G11C 16/0466; G11C 16/0483

See application file for complete search history.

(56) References Cited

U.S. PATENT DOCUMENTS

| 8,787,061 | B2 | 7/2014 | Kono |
| 10,056,333 | B2 | 8/2018 | Mizukami et al. |
| 10,141,329 | B2 | 11/2018 | Tsuda et al. |
| 2012/0098050 | A1* | 4/2012 | Shim ................ H01L 27/11578 257/E29.262 |
| 2013/0134493 | A1* | 5/2013 | Eom ................ H01L 27/11582 257/314 |

(Continued)

FOREIGN PATENT DOCUMENTS

| JP | 2009-16400 A | 1/2009 |
| JP | 2016-92044 A | 5/2016 |

*Primary Examiner* — Jerome Leboeuf
(74) *Attorney, Agent, or Firm* — Oblon, McClelland, Maier & Neustadt, L.L.P.

(57) ABSTRACT

According to one embodiment, a semiconductor memory device includes: a plurality of first insulating layers; a plurality of first interconnect layers stacked alternately with the first insulating layers; a plurality of second interconnect layers arranged adjacently to the first interconnect layers; and a separation region including a plurality of first portions provided between the first interconnect layers and the second interconnect layers, and a plurality of second portions protruding from an outer periphery of each of the first portions. The second portions are linked to each other. The first interconnect layers and the second interconnect layers are separated from each other by the first portions and the linked second portions.

17 Claims, 72 Drawing Sheets

(56) References Cited

U.S. PATENT DOCUMENTS

| | | | |
|---|---|---|---|
| 2015/0001460 A1* | 1/2015 | Kim | H01L 27/11519 |
| | | | 257/5 |
| 2019/0326319 A1* | 10/2019 | Yun | H01L 23/535 |
| 2020/0035694 A1* | 1/2020 | Kaminaga | H01L 27/11556 |

* cited by examiner

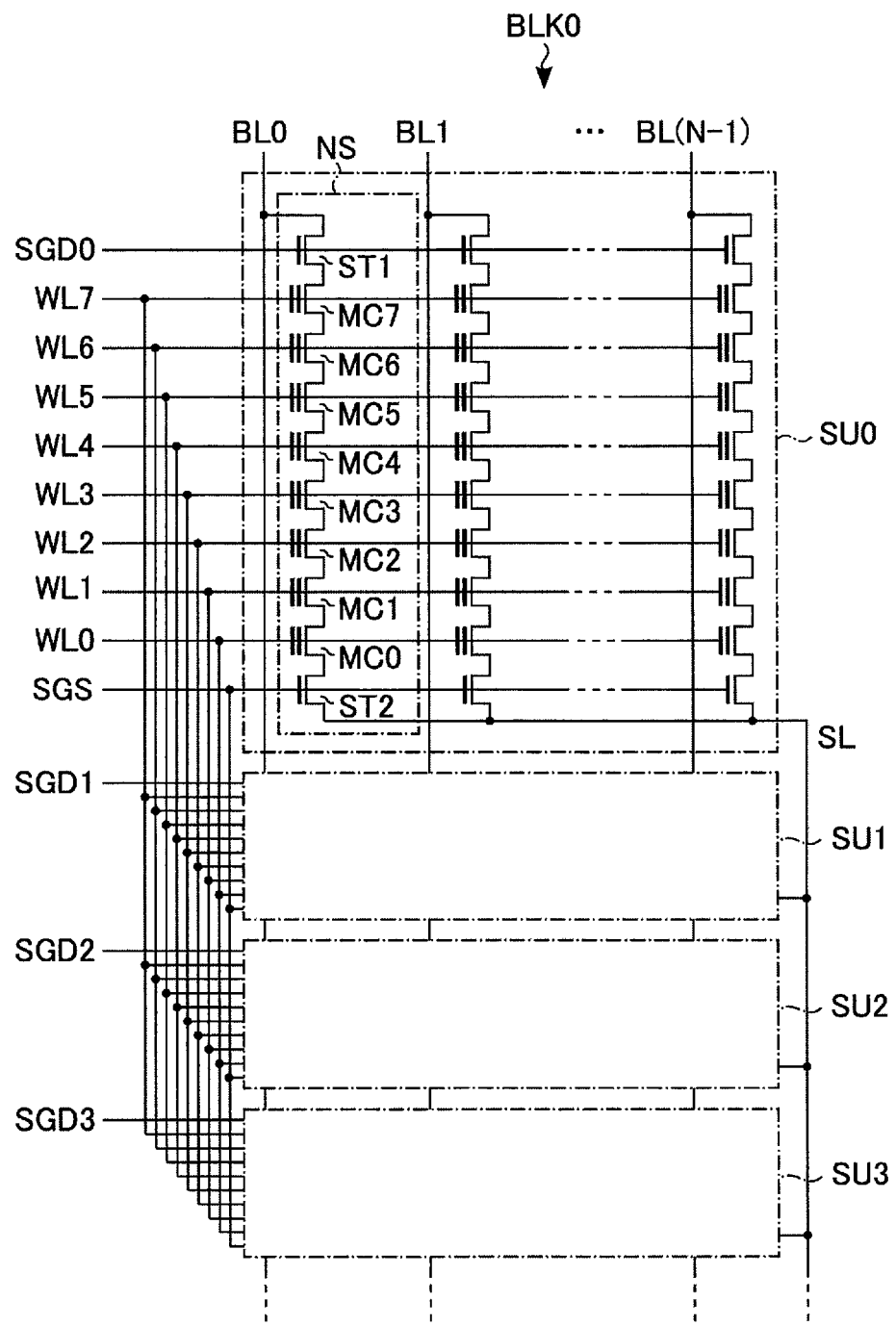
F I G. 2

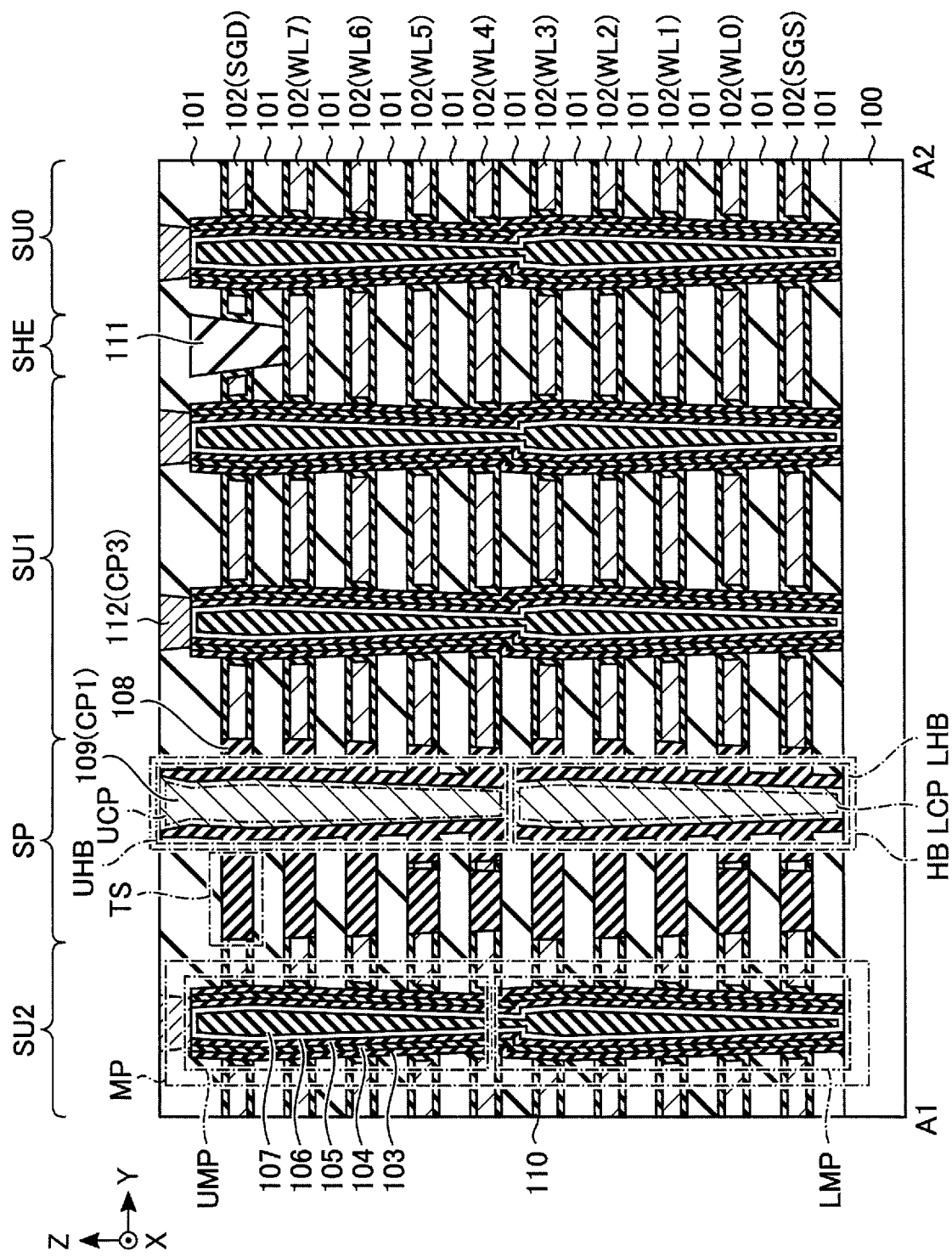
F I G. 5

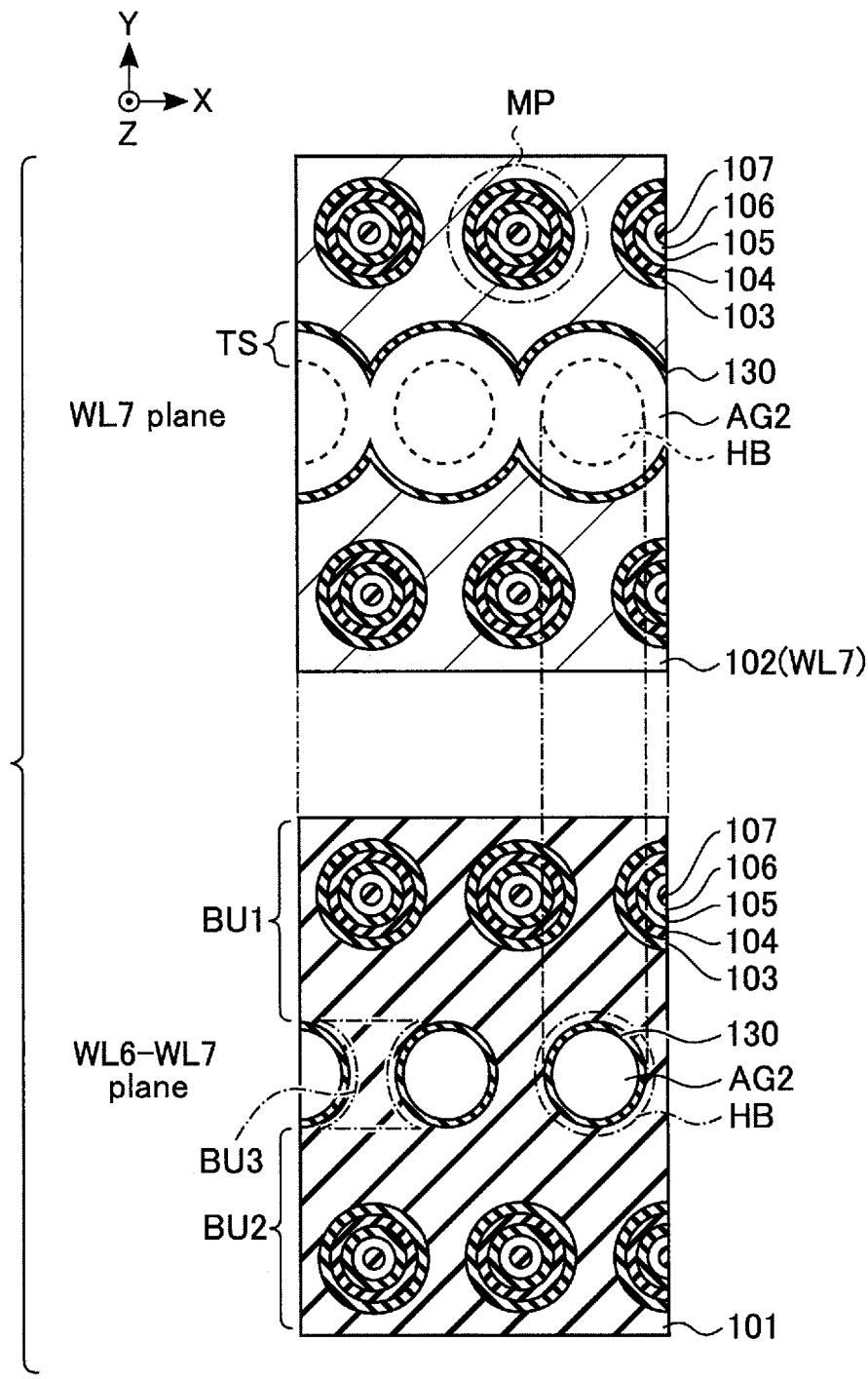
F I G. 20

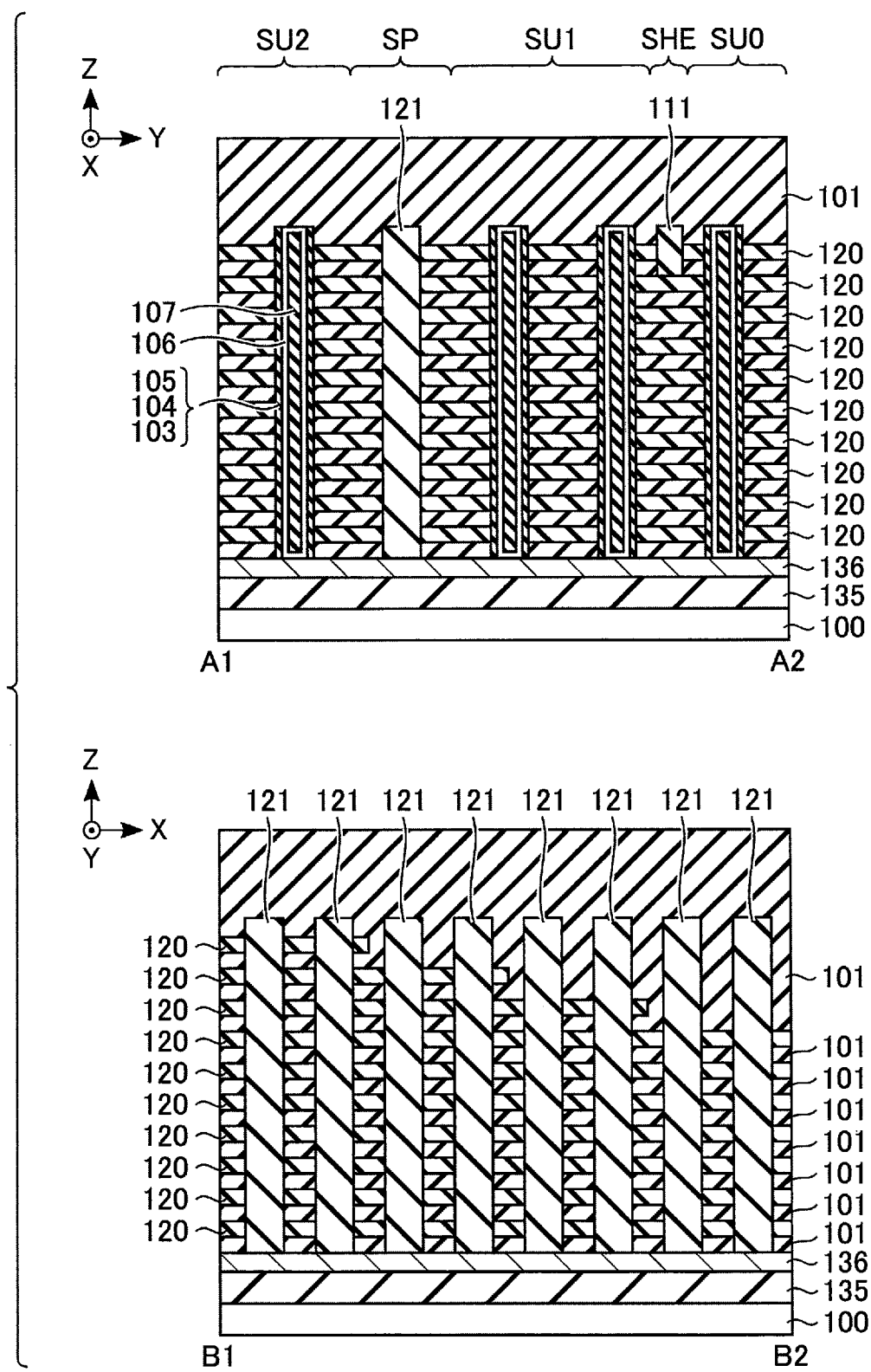
F I G. 50

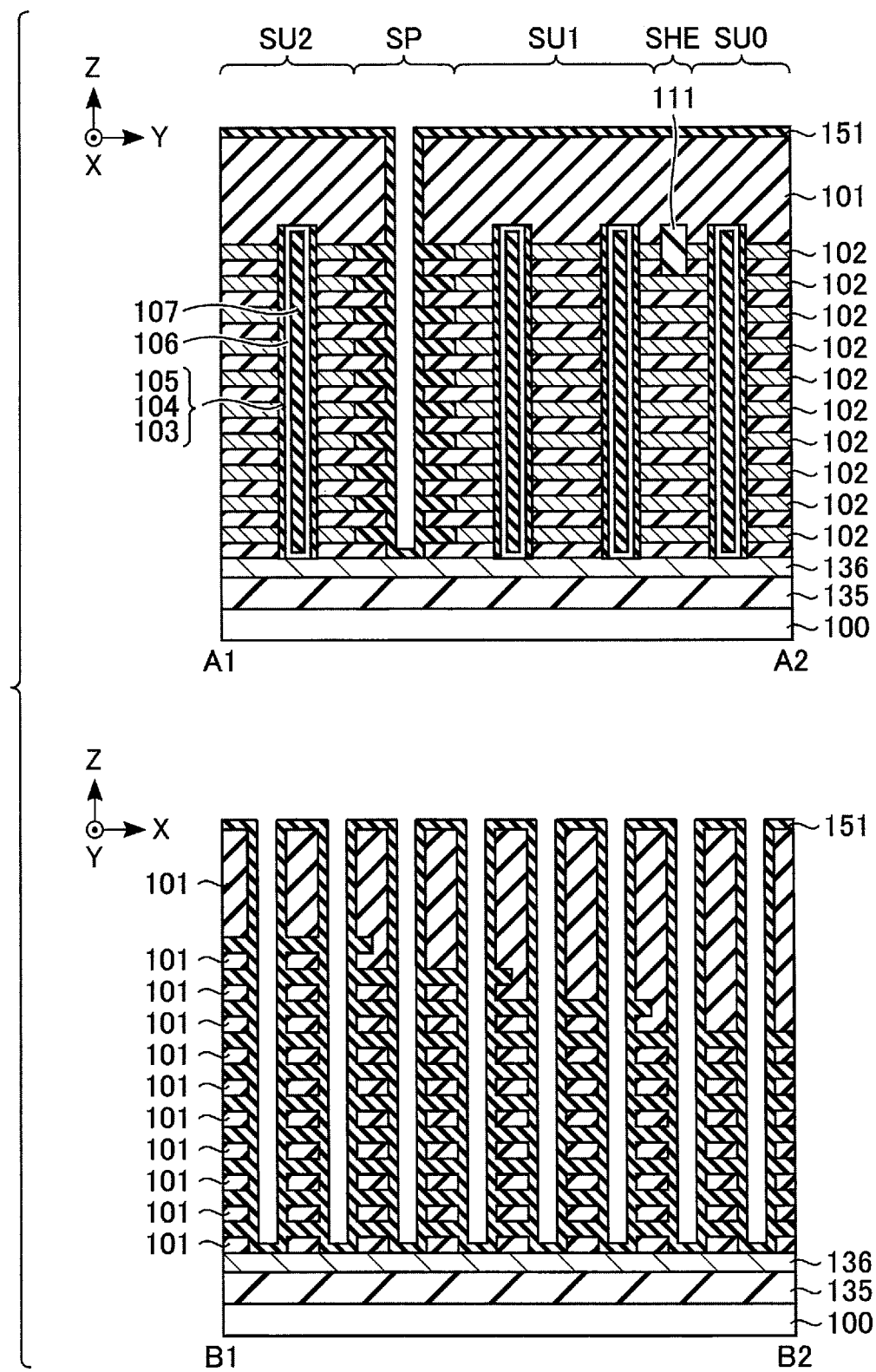
F I G. 56

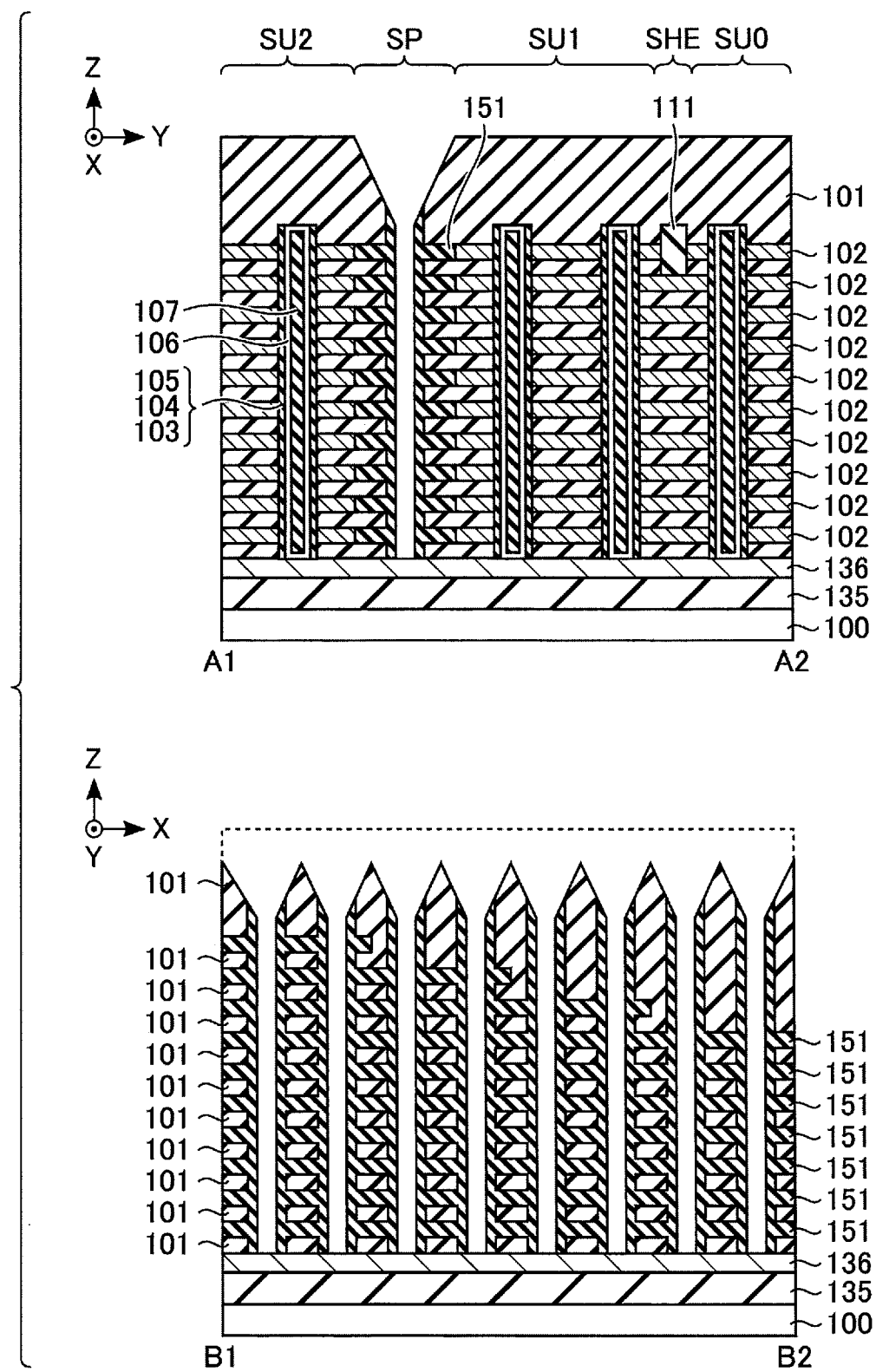
F I G. 57

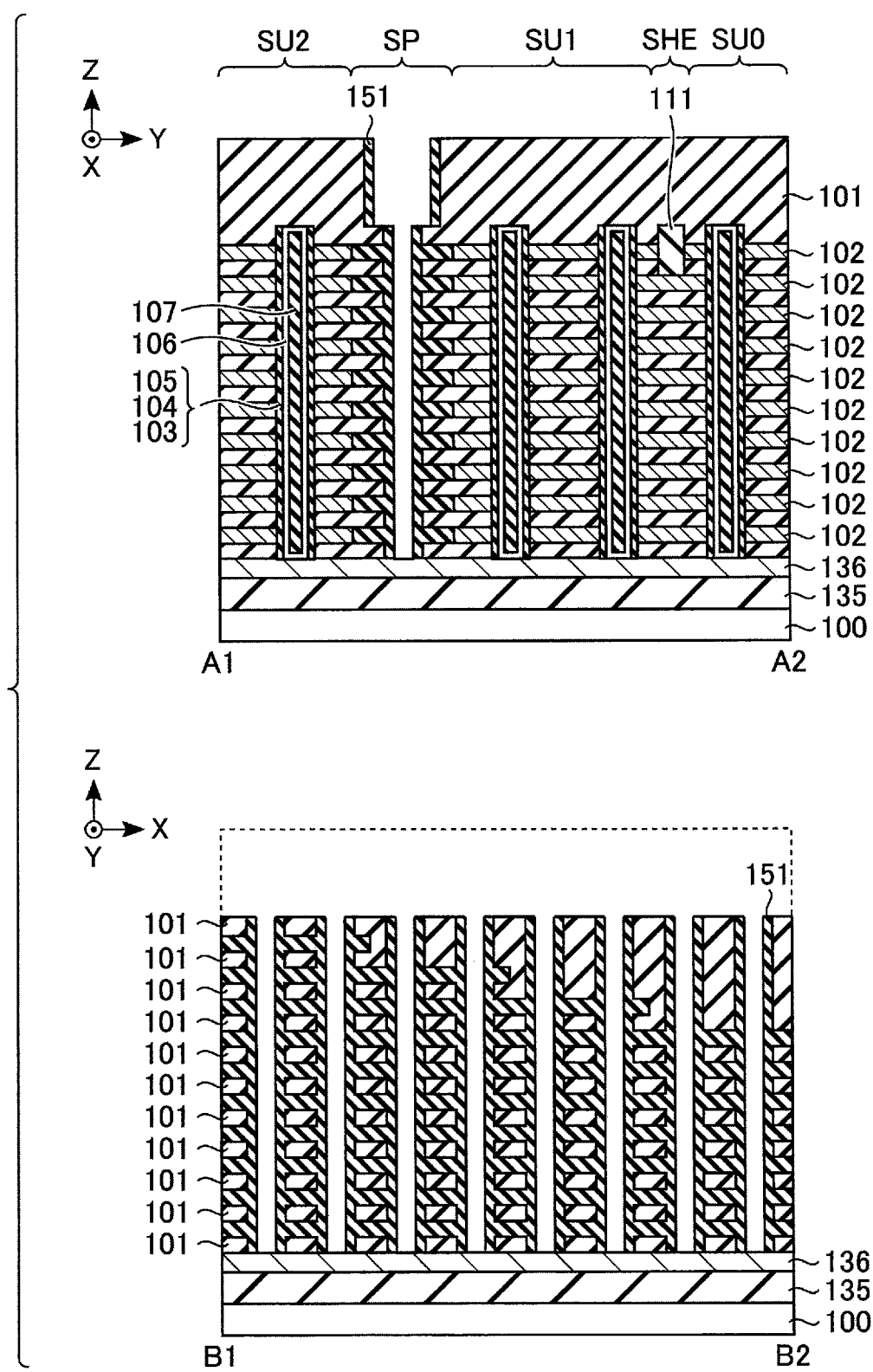
F I G. 70

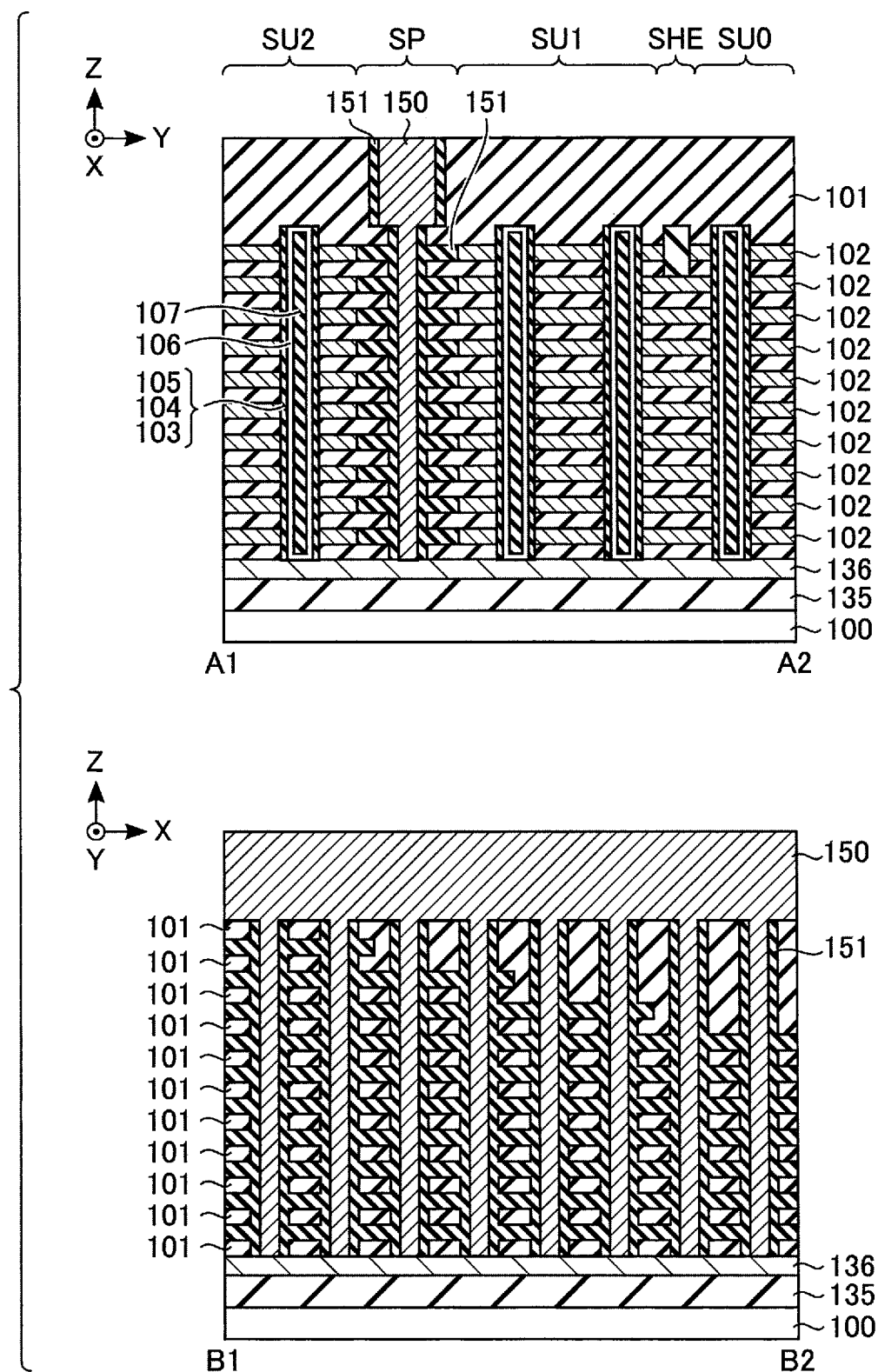
F I G. 72

SEMICONDUCTOR MEMORY DEVICE WITH PROTRUDING SEPARATING PORTIONS

CROSS-REFERENCE TO RELATED APPLICATIONS

This application is based upon and claims the benefit of priority from Japanese Patent Application No. 2019-146505, filed Aug. 8, 2019, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 2 is a circuit diagram of a memory cell array included in the semiconductor memory device according to the first embodiment;

FIG. 5 is a cross-sectional view taken along line A1-A2 of FIG. 3;

FIG. 20 is an enlarged view of a region RA shown in FIG. 19;

FIGS. 50-59 are diagrams showing a process of manufacturing the memory cell array included in the semiconductor memory device according to the sixth embodiment;

FIGS. 64-72 are diagrams showing a process of manufacturing the memory cell array included in the semiconductor memory device according to the seventh embodiment.

DETAILED DESCRIPTION

In general, according to one embodiment, a semiconductor memory device includes: a plurality of first insulating layers arranged apart from each other in a first direction; a plurality of first interconnect layers stacked alternately with the first insulating layers, and extending in a second direction intersecting the first direction; a plurality of second interconnect layers stacked alternately with the first insulating layers, arranged adjacently to the first interconnect layers in a third direction intersecting the first and second directions, and extending in the second direction; a plurality of first semiconductor layers extending in the first direction and passing through the first interconnect layers and the first insulating layers; a plurality of second semiconductor layers extending in the first direction and passing through the second interconnect layers and the first insulating layers; and a separation region including a plurality of first portions and a plurality of second portions. The first portions extend in the first direction, pass through the first insulating layers, are provided between the first interconnect layers and the second interconnect layers, and are arranged apart from each other in the second direction. The second portions are provided between the first interconnect layers and the second interconnect layers, and protrude from an outer periphery of each of the first portions. The second portions protruding from adjacent ones of the first portions are linked to each other. The first interconnect layers and the second interconnect layers are separated from each other in the third direction by the first portions and the linked second portions.

Hereinafter, embodiments will be described with reference to the accompanying drawings. In the following description, structural elements having approximately the same function and configuration will be assigned the same reference symbol, and a repeat description will be given only where necessary. The embodiments to be described below are shown as an example of a device or a method for embodying the technical idea of the embodiments, and are not intended to limit the material, shape, structure, arrangement, etc. of components to those described below. The technical idea of the embodiments may be variously modified in the claims.

1. First Embodiment

A semiconductor memory device according to a first embodiment will be described. Hereinafter, a three-dimensional stacked NAND-type flash memory in which memory cell transistors are three-dimensionally stacked on a semiconductor substrate will be described as an example of the semiconductor memory device.

1.1 Configuration

1.1.1 Overall Configuration of Semiconductor Memory Device

Figure 1:
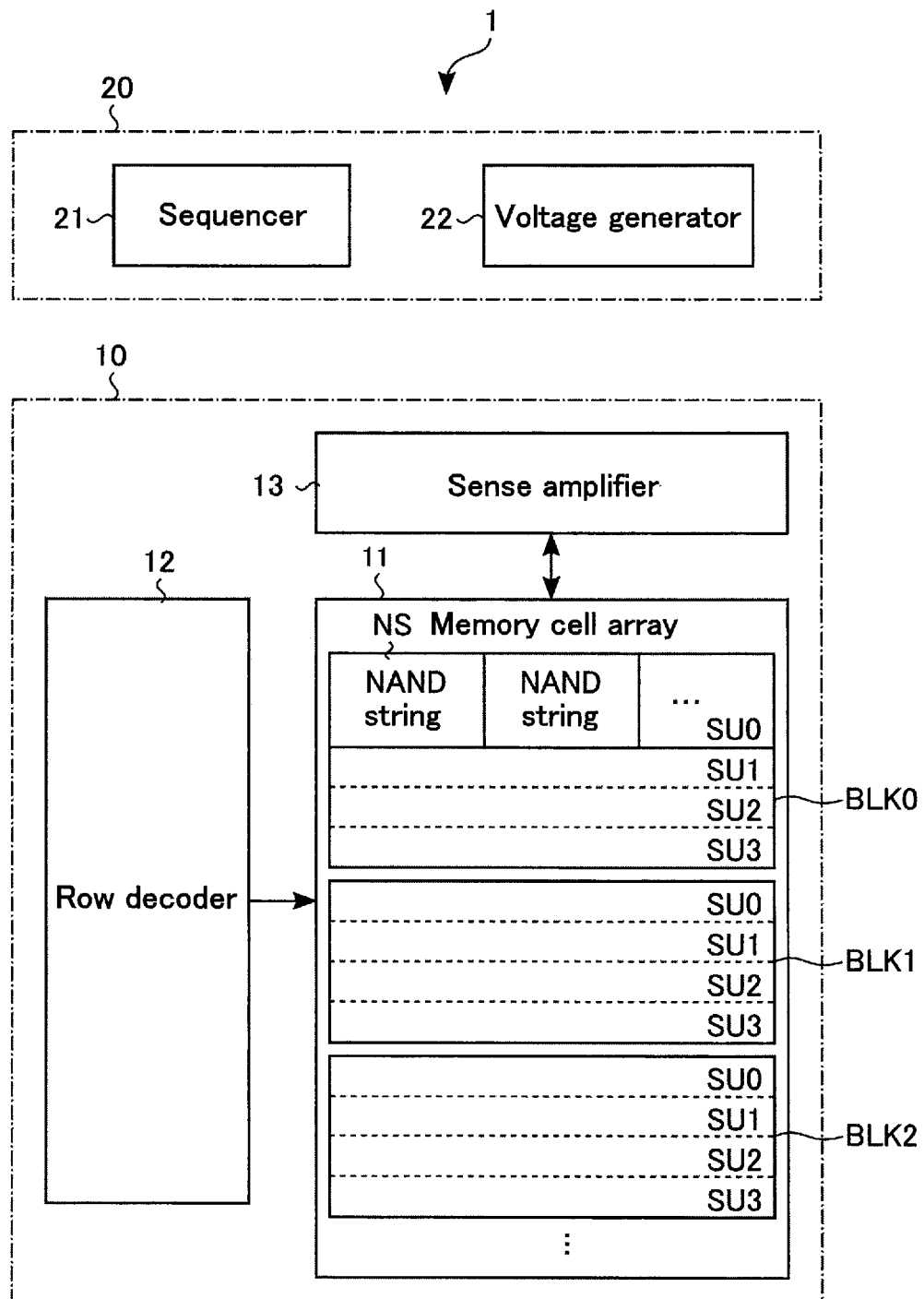
FIG. 1 is a block diagram of a semiconductor memory device according to a first embodiment.

An example of an overall configuration of a semiconductor memory device will be described with reference to FIG. 1. FIG. 1 is an example of a block diagram showing a basic overall configuration of the semiconductor memory device.

As shown in FIG. 1, a semiconductor memory device 1 includes a memory core unit 10 and a peripheral circuit unit 20.

The memory core unit 10 includes a memory cell array 11, a row decoder 12, and a sense amplifier 13.

The memory cell array 11 includes a plurality of blocks BLK (BLK0, BLK1, BLK2, ... ). Each block BLK includes a plurality of (four in the present embodiment) string units SU (SU0 to SU3) each configured of a group of NAND strings NS each including a plurality of memory cell transistors that are coupled in series. The number of blocks BLK in the memory cell array 11 and the number of string units SU in each block BLK may be designed to be any number.

The row decoder 12 decodes a row address received from an unillustrated external controller. Based on the result of the decoding, the row decoder 12 selects an interconnect extending in a row direction in the memory cell array 11. More specifically, the row decoder 12 applies voltages to various interconnects (word lines WL and select gate lines SGD and SGS) for selecting memory cells aligned in the row direction.

At the time of data reading, the sense amplifier 13 senses data read from one of the blocks BLK via a bit line. At the time of data writing, the sense amplifier 13 applies a voltage corresponding to the write data to the memory cell array 11 via the bit line.

The peripheral circuit unit 20 includes a sequencer 21 and a voltage generator 22.

The sequencer 21 controls the overall operation of the semiconductor memory device 1. More specifically, the sequencer 21 controls the voltage generator 22, the row decoder 12, the sense amplifier 13, etc. during a write operation, a read operation, and an erase operation.

The voltage generator 22 generates voltages used in a write operation, a read operation, and an erase operation, and supplies the generated voltages to the row decoder 12, the sense amplifier 13, etc.

1.1.2 Configuration of Memory Cell Array

Next, an example configuration of the memory cell array 11 will be described with reference to FIG. 2. The example of FIG. 2 shows a configuration of a block BLK0; however, the other blocks BLK have the same configuration.

As shown in FIG. 2, the block BLK0 includes, for example, four string units SU0 to SU3. Each string unit SU includes a plurality of NAND strings NS. Each of the NAND strings NS includes, for example, eight memory cell transistors MC (MC0 to MC7) and select transistors ST1 and ST2. Each memory cell transistor MC includes a control gate and a charge storage layer, and stores data in a non-volatile manner. Hereinafter, each of the memory cell transistors MC0 to MC7 will be referred to as a "memory cell transistor MC" when they are not distinguished from one another.

The memory cell transistor MC may be of a MONOS type which uses an insulating layer as the charge storage layer, or of an FG type which uses a conductive layer as the charge storage layer. In the embodiments to be described below, the MONOS type will be taken as an example. The number of memory cell transistors MC included in a single NAND string NS is not limited to eight, and may be any number such as 16, 32, 64, 96, and 128. The example of FIG. 2 shows a case where each NAND string NS includes a single select transistor ST1 and a single select transistor ST2; however, the number of select transistors ST1 and ST2 included in each NAND string NS may be any number equal to or greater than one.

In each NAND string NS, current paths of the select transistor ST2, the memory cell transistors MC0 to MC7, and the select transistor ST1 are coupled in series in this order. A drain of the select transistor ST1 is coupled to a corresponding bit line BL. A source of the select transistor ST2 is coupled to a source line SL.

Control gates of memory cell transistors MC0 to MC7 in NAND strings NS in the same block BLK are commonly coupled to word lines WL0 to WL7, respectively. More specifically, controls gates of, for example, memory cell transistors MC0 in the same block BLK are commonly coupled to a word line WL0.

Gates of select transistors ST1 of NAND strings NS in the same string unit US are commonly coupled to a select gate line SGD. More specifically, gates of select transistors ST1 in the string unit SU0 are coupled to a select gate line SGD0. Gates of select transistors ST1 (not illustrated) in the string unit SU1 are coupled to a select gate line SGD1. Gates of select transistors ST1 (not illustrated) in the string unit SU2 are coupled to a select gate line SGD2. Gates of select transistors ST1 (not illustrated) in the string unit SU3 are coupled to a select gate line SGD3. Hereinafter, each of the select gate lines SGD0 to SGD3 will be referred to as a "select gate line SGD" when they are not distinguished from one another.

Gates of select transistors ST2 in the same block BLK are commonly coupled to a select gate line SGS. Gates of select transistors ST2 may be coupled to different select gate lines SGS according to the string unit SU.

Drains of select transistors ST1 in a string unit SU are coupled to different bit lines BL (BL0 to BL (N−1), where N is a natural number equal to or greater than 2). That is, NAND strings NS in a string unit SU are coupled to different bit lines BL. Each bit line BL commonly couples NAND strings NS that are included in the respective string units SU0 to SU3 in each block BLK.

Sources of select transistors ST2 in a plurality of blocks BLK are commonly coupled to the source line SL.

That is, a string unit SU is a group of NAND strings NS which are coupled to different bit lines BL and are coupled to the same select gate line SGD. Also, a block BLK is a group of string units SU that share the same word lines WL. The memory cell array 11 is a group of blocks BLK that share the same bit lines BL.

1.1.3 Planar Configuration of Memory Cell Array

Figure 3:
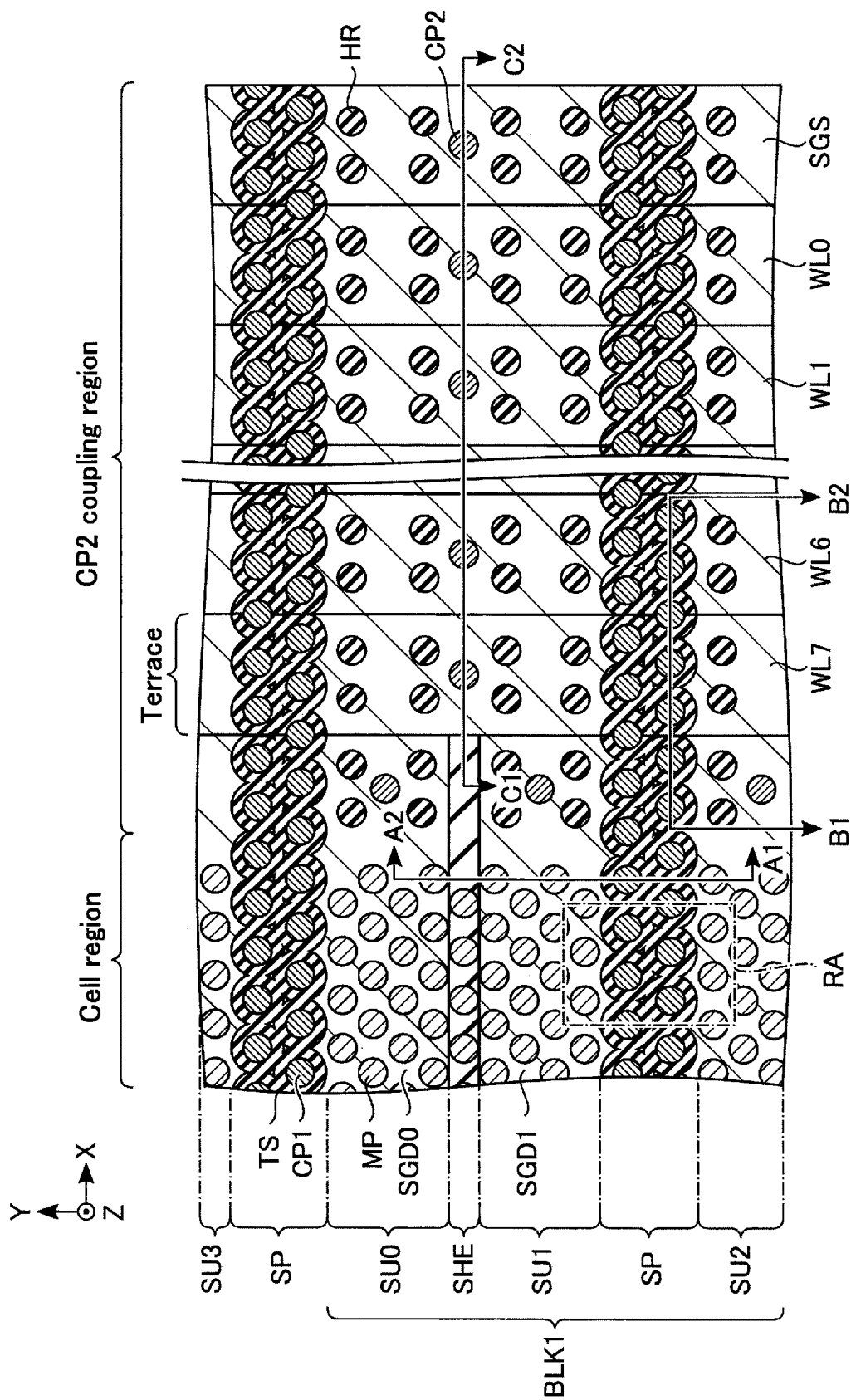
FIG. 3 is a plan view of the memory cell array included in the semiconductor memory device according to the first embodiment.
Figure 4:
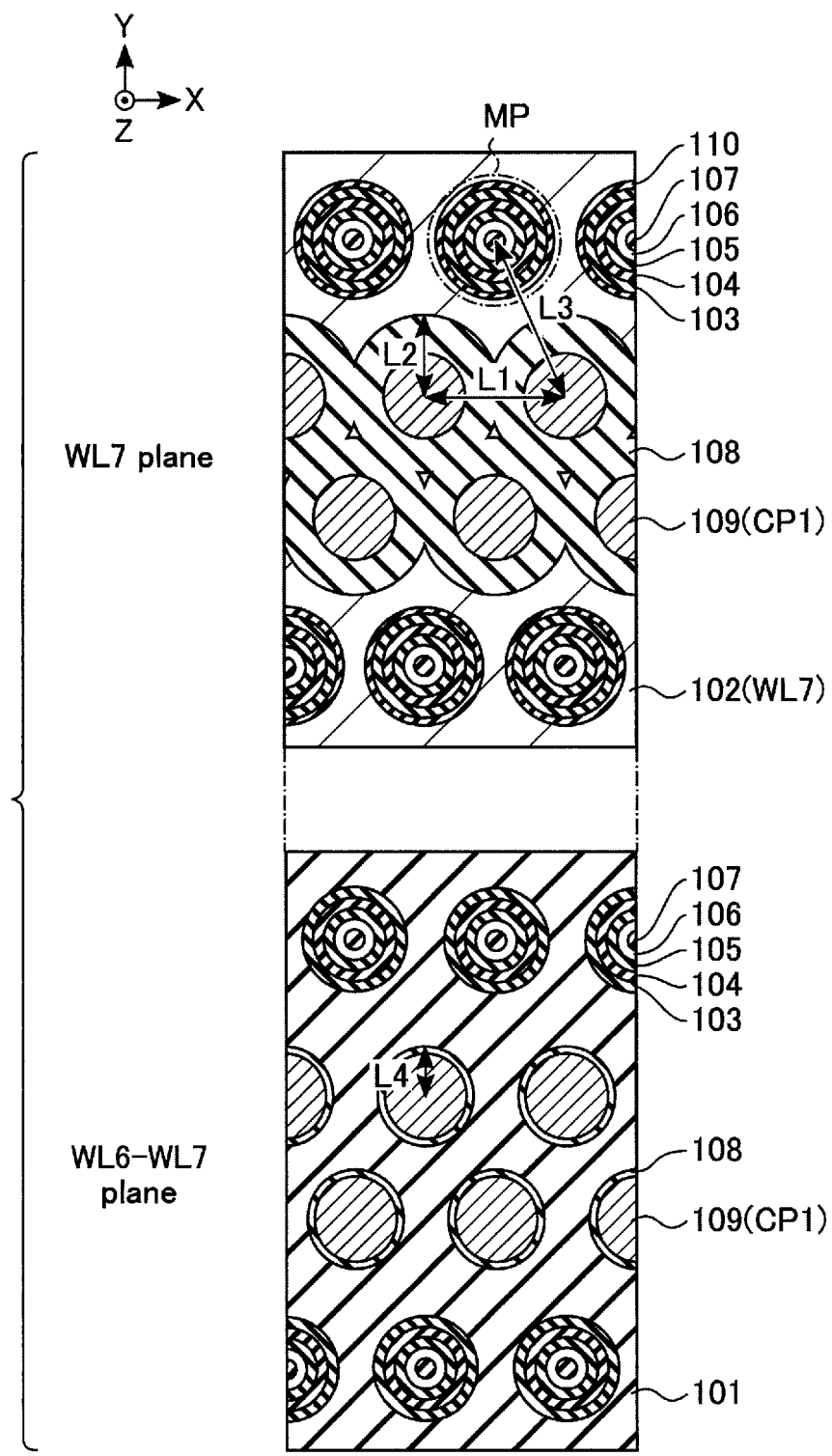
FIG. 4 is an enlarged view of a region RA shown in FIG. 3.

Next, an example planar configuration of the memory cell array 11 will be described with reference to FIGS. 3 and 4. FIG. 3 is a plan view of string units SU0 and SU1 in a block BLK1. In the example of FIG. 3, interlayer insulating films are omitted. FIG. 4 is an enlarged view of a region RA shown in FIG. 3.

As shown in FIG. 3, in the present embodiment, a select gate line SGS, word lines WL0 to WL7, and a select gate line SGD are stacked apart from each other in order from the lower layer, as viewed in a Z direction substantially perpendicular to a semiconductor substrate. String units SU0 to SU3 are provided adjacent to each other in a Y direction substantially parallel to the semiconductor substrate. A separation region SP is provided between the string unit SU1 and the string unit SU2, and between the string unit SU3 and the string unit SU0. The separation region SP separates the select gate lines SGD and SGS and the word lines WL0 to WL7 that are adjacent to each other in the Y direction.

In the separation region SP, a plurality of pillar portions are provided, for example, in a two-row staggered arrangement along the X direction which is substantially parallel to the semiconductor substrate and intersecting the Y direction. The pillar portions pass through the select gate line SGD, the word lines WL, and the select gate line SGS, and extend in the Z direction. In the present embodiment, contact plugs CP1 are provided in interior portions of the respective pillar portions. Each contact plug CP1 electrically couples an interconnect (e.g., the source line. SL) provided below the select gate line SGS and an interconnect provided above the select gate line SGD.

At each of the layers of the select gate lines SGD and SGS and the word lines WL, a plurality of protruding portions TS are provided outside the respective contact plugs CP1 (pillar portions) in such a manner, for example, that each protruding portion TS concentrically protrudes from a center (central axis) of the corresponding contact plug CP1. By the protruding portions TS provided at each layer, the contact plugs CP1 are not electrically coupled to either the select gate lines SGD and SGS or the word lines WL. The protruding portions TS are provided in such a manner that protruding portions TS of adjacent pillar portions at the same layer are linked to each other, as viewed in the XY plane. The linked protruding portions TS at each layer are provided to reach both ends of the select gate lines SGD and SGS and the word lines WL in the X direction. By the protruding portions TS provided in the separation region SP, the select gate lines SGD and SGS and the word lines WL are separated along the Y direction.

In the example of FIG. 3, a case is shown where the contact plugs CP1 form a two-row staggered arrangement along the X direction; however, the arrangement of the contact plugs CP1 may be freely designed. The contact plugs CP1 may be arranged, for example, in a single line along the X direction. In this case, the protruding portions TS of the contact plugs CP1 are linked only along the X direction.

The select gate line SGD0 of the string unit SU0 and the select gate line SGD1 of the string unit SU1 are separated, in the Y direction, by a slit SHE extends in the X direction. The slit SHE does not separate the word lines WL and the select gate line SGS that are provided below the select gate lines SGD. Accordingly, the word lines WL and the select gate line SGS are shared among the string units SU0 and SU1. Similarly, the select gate line SGD2 and the select gate line SGD3 are separated by a slit SHE, and the word lines WL and the select gate line SGS are shared among the string units SU2 and SU3.

In the example of FIG. 3, a case is shown where the two string units SU0 and SU1 share the word lines WL0 to WL7 and the select gate line SGS; however, the configuration is not limited thereto. For example, four string units SU0 to SU3 may share the word lines WL0 to WL7 and the select gate line SGS. In this case, a separation region SP is provided between the string unit SU0 and the string unit SU3, and a slit SHE is provided between the select gate line SGD0 and the select gate line SGD1, between the select gate line SGD1 and the select gate line SGD2, and between the select gate line SGD2 and the select gate line SGD3. Moreover, a single string unit SU may be provided between two separation regions SP. In this case, a slit SHE is not provided.

The memory cell array 11 includes a cell region and a CP2 coupling region.

In the cell region, a plurality of memory pillars MP respectively corresponding to the NAND strings NS are provided. A detailed structure of the memory pillar MP will be described later. In the example of FIG. 3, memory pillars MP are provided in a 4-row staggered arrangement in each string unit SU, in the X direction. In this example, the memory pillars MP are also provided on the slit SHE; however, such memory pillars MP need not be provided. For example, the memory pillars MP on the slit SHE need not function as NAND strings NS. Moreover, the arrangement of the memory pillars MP may be freely designed.

The memory pillars MP pass through the select gate line SGD, the word lines WL, and the select gate line SGS, and extend in the Z direction. Upper end of the memory pillar MP in each string unit SU is commonly coupled to, for example, a bit line BL (not illustrated) extending along the Y direction.

In the CP2 coupling region, a plurality of interconnect layers corresponding to the select gate lines SGD and SGS and the word lines WL are drawn stepwise in the X direction. At an end portion of each interconnect layer, a coupling portion that provides coupling with the contact plug CP2 is provided. Hereinafter, the coupling portion of each of the interconnect layers that are drawn stepwise will be referred to as a "terrace". Contact plugs CP2 are provided on the respective terraces of the select gate lines SGD and SGS and the word lines WL. The select gate lines SGD and SGS and the word lines WL are coupled to the row decoder 12 via the respective contact plugs CP2.

In the CP2 coupling region, a plurality of dummy pillars HR that penetrate a plurality of interconnect layers corresponding to the select gate lines SGD and SGS and the word lines WL are provided. The arrangement of the dummy pillars HR may be freely designed. The dummy pillars HR are not electrically coupled to the interconnect layers.

As a method of forming the select gate lines SGD and SGS and the word lines WL, there is a method of forming structures corresponding to interconnect layers using sacrificial layers, and then replacing the sacrificial layers with a conductive material, thereby forming interconnect layers (hereinafter referred to as a "replacement" technique). In the replacement technique, after the sacrificial layers are removed and air gaps are formed, the air gaps are filled with a conductive material. In this case, the dummy pillars HR function as pillars that support the interlayer insulating films with the air gaps.

The memory pillars MP, the contact plugs CP1 and CP2, and the dummy pillars HR need not be in a columnar shape, and may have different diameters. In addition, distances between the memory pillars MP, the contact plugs CP1 and CP2, and the dummy pillars HR may be freely designed.

Next, a detailed planar configuration of the memory pillars MP, the contact plugs CP1, and the protruding portions TS will be described. In the example of FIG. 4, a top surface (hereinafter also referred to as a "WL7 plane") of the interconnect layer 102 which functions as the word line WL7, and a plane of the insulating layer 101 provided between the word line WL6 and the word line WL7 (hereinafter also referred to as a "WL6-WL7 plane") in a region RA are shown.

As shown in FIG. 4, each memory pillar MP includes a block insulating film 103, a charge storage layer 104, a tunnel insulating film 105, a semiconductor layer 106, and a core layer 107. More specifically, a core layer 107, a semiconductor layer 106, a tunnel insulating film 105, a charge storage layer 104, and a block insulating film 103 are provided, for example, in order from the center of the memory pillar MP toward the outer periphery, as viewed in the XY plane. For example, the core layer 107 has a pillar shape, and the semiconductor layer 106, the tunnel insulating film 105, the charge storage layer 104, and the block insulating film 103 have a cylinder shape. In each memory cell transistor MC, the semiconductor layer 106 is a region in which a channel is to be formed. In the WL7 plane, an insulating layer 110 is provided outside the block insulating film 103. On the other hand, in the WL6-WL7 plane, the insulating layer 110 is not provided outside the block insulating film 103.

The block insulating film 103, the tunnel insulating film 105, and the core layer 107 are formed using, for example, silicon oxide ($SiO_2$). The charge storage layer 104 is formed using, for example, silicon nitride (SiN). The semiconductor layer 106 is formed using, for example, poly-silicon. The insulating layer 110 is formed using, for example, aluminum oxide (AlO).

Each contact plug CP1 is filled with a conductive layer 109. The conductive layer 109 is formed of a conductive material, using an n-type semiconductor, a p-type semiconductor, a metal material, etc.

An insulating layer 108 is provided outside each contact plug CP1. The insulating layer 108 is formed using, for example, $SiO_2$. The insulating layer 108 corresponds to, for example, protruding portion TS as viewed in the WL7 plane.

In the WL7 plane, insulating layers 108 (protruding portions TS) provided outside the contact plugs CP1 are linked to one another. The word lines WL7 are separated in the Y direction by the linked insulating layers 108. Let us assume, for example, that a distance between central axes of adjacent contact plugs CP1 is L1, and a distance from a central axis of a contact plug CP1 to an outer periphery of the insulating layer 108 in the WL7 plane is L2. In this case, the distances L1 and L2 satisfy the relation of $((L1)/2)<(L2)$. Let us also assume that a distance between a central axis of a contact plug CP1 and a memory pillar MP that are adjacent to each other is L3 In this case, the distances L1 and L3 satisfy the relation of $(L1) \le (L3)$.

On the other hand, the insulating layers 108 provided outside the contact plugs CP1 in the WL6-WL7 plane have a small diameter, compared to that in the WL7 plane, and are not linked to one another. That is, the contact plugs CP1 are provided so as to penetrate the insulating layers 101. Accordingly, the insulating layer 101 that is provided between the word line WL6 and the word line WL7 is not separated in the Y direction. In other words, the insulating layers 101 are provided between adjacent contact plugs CP1 in the separation region SP. Assuming, for example, that a distance from a central axis of the contact plug CP1 to the outer periphery of the insulating layer 108 in the WL6-WL7 plane is L4, the distances L1 and L4 satisfy the relation of $((L1)/2)>(L4)$.

1.1.4 Cross-Sectional Configuration of Memory Cell Array

Figure 6:
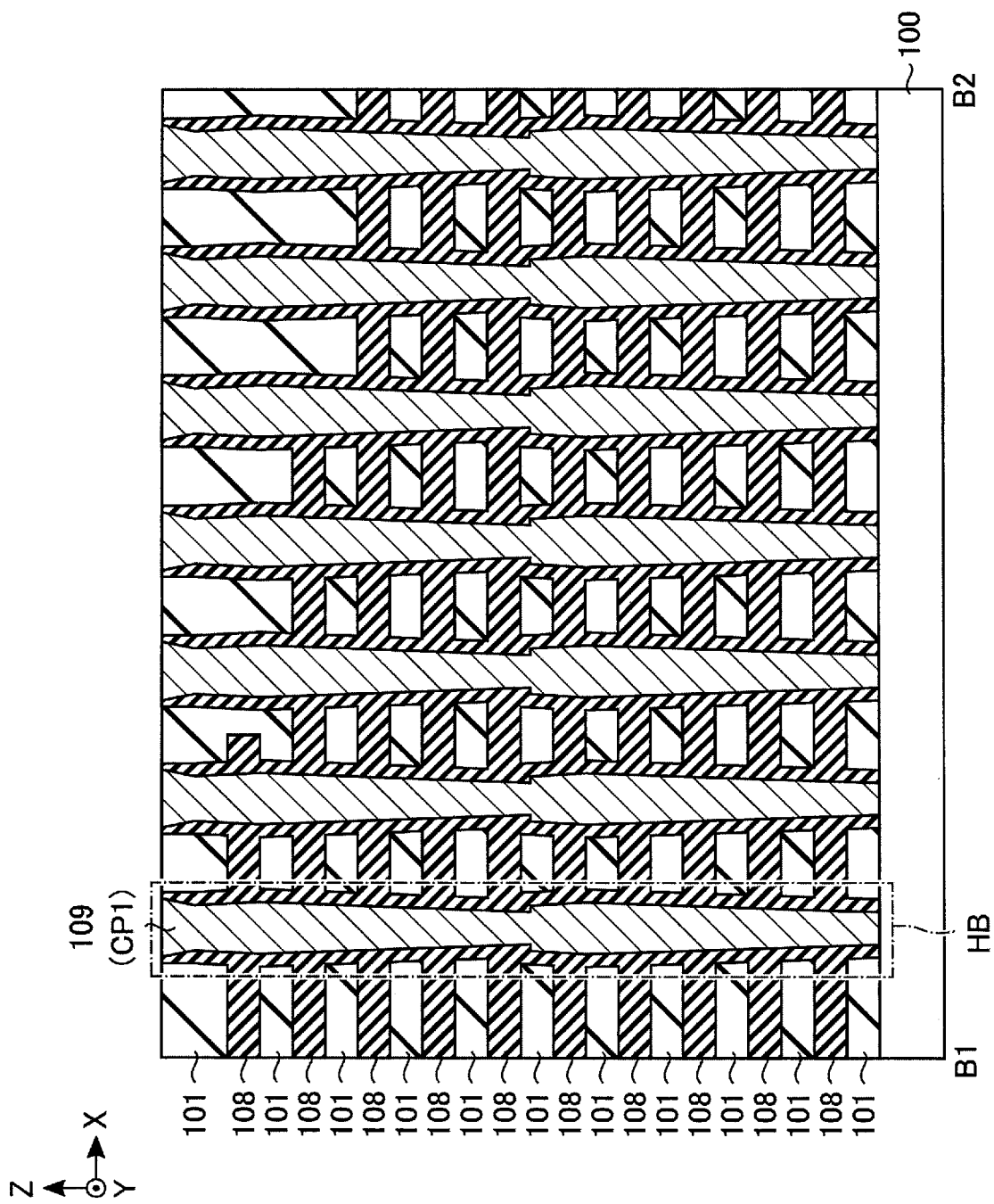
FIG. 6 is a cross-sectional view taken along line B1-B2 of FIG. 3.
Figure 7:
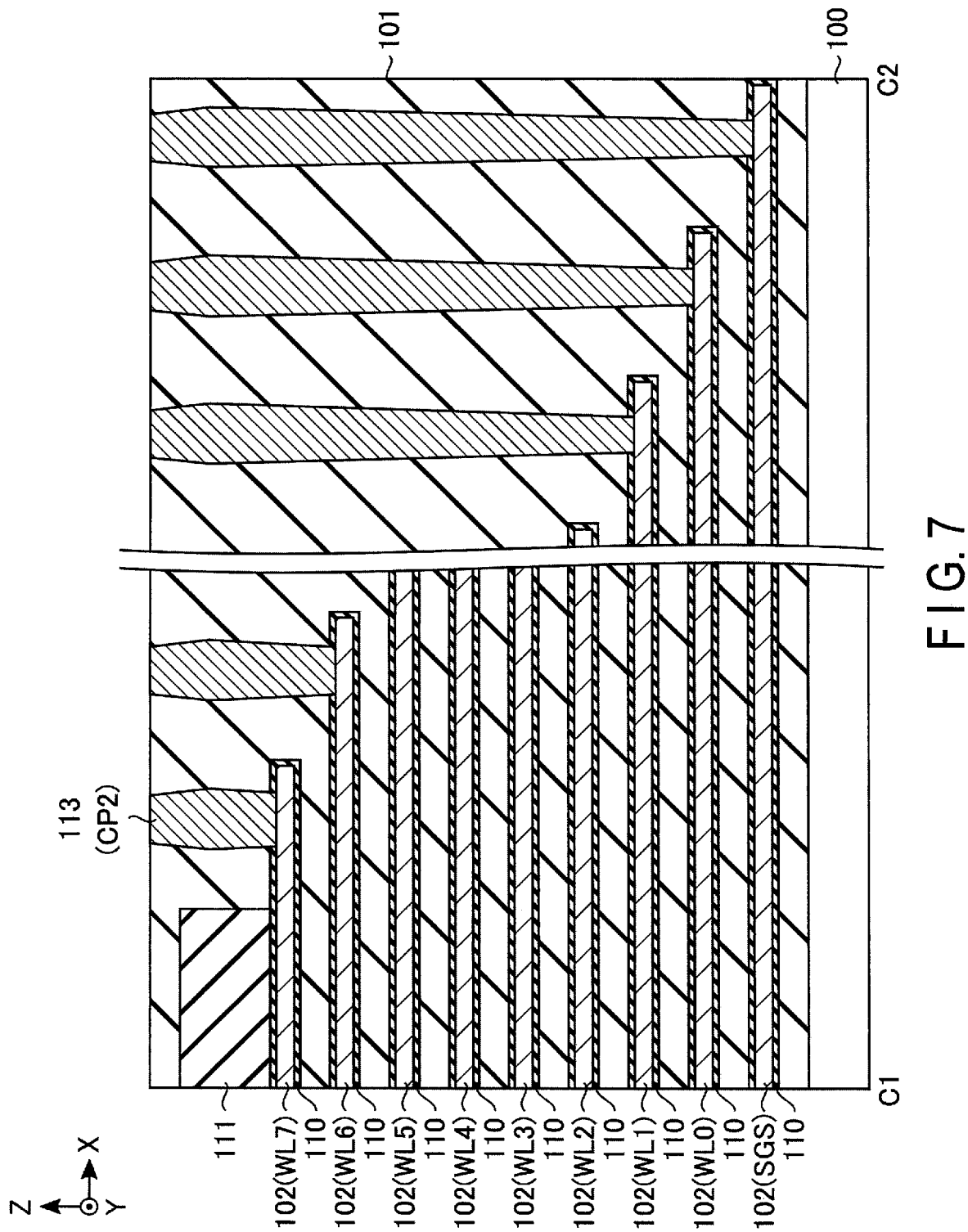
FIG. 7 is a cross-sectional view taken along line C1-C2 of FIG. 3.

Next, a cross-sectional configuration of the memory cell array 11 will be described with reference to FIGS. 5-7. FIG. 5 is a cross-sectional view taken along line A1-A2 of FIG. 3. FIG. 6 is a cross-sectional view taken along line B1-B2 of FIG. 3. FIG. 7 is a cross-sectional view taken along line C1-C2 of FIG. 3.

As shown in FIG. 5, eleven insulating layers 101 and ten interconnect layers 102 are stacked in an alternating manner on a semiconductor substrate 100. The interconnect layers 102 function as, in order from the lower layers, a select gate line SGS, word lines WL0 to WL7, and a select gate line SGD. Top and bottom surfaces of the interconnect layer 102 and side surfaces of the interconnect layer 102 that are in contact with the memory pillars MP and the slit SHE are covered with insulating layers 110.

The insulating layers 101 are formed using, for example, $SiO_2$. The interconnect layers 102 are formed of a conductive material using, for example, an n-type semiconductor, a p-type semiconductor, or a metal material. Hereinafter, a case will be described where a stacked structure of titanium nitride (TiN) and tungsten (W) is used as the interconnect layers 102. When, for example, W is formed by chemical vapor deposition (CVD), TiN functions as an adhesion layer for improving the adhesiveness of W.

A plurality of memory pillars MP which penetrate the eleven insulating layers 101 and the ten interconnect layers 102 and reach, at their bottom surfaces, the semiconductor substrate 100 are formed. Each memory pillar MP includes, for example, two memory pillars LMP and UMP. The memory pillar LMP passes through, for example, interconnect layers 102 that respectively function as the select gate line SGS and the word lines WL0 to WL3, and reaches, at its bottom surface, the semiconductor substrate 100. The memory pillar UMP is provided on the memory pillar LMP, and passes through, for example, the word lines WL4 to WL7 and the select gate line SGD. Each memory pillar MP is formed of the memory pillars LMP and UMP that are coupled in the Z direction, with steps provided at their side surfaces. In the example of FIG. 5, each memory pillar MP is formed by coupling two tiers of memory pillars LMP and UMP; however, the number of tiers of memory pillars that are coupled in the Z direction may be any number. Each memory pillar MP may be configured in a single tier, or in three or more tiers. When a plurality of tiers of memory pillars MP are coupled in the Z direction, insulating layers 101 that are arranged at the same layers as coupling portions of the respective tiers may be formed to have a thickness larger than that of the other insulating layers 101.

On a side surface of each memory pillar MP, namely, on side surfaces of the memory pillars LMP and UMP, a block insulating film 103, a charge storage layer 104, and a tunnel insulating film 105 are stacked from a side of the outer periphery. A semiconductor layer 106 is formed in such a manner that its side surface is in contact with the tunnel insulating film 105, and its bottom surface is in contact with the semiconductor substrate 100. The semiconductor layer 106 is a region in which a channel of the memory cell transistor MC and the select transistors ST1 and ST2 is to be formed. Accordingly, the semiconductor layer 106 functions as a signal line that couples a current path of the select transistor ST2, the memory cell transistors MC0 to MC7, and the select transistor ST1. A core layer 107 is provided in the semiconductor layer 106. A contact plug CP3 is formed on the semiconductor layer 106. Each contact plug CP3 is electrically coupled to a bit line BL. The contact plug CP3 is filled with a conductive layer 112. The conductive layer 112 is formed of a conductive material using, for example, an n-type semiconductor, a p-type semiconductor, or a metal material.

In the separation region SP, pillar portions HE that penetrate the eleven insulating layers 101 and the ten interconnect layers 102 and reach, at their bottom surfaces, the semiconductor substrate 100 are provided. Similarly to the memory pillar MP, each pillar portion HB includes, for example, two pillar portions LHB and UHB. The pillar portion LHB passes through, for example, the interconnect layers 102 which function as the select gate line SGS and the word lines WL0 to WL3, and reaches, at its bottom surface, the semiconductor substrate 100. The pillar portion UHB is provided on the pillar portion LHB, and passes through, for example, the word lines WL4 to WL7 and the select gate line SGD. That is, each pillar portion HB is formed by coupling the pillar portions LHB and UHB in the Z direction.

In the present embodiment, the contact plugs CP1 are formed in the respective pillar portions HB so as to extend in the Z direction. In the pillar portion HB, an insulating layer 108 is provided to cover a side surface of the contact plug CP1 (conductive layer 109). That is, each pillar portion HB is formed of the contact plug CP1 and the insulating layer 108 that is formed on the side surface of the contact plug CP1. A bottom surface of the contact plug CP1 is in contact with the semiconductor substrate 100, and a top surface of the contact plug CP1 is coupled to an unillustrated interconnect layer provided thereabove. Each contact plug CP1 includes two contact plugs LCP and UCP respectively corresponding to the pillar portions LHB and UHB. By coupling the contact plugs LCP and UCP in the Z direction, a contact plug CP1 is formed.

In the example of FIG. 5, the pillar portion HB is formed by coupling the two pillar portions LHB and UHB; however, the number of tiers of pillar portions that are coupled in the Z direction may be designed to be any number. Assuming that holes corresponding to the memory pillars MP and holes corresponding to the pillar portions HB are simultaneously etched, the number of tiers of pillar portions HB and the number of tiers of memory pillars MP become equal, and such a number may be one, or three or more.

At the same layers as the interconnect layers 102, protruding portions TS that protrude in the XY plane are provided on side surfaces of the respective pillar portions HB. Each protruding portion TS is filled with an insulating layer 108.

A slit SHE is formed to separate the topmost interconnect layer 102, which functions as the select gate line SGD, according to the string unit SU. The each slit SHE is filled with an insulating layer 111. The insulating layer ill is formed using, for example, $SiO_2$.

Next, a cross-sectional configuration of the separation region SP will be described.

As shown in FIG. 6, pillar portions HB, namely, contact plugs CP1 (conductive layers 109) are, for example, arranged at approximately equal intervals in the X direction. At the same layers as the interconnect layers 102, portions between the pillar portions HB (contact plugs CP1) are filled with insulating layers 108 (protruding portions TS). That is, in the separation region SP, the interconnect layers 102 are replaced with the insulating layers 108.

Next, a cross-sectional configuration of the contact plugs CP2 in the CP2 coupling region will be described.

As shown in FIG. 7, conductive layers 113, each of which functions as a contact plug CP2, are formed on terraces of respective interconnect layers 102. The conductive layers 113 are formed of a conductive material, and may be formed using, for example, a metal material such as W or TiN. In the example of FIG. 7, the contact plugs CP2 are formed in a single tier, unlike the memory pillars MP and the pillar portions HE (contact plugs CP1).

1.2 Method of Manufacturing Memory Cell Array

Next, an example of a method of manufacturing the memory cell array 11 will be described with reference to FIGS. 8 to 16. In the present embodiment, a case will be described where interconnect layers 102 are formed by the replacement technique.

Figure 8:
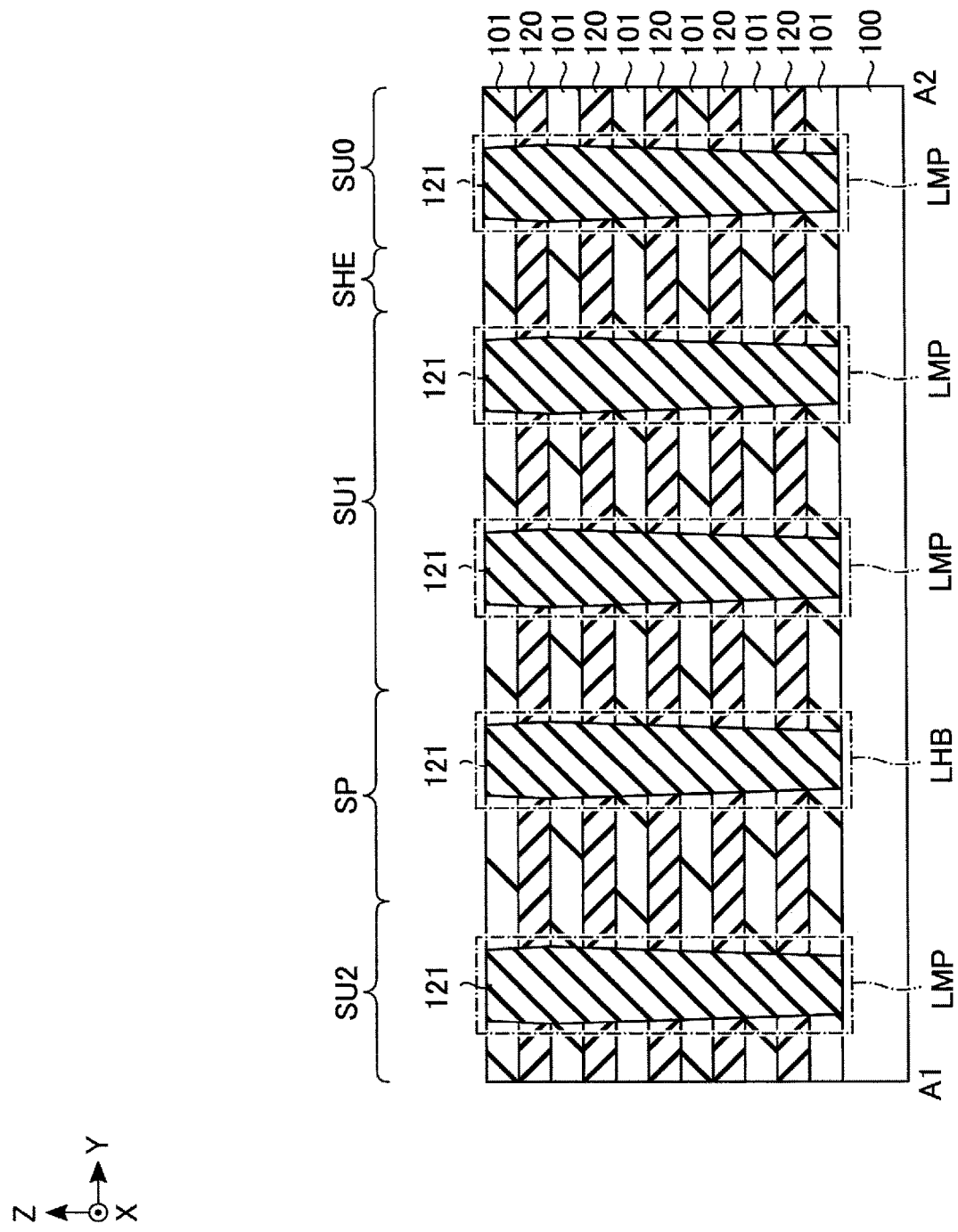
FIGS. 8-16 are diagrams showing a process of manufacturing the memory cell array included in the semiconductor memory device according to the first embodiment.

As shown in FIG. 8, six insulating layers 101 and five sacrificial layers 120 respectively corresponding to a select gate line SGS and word lines WL0 to WL3 are stacked in an alternating manner on a semiconductor substrate 100. The five sacrificial layers 120 are replaced with interconnect layers 102 by the replacement technique in a step to be described below. The sacrificial layers 120 may be configured of any material that has a sufficiently high wet-etching selectivity for the insulating layers 101 in the replacement. The sacrificial layers 120 may be, for example, semiconductor layers, insulating layers, or conductive layers. In the description that follows, a case will be described where the sacrificial layers 120 are formed using SiN.

Thereafter, holes corresponding to memory pillars LMP and pillar portions LHB (contact plugs LCP) are formed, and the each hole is filled with a sacrificial layer 121. The sacrificial layer 121 may be configured of any material that has a sufficiently high wet-etching selectivity for the insulating layers 101 and the sacrificial layers 120. The sacrificial layer 121 may be, for example, a semiconductor layer, an insulating layer, or a conductive layer.

Figure 9:
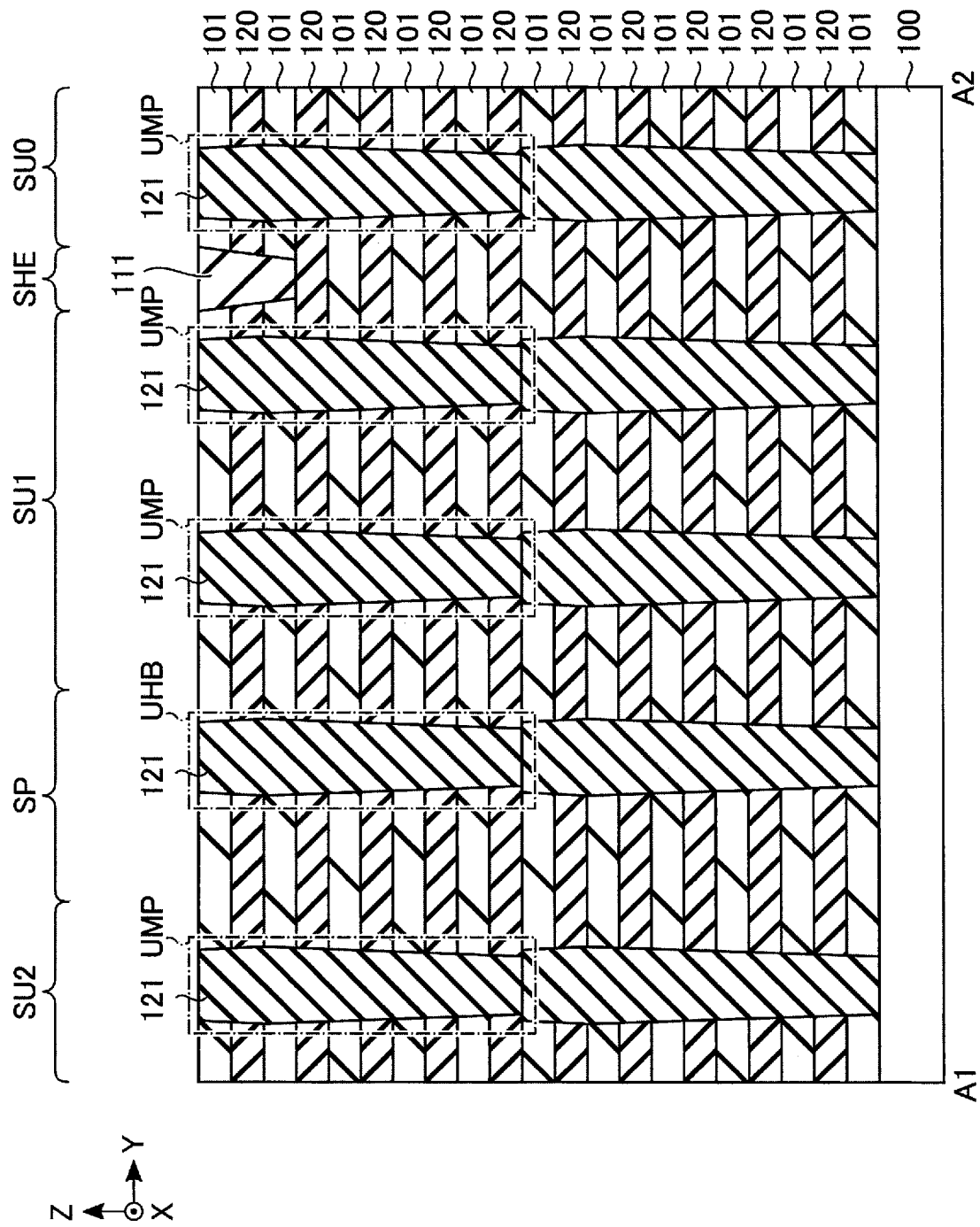

As shown in FIG. 9, five sacrificial layers 120 and five insulating layers 101 respectively corresponding to word lines WL4 to WL7 and a select gate line SGD, for example, are further stacked on the topmost insulating layer 101 in an alternating manner.

Subsequently, a slit SHE is formed in such a manner that its bottom surface reaches the second topmost sacrificial layer 120 corresponding to the word line WL7, and is filled with an insulating layer 111.

Thereafter, holes corresponding to memory pillars UMP and pillar portions UHB are formed on the sacrificial layers 121 corresponding to the memory pillars LMP and the pillar portions LHB, and then the each hole is filled with a sacrificial layer 121.

Figure 10:
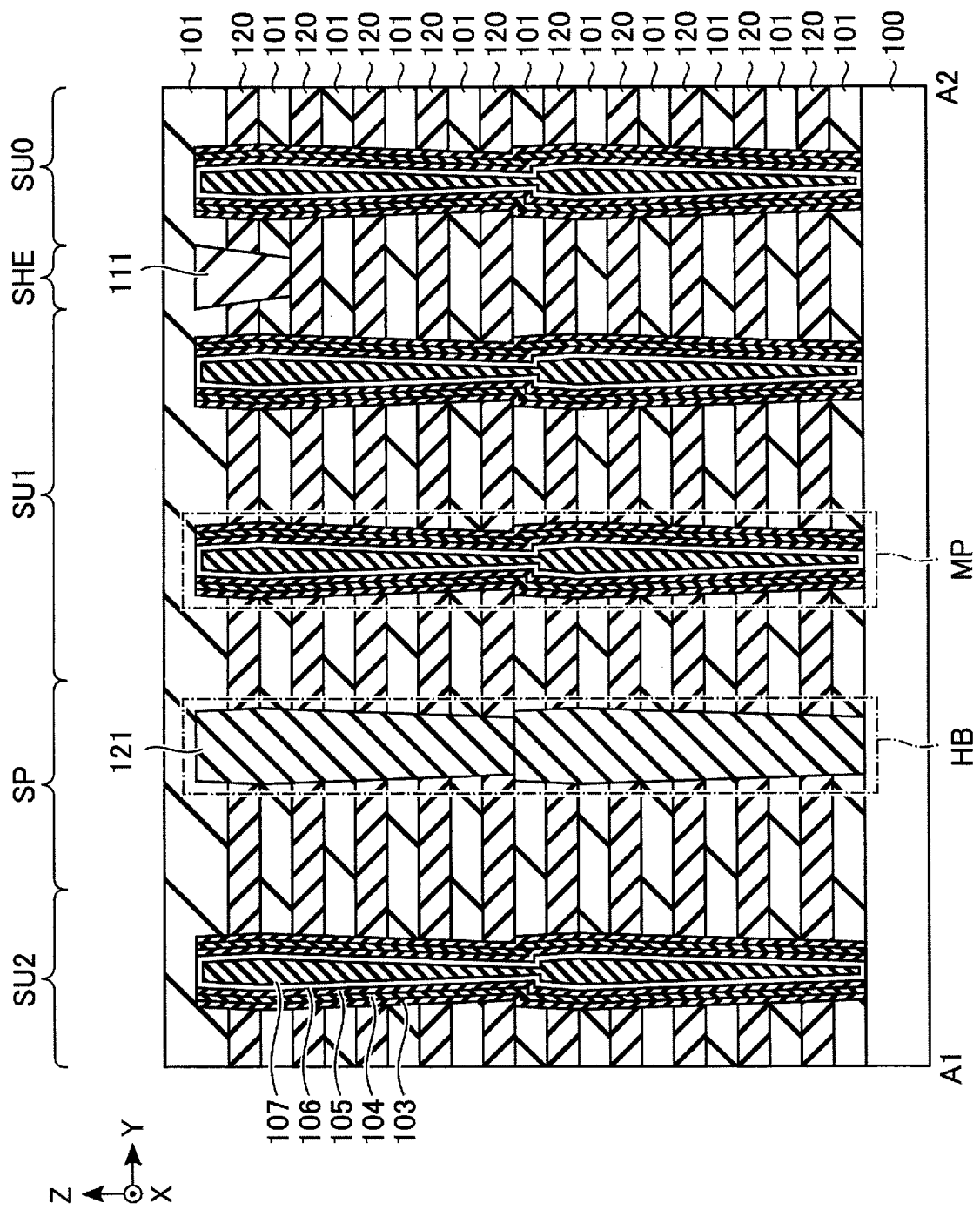

As shown in FIG. 10, the sacrificial layers 121 corresponding to the memory pillars MP are removed. Subsequently, a block insulating film 103, a charge storage layer 104, a tunnel insulating film 105, a semiconductor layer 106, and a core layer 107 are formed in order, and thereby a memory pillar MP is formed. More specifically, a block insulating film 103, a charge storage layer 104, and a tunnel insulating film 105 are stacked. Thereafter, the block insulating film 103, the charge storage layer 104, and the tunnel insulating film 105 on the topmost insulating layer 101 and at a bottom portion of the hole corresponding to each memory pillar MP, namely, on the semiconductor substrate 100, are removed by, for example, anisotropic etching such as reactive ion etching (RIE). Subsequently, a semiconductor layer 106 and a core layer 107 are formed in order. Thereafter, the semiconductor layer 106 and the core layer 107 on the topmost insulating layer 101 are removed. At this time, top surfaces of the semiconductor layer 106 and the core layer 107 are below a top surface of each memory pillar MP. Subsequently, an upper portion of the memory pillar MP is filled with a semiconductor layer 106. Thereafter, the semiconductor layer 106 on the topmost insulating layer 101 is removed.

Subsequently, an insulating layer 101 is formed so as to cover top surfaces of the memory pillars MP, the insulating layer 111, and the sacrificial layers 121.

Figure 11:
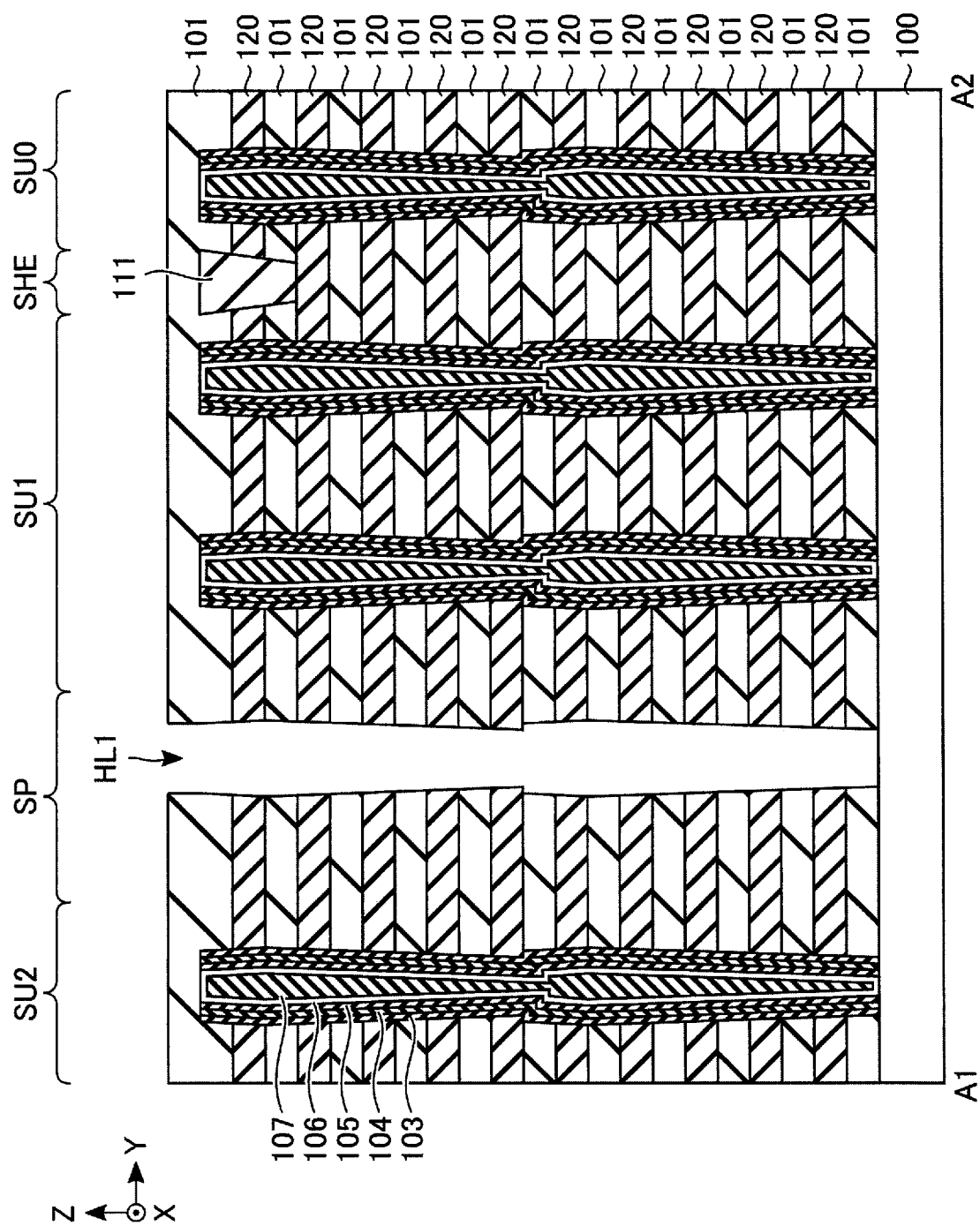

As shown in FIG. 11, the insulating layer 101 on the sacrificial layers 121 corresponding to pillar portions HB are removed, and then the sacrificial layers 121 are removed by, for example, wet etching. Thereby, holes HL1 corresponding to the pillar portions HB are formed.

Figure 12:
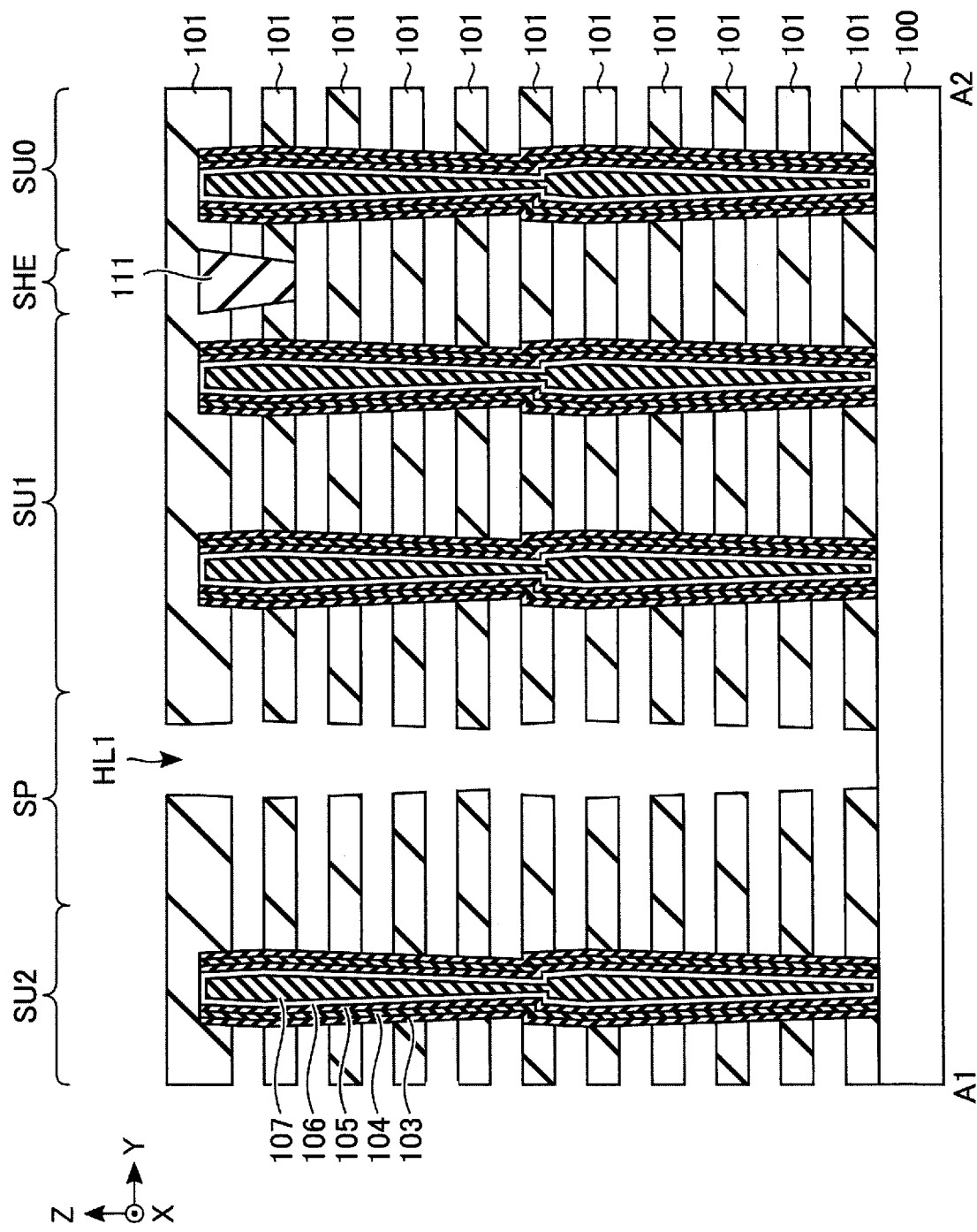

As shown in FIG. 12, the sacrificial layers 120 are removed from side surfaces of the holes HL1 by wet etching. Thereby, air gaps are formed between the insulating layers 101 in the Z direction.

Figure 13:
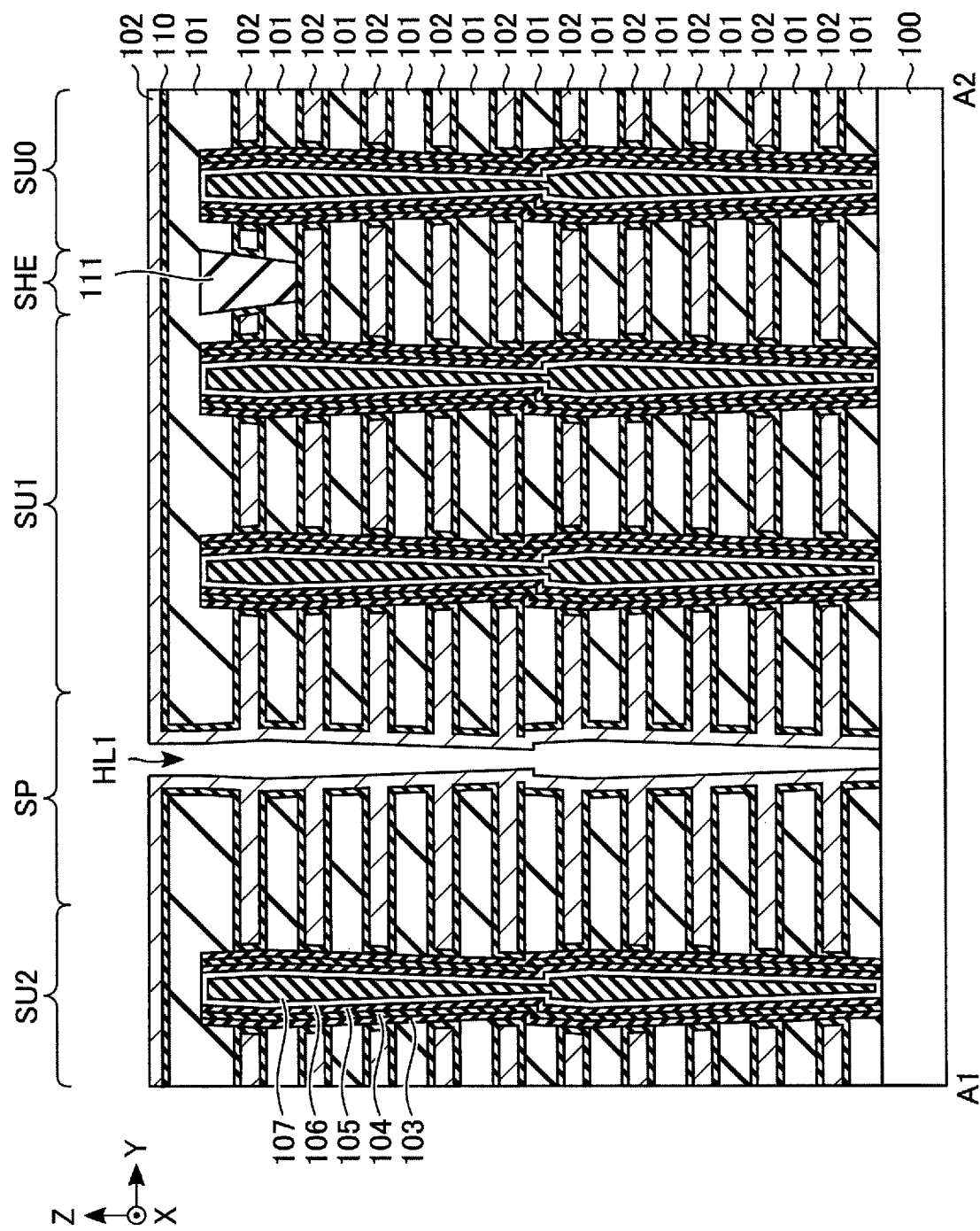

As shown in FIG. 13, the insulating layer 110 with a thickness that does not allow the air gaps between the insulating layers 101 to be filled in is formed using, for example, a technique that has a good step coverage, such as CVD and atomic layer deposition (ALD). Subsequently, an interconnect layer 102 with a thickness that allows the air gaps between the insulating layers 101 to be filled in but does not fill in the hole HL1 is formed.

Figure 14:
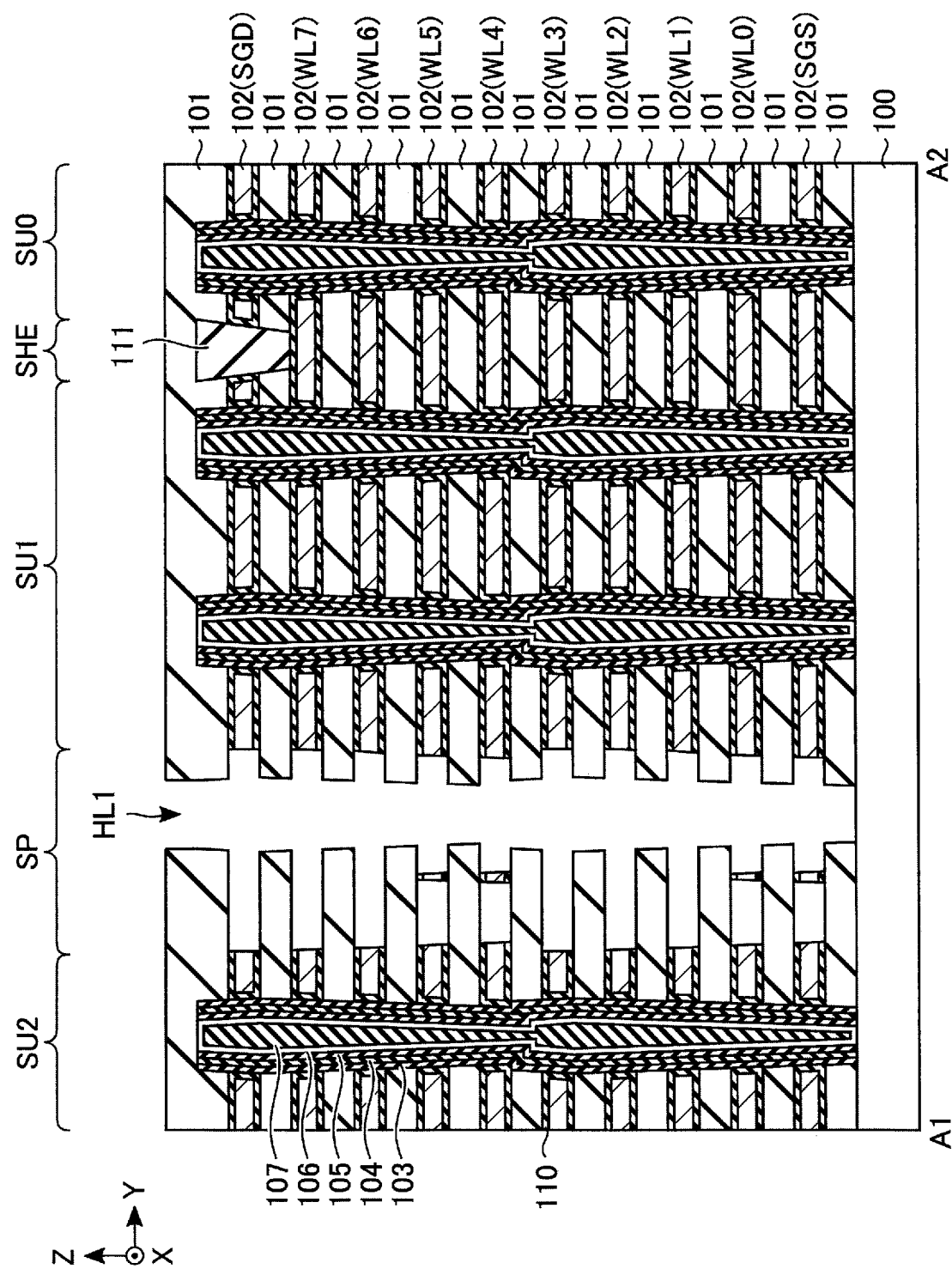

As shown in FIG. 14, the interconnect layer 102 and the insulating layer 110 formed on the topmost insulating layer 101 and a side surface of the hole HL1 are removed by, for example, wet etching. At this time, the interconnect layer 102 and the insulating layer 110 are partially removed from the side surface of the hole HL1, thereby forming portions corresponding to the protruding portions TS.

Figure 15:
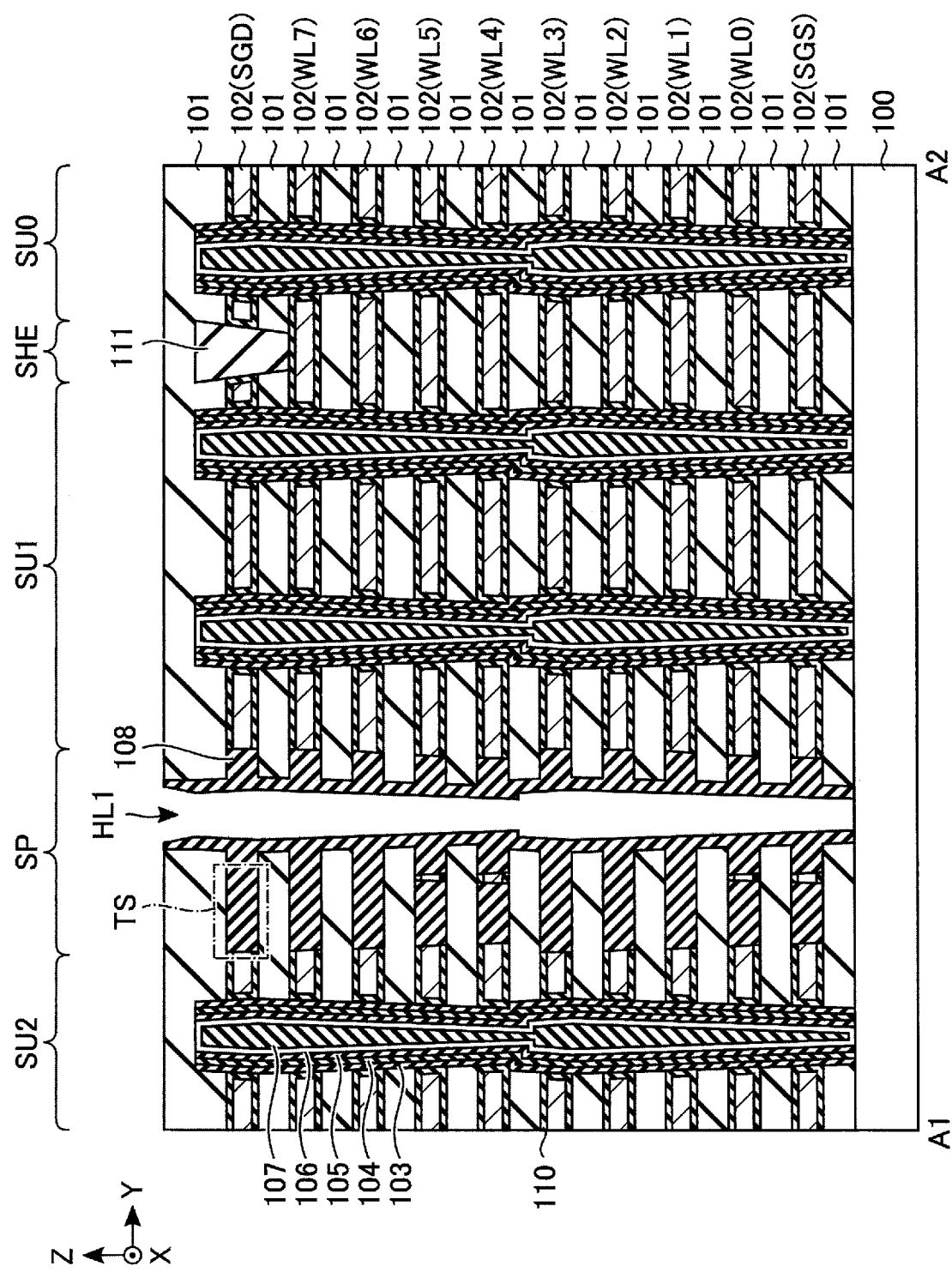

As shown in FIG. 15, an insulating layer 108 is formed using, for example, a technique that has a good step coverage, such as CVD and ALD, thereby filling in the portions corresponding to the protruding portions TS. At this time, the insulating layer 108 is formed to have a thickness that does not allow the hole HL1 to be filled in. Subsequently, the insulating layer 108 formed on the topmost insulating layer 101 and a bottom surface of the hole HL1 is removed by, for example, RIE. The insulating layer 108 remains on the side surface of the hole HL1.

Figure 16:
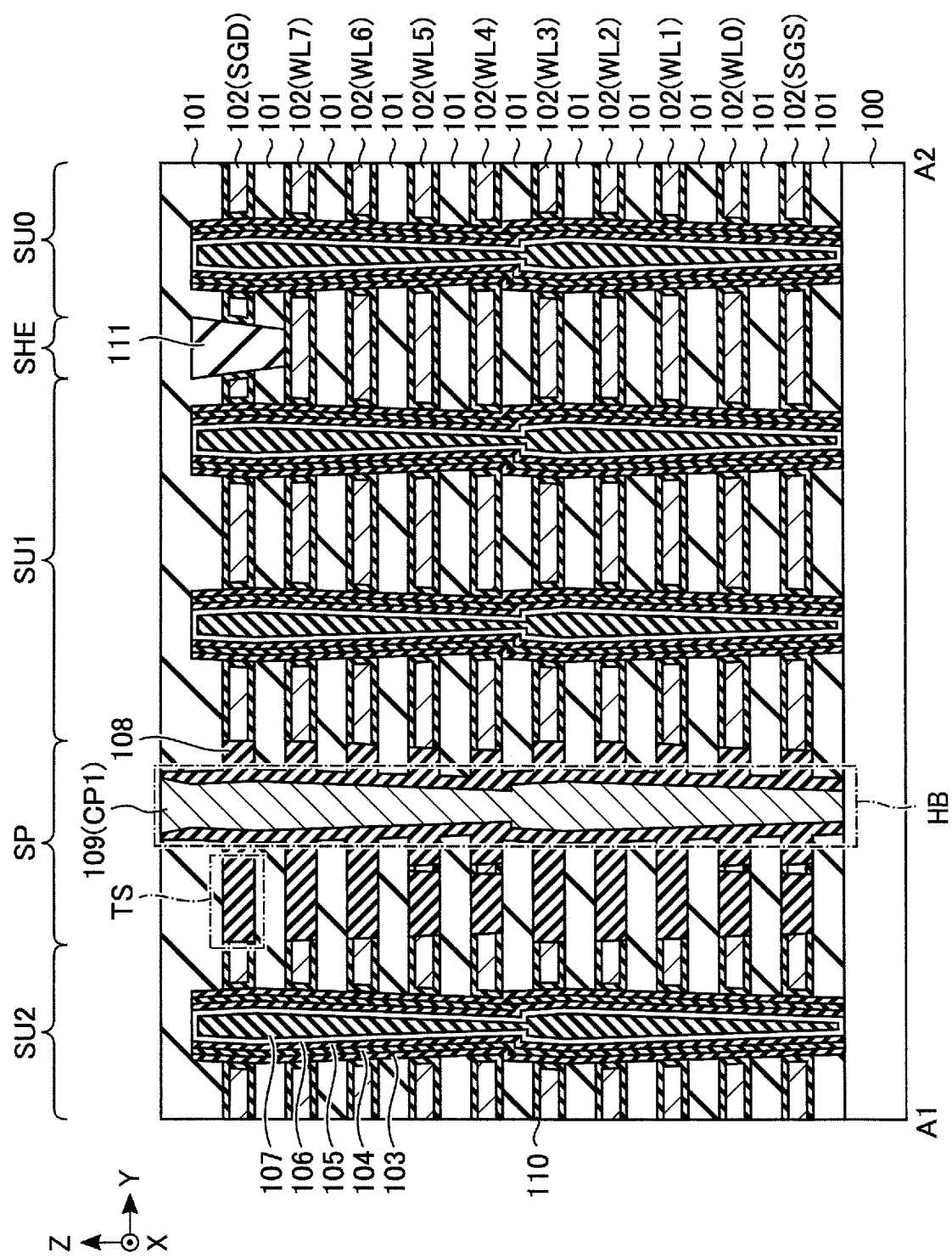

As shown in FIG. 16, contact plugs CP1 are formed by filling in each hole HL1 with a conductive layer 109.

1.3 Effects of Present Embodiment

With the above-described configuration of the present embodiment, it is possible to provide a semiconductor memory device capable of reducing manufacturing costs. The effects will be described in detail below.

When, for example, interconnect layers such as word lines WL are separated into two, a line-shaped slit is formed in the separation region SP. In a process of manufacturing the semiconductor memory device, etching (by lithography and etching) of hole-shaped portions such as memory pillars MP and etching of line-shaped portions are separately performed. Thus, when a line-shaped slit is formed, the number of manufacturing steps increases, resulting in an increase in the manufacturing cost.

On the other hand, in the configuration of the present embodiment, it is possible to separate the interconnect layers 102 such as the word lines WL into two by forming pillar portions HE and protruding portions TS, which are provided outside the pillar portions HE so as to be linked to one other, in the separation region SP. That is, since the interconnect layers 102 can be separated without performing etching of the line-shaped portions, it is possible to reduce the number of steps of manufacturing, resulting in a decrease in the manufacturing cost.

Moreover, in the configuration of the present embodiment, holes corresponding to the pillar portions HB in the separation region SP and holes corresponding to the memory pillars MP can be simultaneously etched. A margin for a misalignment that would be necessitated when the cell region and the separation region SP are separately formed, is eliminated. Thus, it is possible to suppress an increase in the chip area.

Furthermore, according to the configuration of the present embodiment, it is possible to decrease a difference between the diameter of a memory pillar MP provided in the vicinity of the separation region SP and a diameter of a memory pillar MP provided at a position away from the separation region SP. When, for example, a slit is formed in the separation region SP, holes are not formed in the separation region SP, and variations occur in the density of the holes corresponding to the memory pillars MP. Thus, variations in diameter may occur between memory pillars MP at an end portion of a region in which the holes corresponding to the memory pillars MP are sparsely provided, namely, in the vicinity of the separation region SP, and memory pillars MP at the center of the region in which the holes corresponding to the memory pillars MP are densely provided. On the other hand, in the configuration of the present embodiment, since holes are formed also in the separation region SP, variations in density of the holes can be reduced, thus reducing variations in diameter of the memory pillars MP.

Also, according to the configuration of the present embodiment, it is possible to suppress a distortion of a chip caused by a stress of the interconnect layers 102. In the case of a slit formed in a separation region SP, when the slit is formed in a process of manufacturing a semiconductor memory device, the slit is deformed by a stress of the interconnect layers 102, and a distortion of the chip is likely to occur. On the other hand, in the configuration of the present embodiment, since the insulating layers 101 in the separation region SP are not separated, it is possible to suppress distortion of the chip.

Moreover, according to the configuration of the present embodiment, since distortion of the chip can be suppressed, it is possible to reduce connection failures resulting from a misalignment caused by a distortion when, for example, the memory pillars MP and the bit lines BL are electrically coupled. It is thereby possible to improve the reliability of the semiconductor memory device.

Furthermore, according to the configuration of the present embodiment, since protruding portions TS of adjacent holes are linked to separate the interconnect layers 102, the layout of the separation region SP can be freely designed. That is, the layout of the interconnect layers 102 can be freely designed. For example, when a plurality of chips are formed on a silicon wafer in a process of manufacturing a semiconductor memory device, it is possible to suppress a distortion of a silicon wafer caused by a stress of the interconnect layers 102 by varying the direction in which the interconnect layers 102 extend for each chip.

2. Second Embodiment

Next, a second embodiment will be described. In the second embodiment, two example configurations of the separation region SP that are different from that of the first embodiment will be described. Hereinafter, the description will focus mainly on matters different from those of the first embodiment.

2.1 First Example

A first example will be described with reference to FIG. 17.

Figure 17:
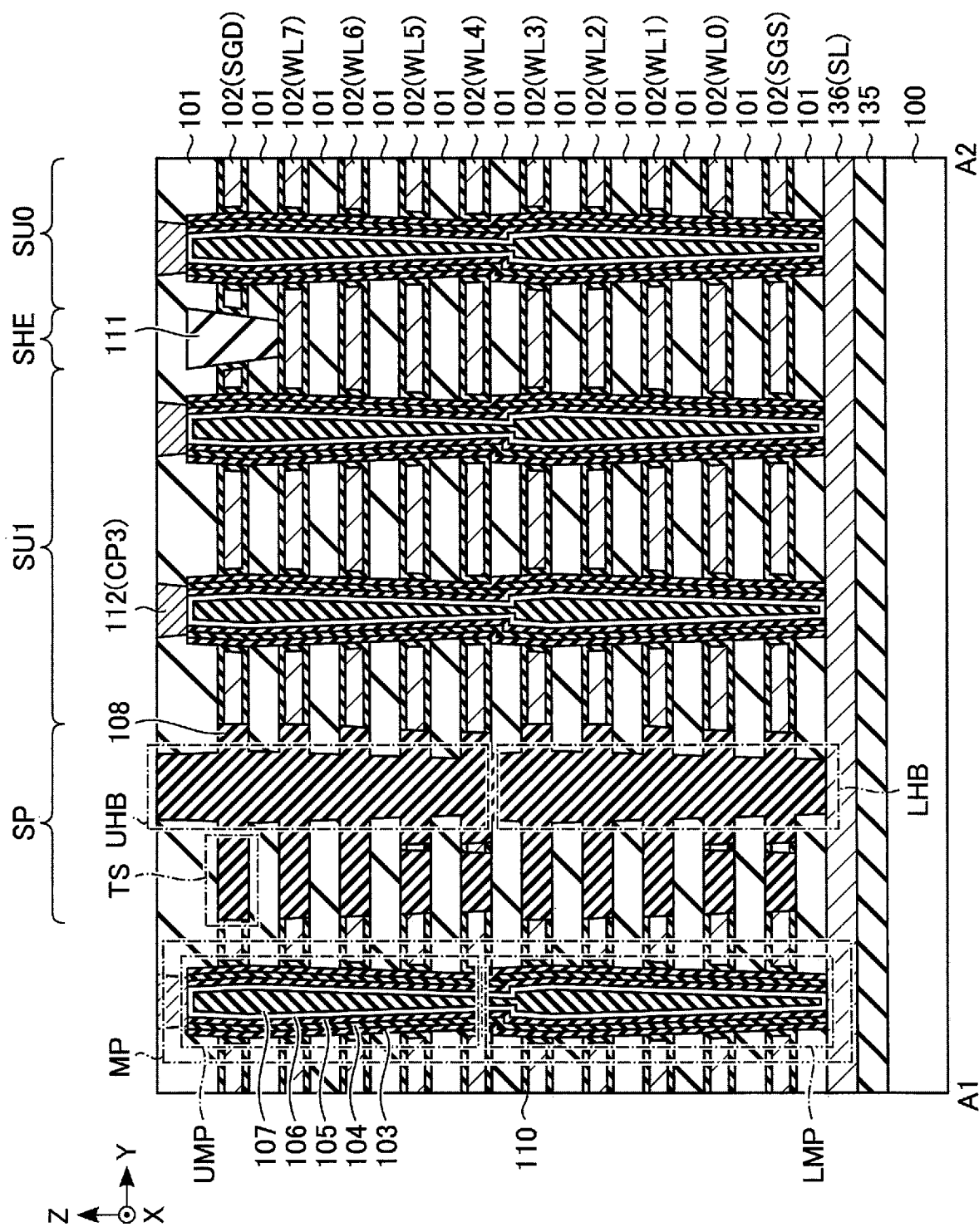
FIG. 17 is a cross-sectional view of a memory cell array of a semiconductor memory device according to a first example of a second embodiment.

As shown in FIG. 17, in the present example, an insulating layer 135 is provided on a semiconductor substrate 100. The insulating layer 135 is formed using, for example, $SiO_2$. In a region in which the insulating layer 135 is formed, namely, in a region between the semiconductor substrate 100 and the interconnect layer 136, a circuit such as a row decoder 12 or a sense amplifier 13 may be provided.

On the insulating layer 135, an interconnect layer 136 which functions as a source line SL is formed. The interconnect layer 136 is formed of a conductive material using, for example, an n-type semiconductor, a p-type semiconductor, or a metal material.

On the interconnect layer 136, eleven insulating layers 101 and ten interconnect layers 102 are stacked in an alternating manner, similarly to FIG. 5 of the first embodiment.

In the present example, contact plugs CP1 are not provided, and the pillar portions HB are filled with insulating layers 108.

2.2 Second Example

Next, a second example will be described with reference to FIG. 18.

Figure 18:
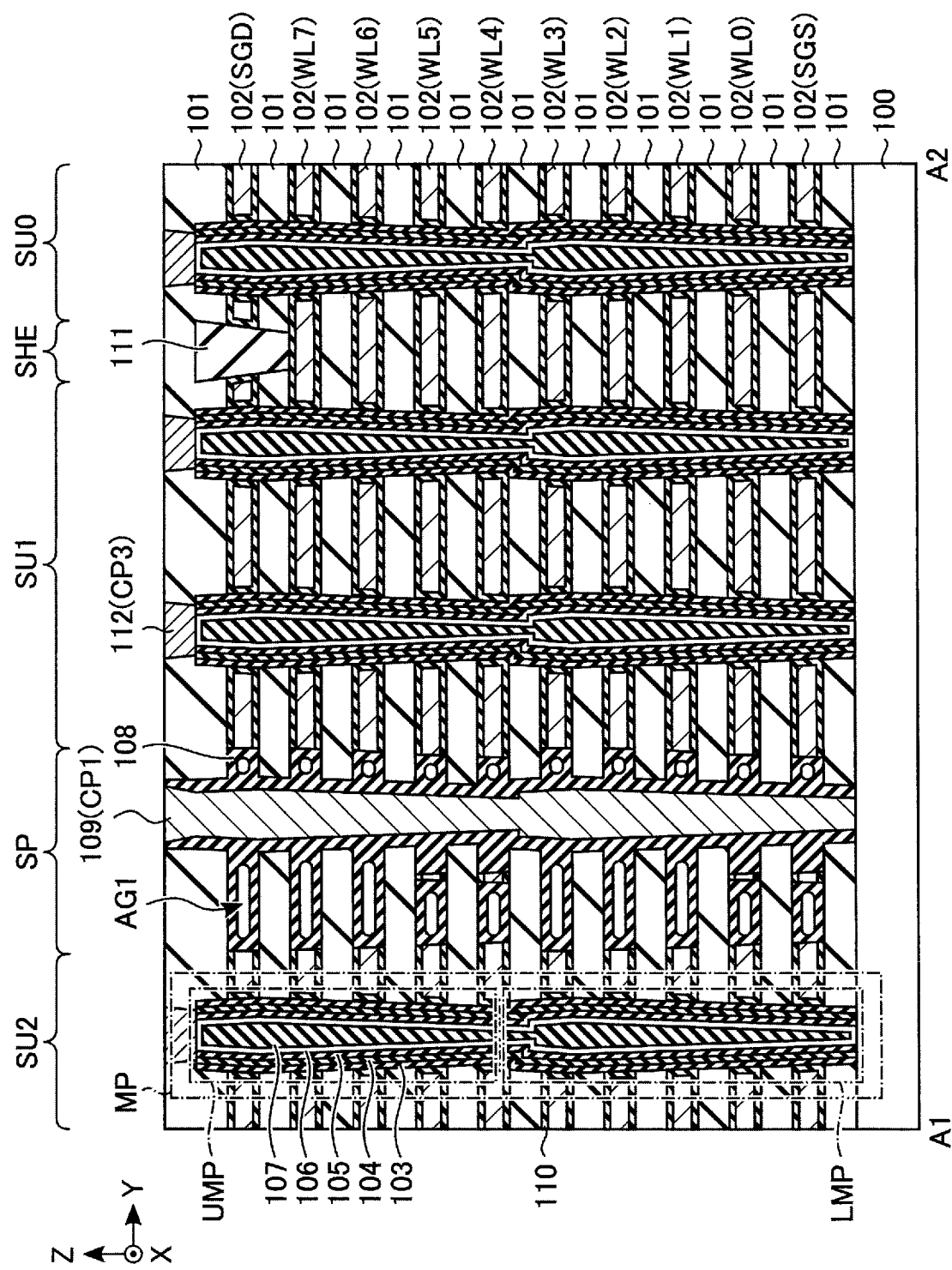
FIG. 18 is a cross-sectional view of a memory cell array included in a semiconductor memory device according to a second example of the second embodiment.

As shown in FIG. 18, in the present example, air gaps AG1 are formed in protruding portions TS.

When, for example, an insulating layer 108 is formed by CVD as described in the first embodiment with reference to FIG. 15, air gaps AG1 may be formed in accordance with the step coverage of CVD.

2.3 Effects of Present Embodiment

According to the configuration of the present embodiment, effects similar to those of the first embodiment are achieved.

3. Third Embodiment

Next, a third embodiment will be described. In the third embodiment, a configuration of a separation region SP different from those of the first and second embodiments will be described. Hereinafter, the description will focus mainly on matters different from those of the first and second embodiments.

3.1 Planar Configuration of Memory Cell Array

Figure 19:
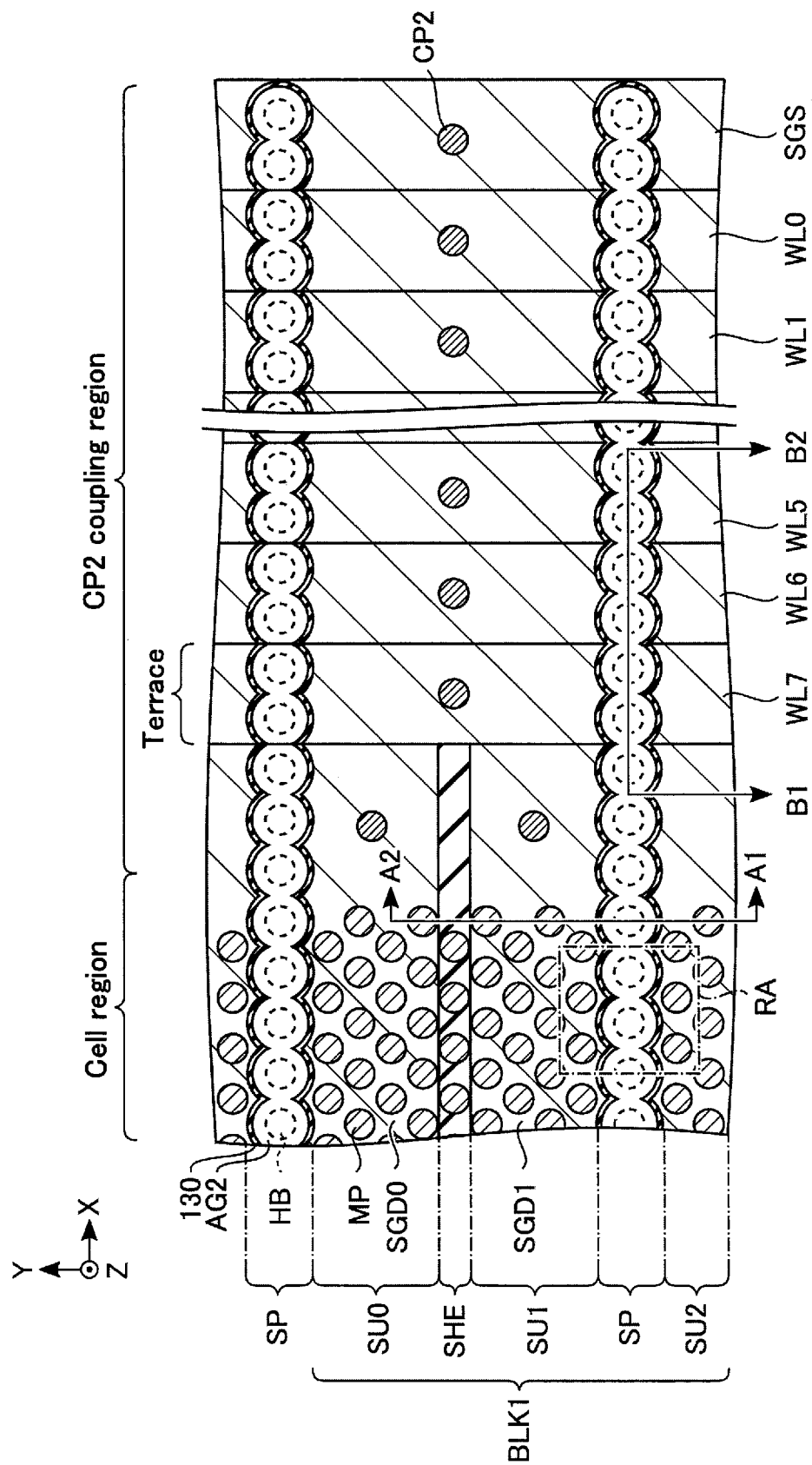
FIG. 19 is a plan view of a memory cell array included in a semiconductor memory device according to a third embodiment.

First, an example planar configuration of the memory cell array 11 will be described with reference to FIGS. 19 and 20. FIG. 19 is a plan view of string units SU0 and SU1 in a block BLK1. In the example of FIG. 19, interlayer insulating films are omitted. FIG. 20 is an enlarged view of a region RA in FIG. 19.

As shown in FIG. 19, in the present embodiment, a plurality of pillar portions HB are arranged in a single line along the X direction in a separation region SP. An insulating layer (insulating film) 130 is provided on side surfaces of the protruding portions TS, and air gaps AG2 are formed in the protruding portions TS and the pillar portions HB. Air gaps AG2 of the protruding portions TS that are adjacent to each other in the X direction are linked to each other. The linked protruding portions TS at each layer are provided to reach both ends of the select gate lines SGD and SGS and the word lines WL in the X direction. By the protruding portions TS, namely, the air gaps AG2 provided in the separation region SP, the select gate lines SGD and SGS and the word lines WL are separated along the Y direction.

In the example of FIG. 19, a case is shown where the pillar portions HB are arranged in a line along the X direction; however, the arrangement of the pillar portions HB may be freely designed. It suffices if the protruding portions TS of the pillar portions HB are linked in the X direction.

In the present embodiment, since the interconnect layers 102 are not formed by the replacement technique, dummy pillars HR are not provided in the CP2 coupling region.

Next, a detailed planar configuration of the memory pillars MP, the pillar portions HB, and the protruding portions TS will be described. In the example of FIG. 20, a WL7 plane and a WL6-WL7 plane in the region RA are shown.

As shown in FIG. 20, in the present embodiment, an insulating layer 110 is not provided in the outer periphery of the memory pillar MP in the WL7 plane.

In the WL7 plane, an insulating layer 130 is provided on a side surface of the interconnect layer 102 facing the separation region SP. The insulating layer 130 is formed using, for example, $SiO_2$. Air gaps AG2 are formed in the insulating layer 130. Portions surrounded by the interconnect layer 102 and the pillar portions HB correspond to the protruding portions TS.

In the WL7 plane, air gaps AG2 provided at the protruding portions TS are linked to one another. The word line WL7 is separated by the linked air gaps AG2 along the Y direction.

In the WL6-WL7 plane, an insulating layer 130 is provided on a side surface of the pillar portion HB, and air gaps AG2 are provided in the interior portion of the insulating layer 130. The insulating layers 130 provided outside the pillar portions HB are not linked in the WL6-WL7 plane. Accordingly, the insulating layer 101 that is provided between the word line WL6 and the word line WL7 is not separated in the Y direction.

In the separation region SP, air gaps AG2 that extend in the X and Z directions are provided. In the separation region SP, the insulating layers 101 pass through the air gaps AG2 in the Y direction, and function as linking portions that link portions of the insulating layers 101 provided on both sides of the separation region SP (portions of the insulating layers 101 that are stacked so as to alternate with the interconnect layers 102). In other words, the insulating layers 101 include a stack portion BU1 which is provided on one side of the separation region SP in which the insulating layers 101 are stacked so as to alternate with the interconnect layers 102, a stack portion BU2 which is provided on another side of the separation region SP and in which the insulating layers 101 are stacked so as to alternate with the interconnect layers 102, and a plurality of bridge portions BU3 that link the portions BU1 and BU2 in the separation region SP.

3.2 Cross-Sectional Configuration of Memory Cell Array

Figure 21:
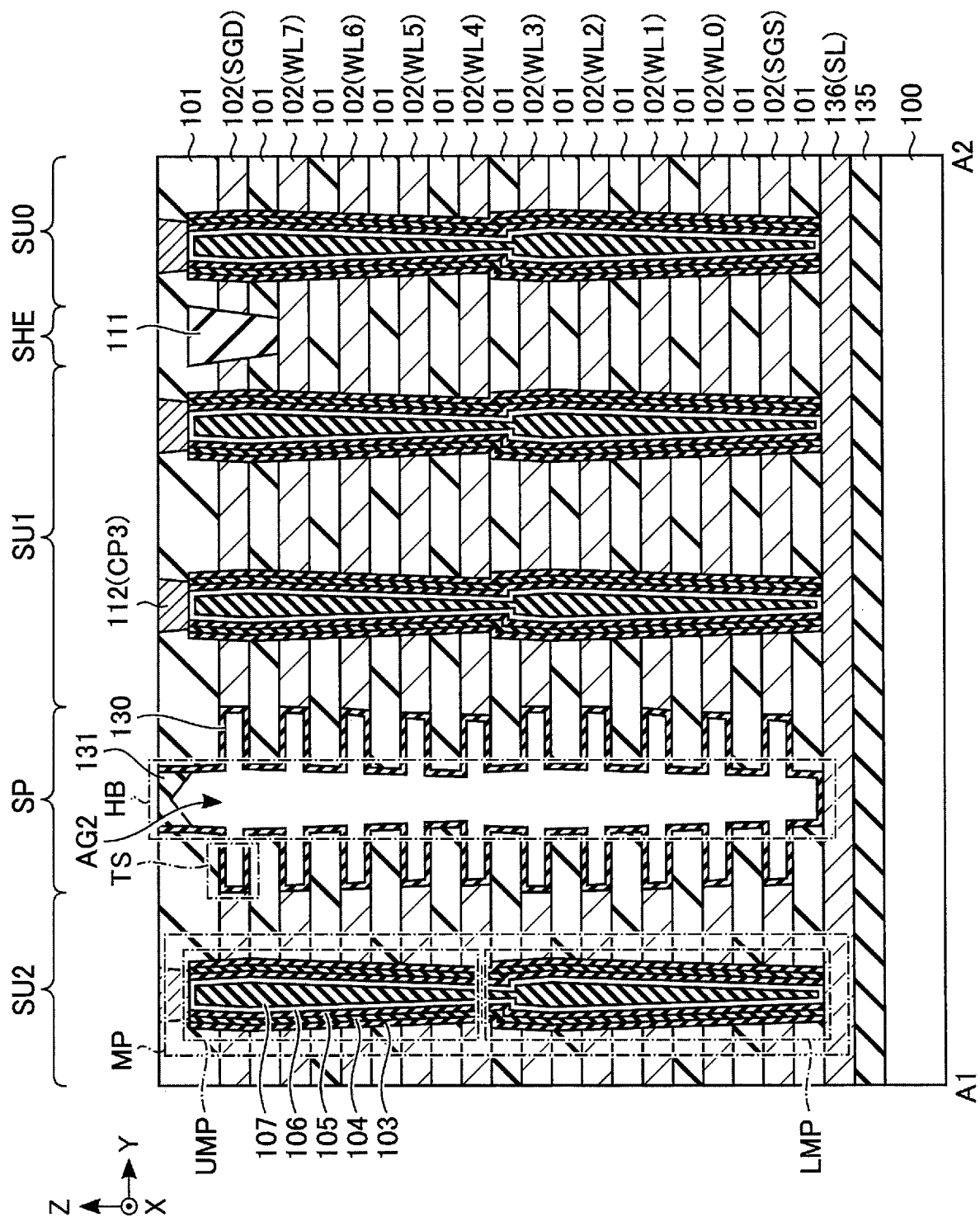
FIG. 21 is a cross-sectional view taken along line A1-A2 of FIG. 19.
Figure 22:
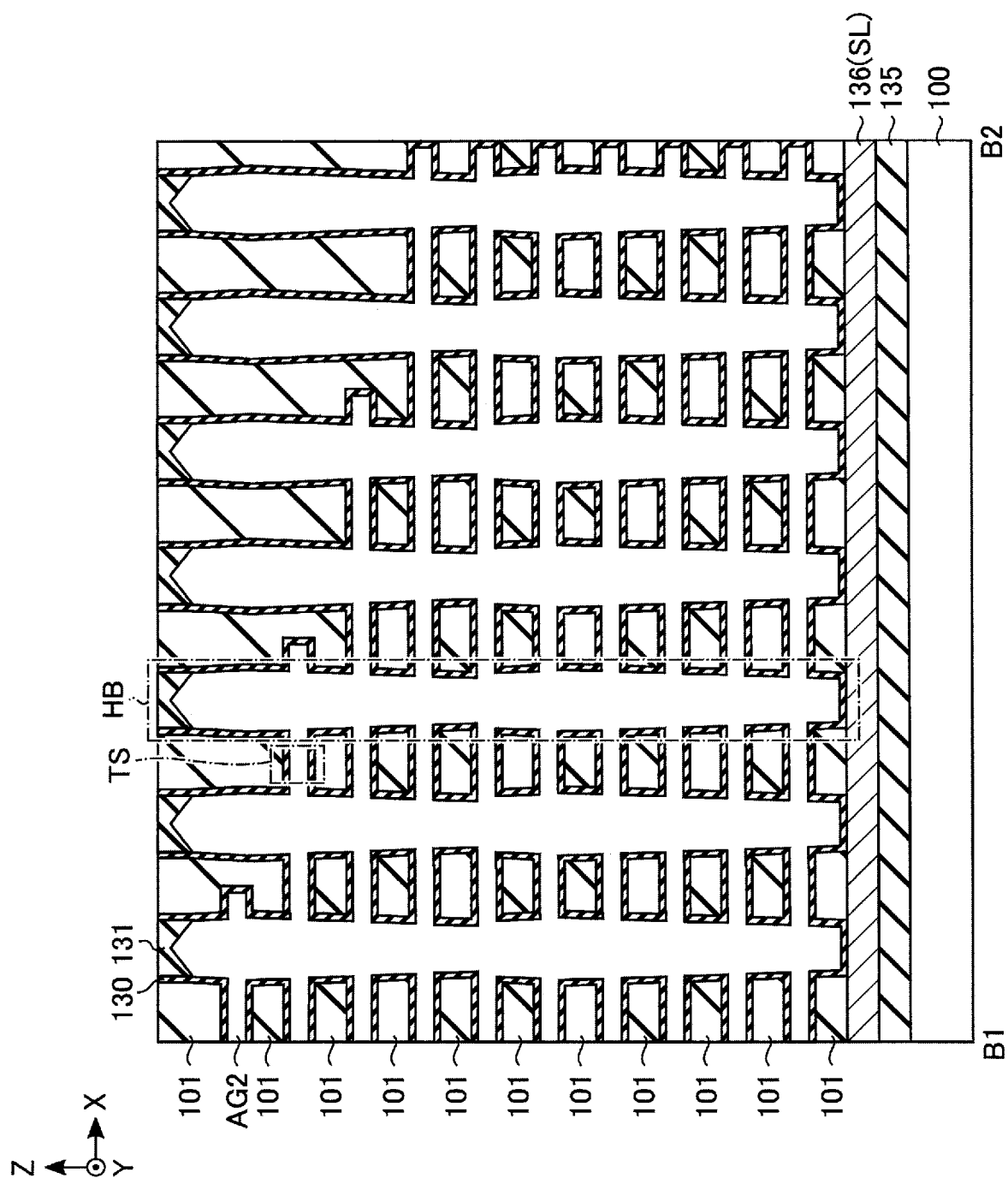
FIG. 22 is a cross-sectional view taken along line B1-B2 of FIG. 19.

Next, a cross-sectional configuration of the memory cell array 11 will be described with reference to FIGS. 21 and 22. FIG. 21 is a cross-sectional view taken along line A1-A2 of FIG. 19. FIG. 22 is a cross-sectional view taken along line B1-B2 of FIG. 19.

As shown in FIG. 21, an insulating layer 135 is provided on a semiconductor substrate 100, similarly to the first example of the second embodiment described with reference to FIG. 17. An interconnect layer 136 is provided on the insulating layer 135. On the interconnect layer 136, eleven insulating layers 101 and ten interconnect layers 102, for example, are stacked in an alternating manner.

In the present embodiment, an insulating layer 130 is formed so as to cover inner surfaces of pillar portions HB and protruding portions TS in a separation region SP. More specifically, an insulating layer 130 is formed on a side surface of each pillar portion HB that is in contact with the insulating layer 101, a bottom surface of each pillar portion HB that is in contact with the interconnect layer 136, a top surface and a bottom surface of each protruding portion TS, and a side surface of each protruding portion TS that is in contact with the interconnect layers 102. An air gap AG2 is formed in the insulating layer 130.

An insulating layer 131 is provided at an upper portion of the pillar portion HB so as to close the opening of the air gap AG2. The insulating layer 131 is formed using, for example, $SiO_2$.

Next, a cross-sectional configuration of the separation region SP will be described.

As shown in FIG. 22, the pillar portions HB are arranged, for example, at approximately equal intervals in the X direction. Protruding portions TS are formed at the same layers as the interconnect layers 102, and air gaps AG2 are formed in the pillar portions HB and the protruding portions TS. That is, in the separation region SP, air gaps AG2 are formed in a lattice pattern by pillar portions HB extending in the Z direction and protruding portions TS extending in the X direction.

3.3 Method of Manufacturing Memory Cell Array

Next, an example of a method of manufacturing a memory cell array 11 will be described with reference to FIGS. 23 to 29. In the present example, a case will be described where interconnect layers 102 are formed without performing replacement.

Figure 23:
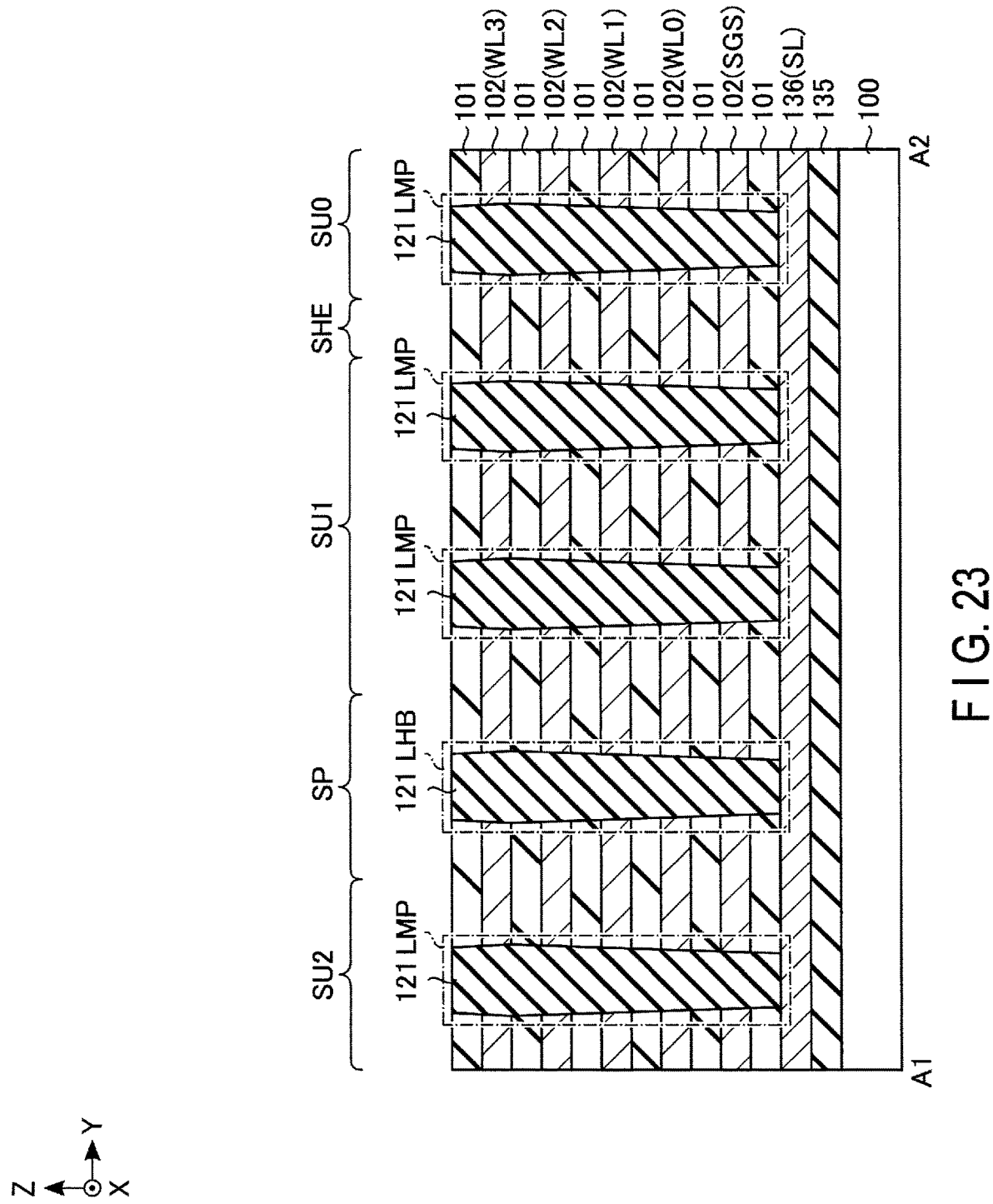
FIGS. 23-29 are diagrams showing a process of manufacturing the memory cell array included in the semiconductor memory device according to the third embodiment.

First, an insulating layer 135 is formed on a semiconductor substrate 100, as shown in FIG. 23. Subsequently, an interconnect layer 136 is formed on the insulating layer 135. Thereafter, six insulating layers 101 and five interconnect layers 102 respectively corresponding to a select gate line SGS and word lines WL0 to WL3, for example, are stacked on the interconnect layer 136 in an alternating manner.

Thereafter, holes corresponding to the memory pillars LMP and pillar portions LHB are formed, and the respective holes are filled with sacrificial layers 121.

Figure 24:
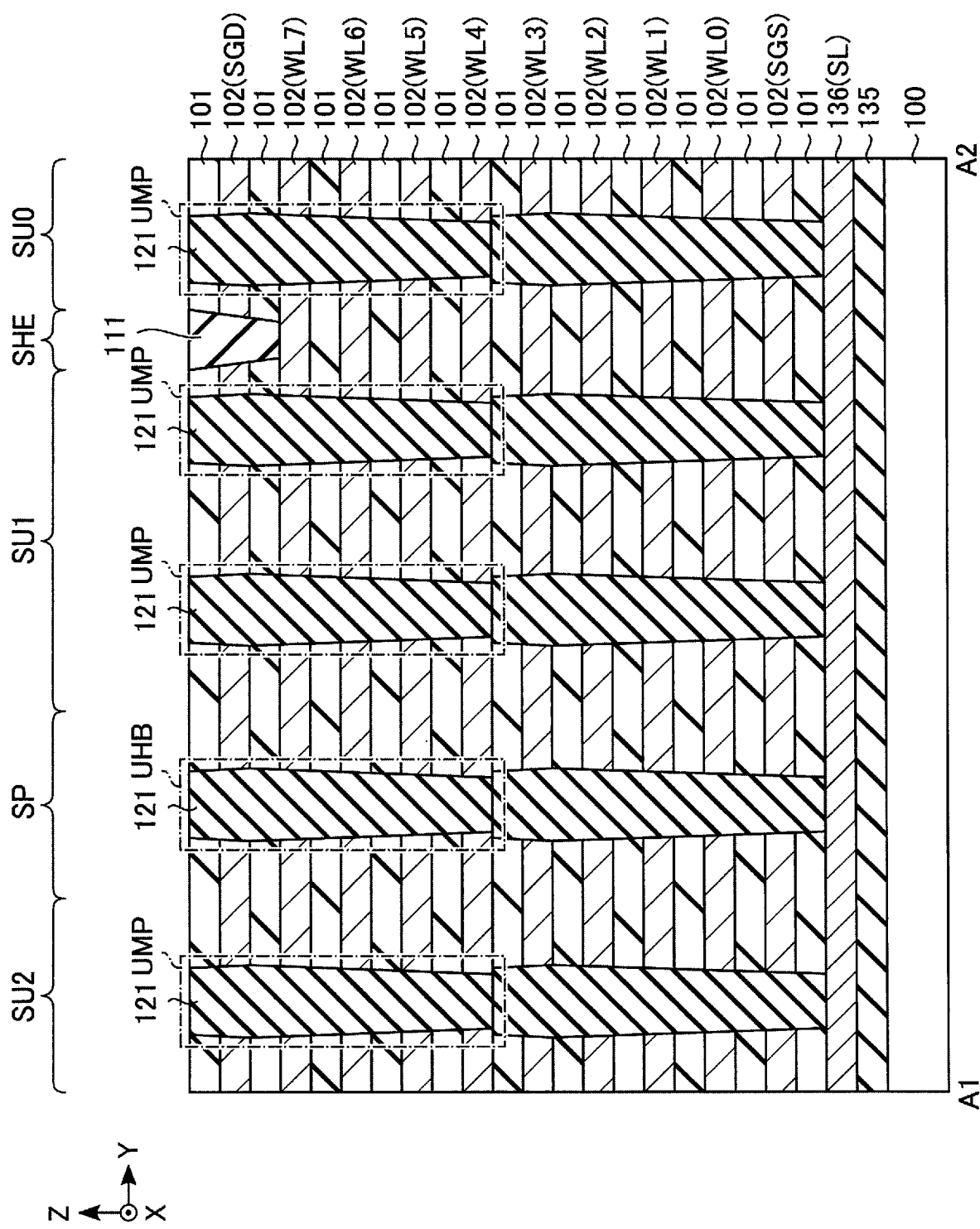

As shown in FIG. 24, five interconnect layers 102 respectively corresponding to word lines WL4 to WL7 and a select gate line SGD, and five insulating layers 101, for example, are further stacked on the topmost insulating layer 101 in an alternating manner.

Subsequently, a slit SHE is formed in such a manner that its bottom surface reaches the second topmost interconnect layer 102, which corresponds to the word line WL7, and is filled with an insulating layer 111.

Thereafter, holes corresponding to memory pillars UMP and pillar portions UHB are formed on the sacrificial layers 121 corresponding to the memory pillars LMP and the pillar portions LHB, and then the each hole is filled with a sacrificial layer 121.

Figure 25:
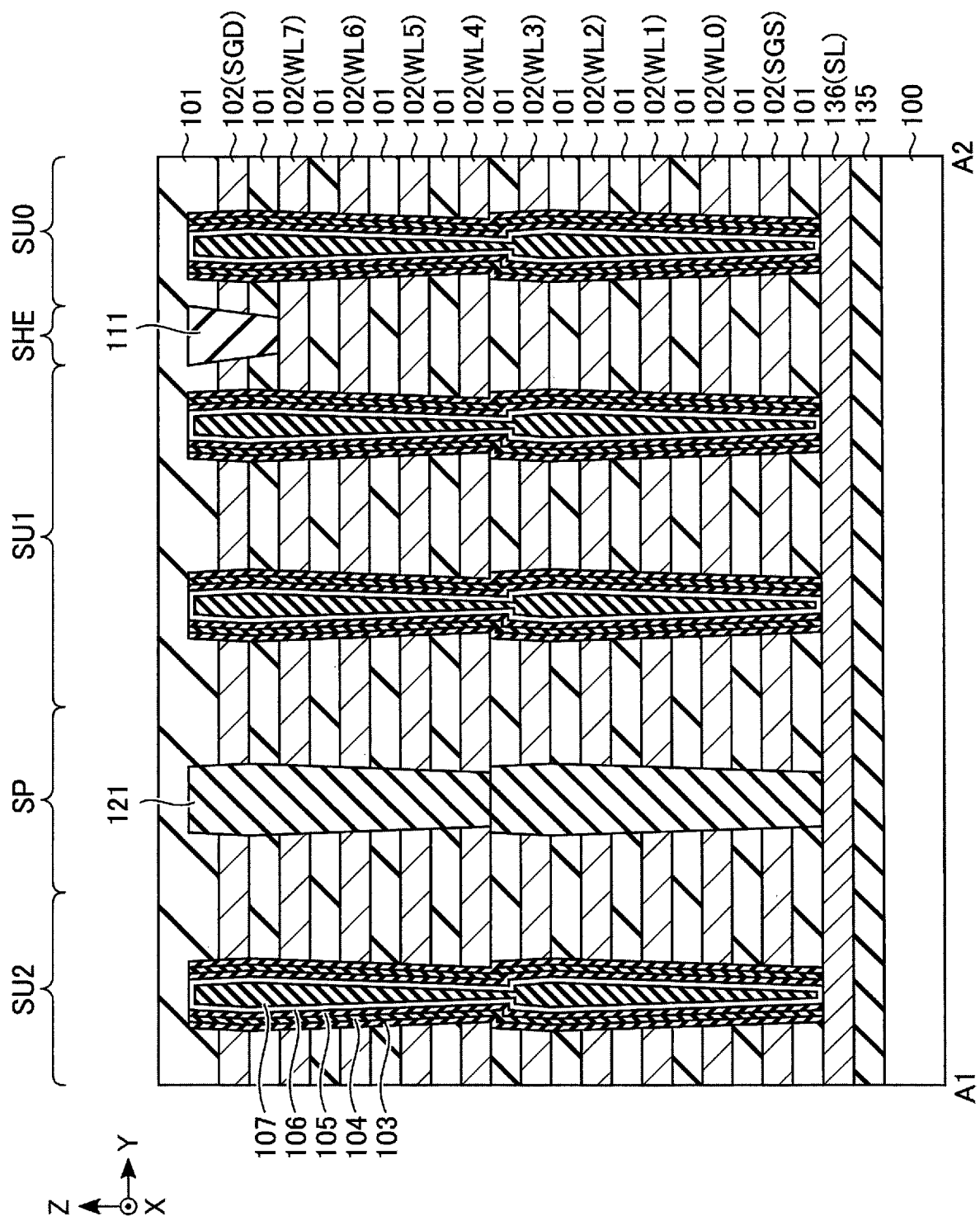

The sacrificial layers 121 corresponding to the memory pillars MP are removed, as shown in FIG. 25, similarly to the first embodiment described with reference to FIG. 10. Subsequently, a block insulating film 103, a charge storage layer 104, a tunnel insulating film 105, a semiconductor layer 106, and a core layer 107 are formed in order, and thereby a memory pillar MP is formed.

Subsequently, an insulating layer 101 is formed so as to cover top surfaces of the memory pillars MP, the insulating layer 111, and the sacrificial layers 121.

Figure 26:
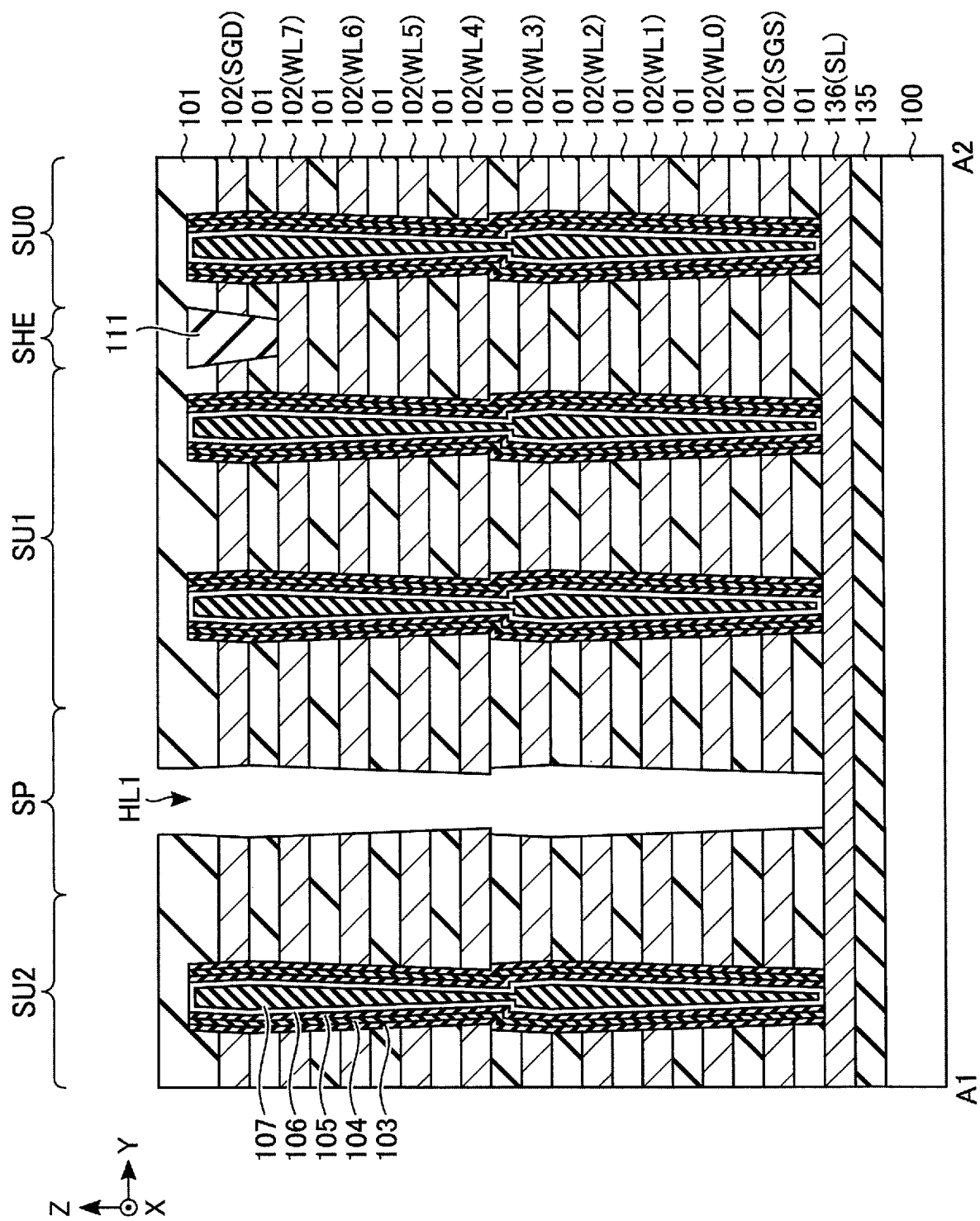

As shown in FIG. 26, the insulating layer 101 on the sacrificial layers 121 corresponding to the pillar portions HB are removed, and then the sacrificial layers 121 are removed by, for example, wet etching. Thereby, holes HL1 are formed.

Figure 27:
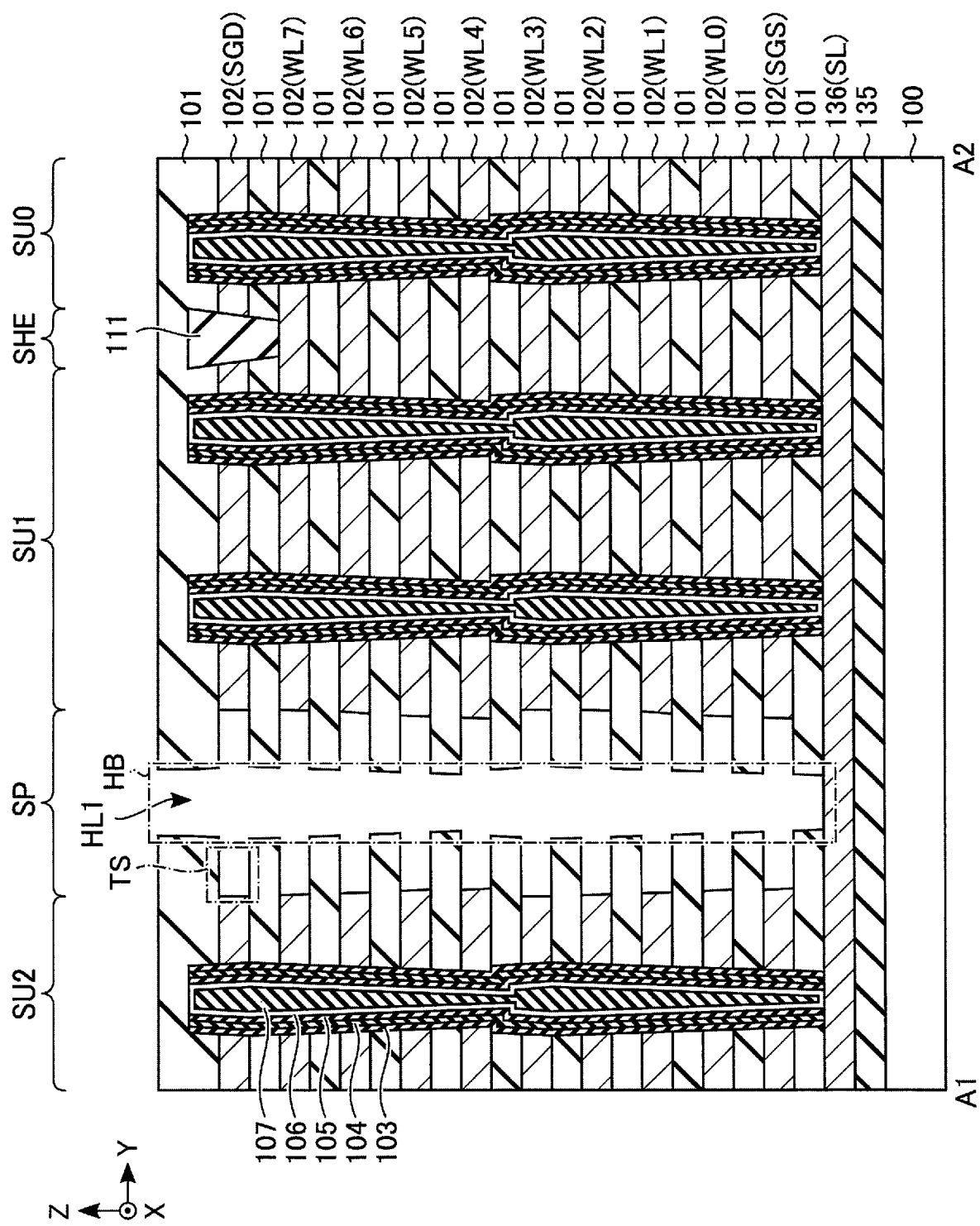

As shown in FIG. 27, the interconnect layers 102 are partially removed from the side surface of the hole HL1 by, for example, wet etching, thereby forming portions corresponding to the protruding portions TS.

Figure 28:
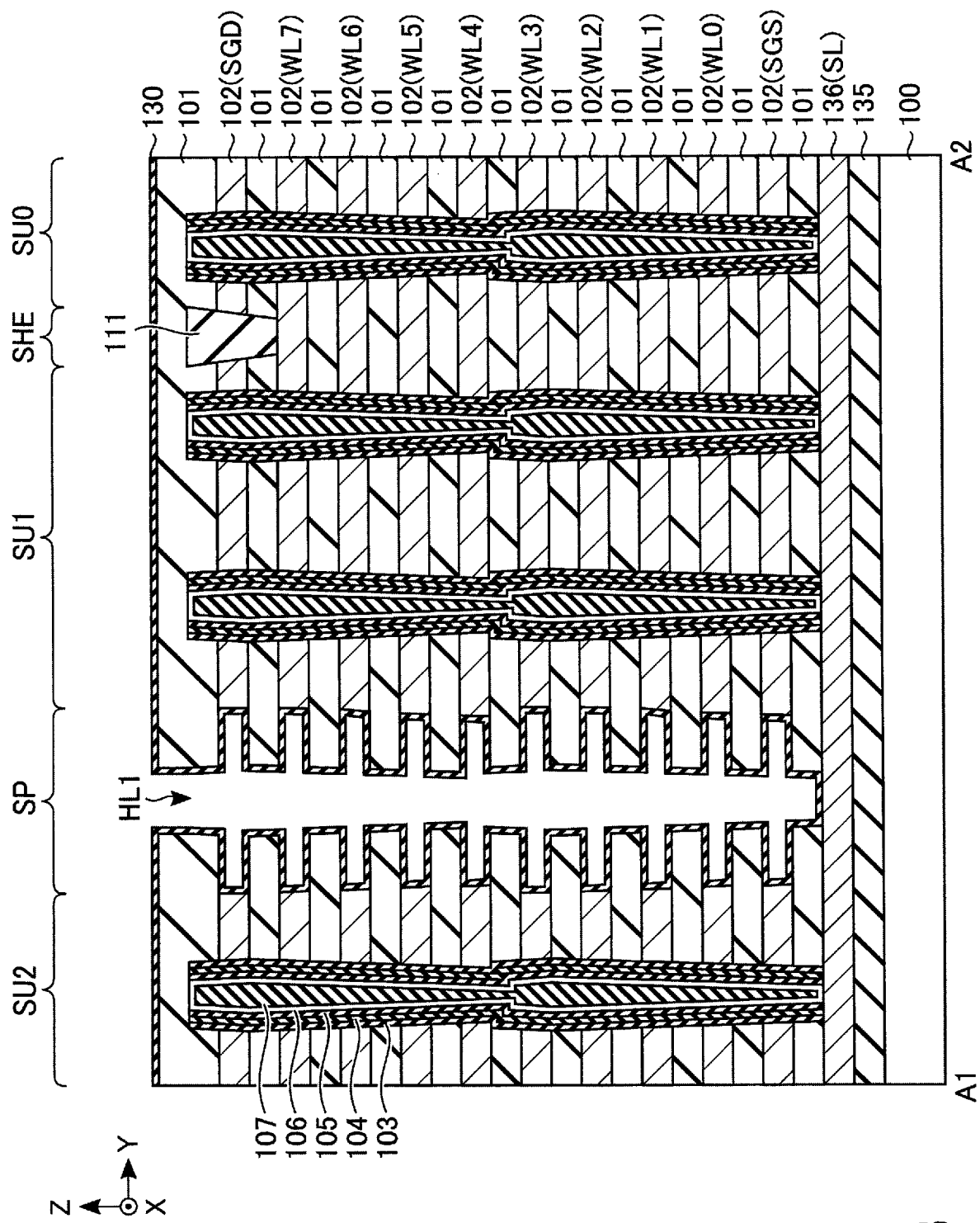

As shown in FIG. 28, an insulating layer 130 is formed using, for example, a technique that has a good step coverage, such as CVD and ALD. At this time, the insulating layer 130 is formed to have a thickness that does not allow the protruding portions TS and the hole HL1 to be filled in.

Figure 29:
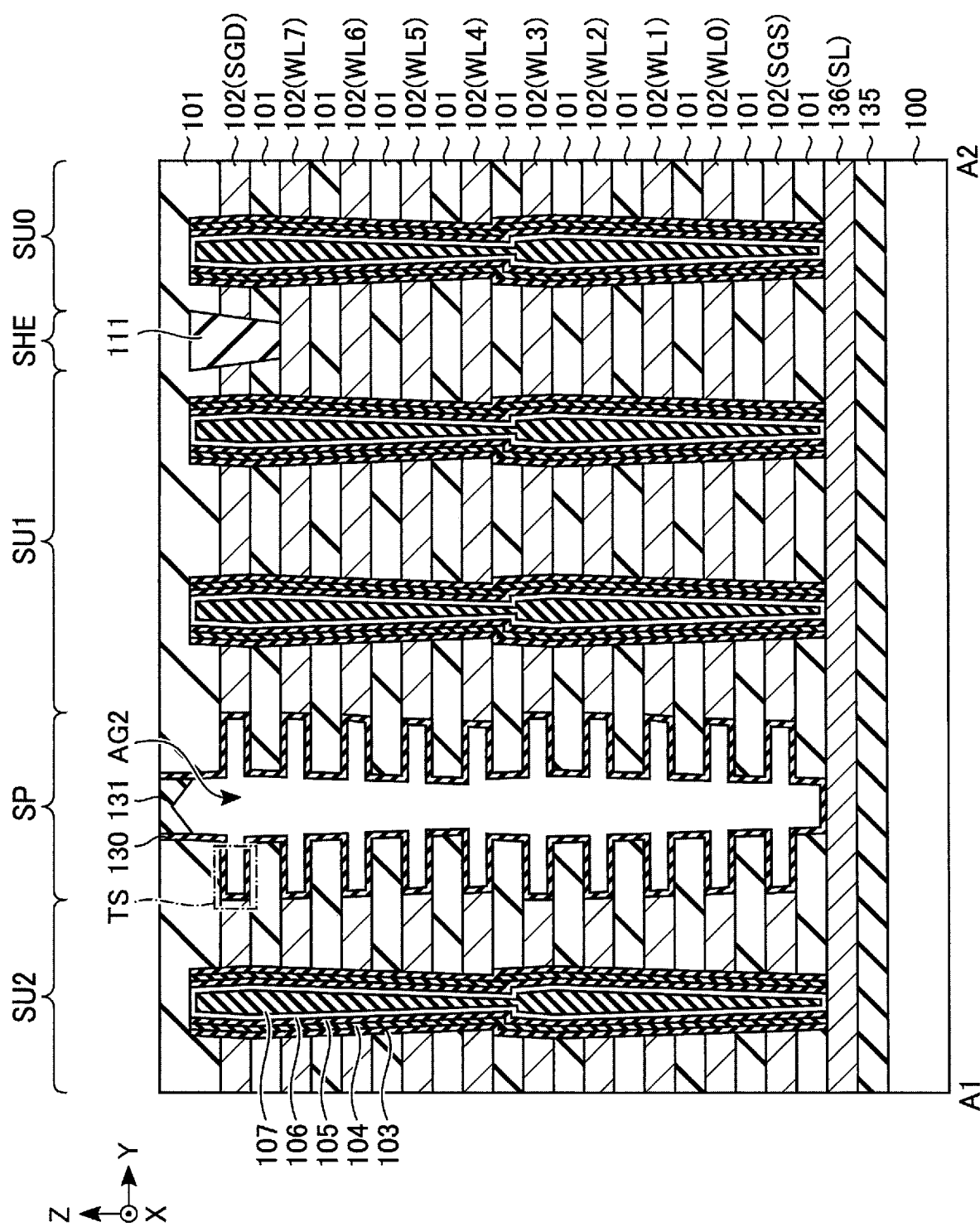

As shown in FIG. 29, an insulating layer 131 is formed using, for example, a technique that has a poor step coverage such as plasma CVD, and thereby the opening of the hole HL1 is closed. Thereafter, the insulating layers 130 and 131 on the topmost insulating layer 101 are removed using, for example, chemical mechanical polishing (CMP).

3.4 Effects of Present Embodiment

According to the configuration of the present embodiment, effects similar to those of the first embodiment are achieved.

Moreover, according to the configuration of the present embodiment, air gaps AG2 can be formed in the separation region SP. It is thereby possible to reduce the capacitance between two interconnect layers 102 provided on both sides of the separation region SP. With the reduction in capacitance between the interconnects, it is possible to make the distance between two interconnects that sandwich the separation region SP relatively short.

Furthermore, according to the configuration of the present embodiment, it is possible to form an insulating layer 130 between the interconnect layer 102 and an air gap AG2. It is thereby possible to suppress occurrence of a leakage current between the interconnect layers 102 caused by the effect of moisture, etc in the air gaps AG2, or to suppress surface migration of metallic atoms between the interconnect layers 102 with different potentials. This results in improvement in reliability of the semiconductor memory device.

Moreover, in the configuration of the present embodiment, the insulating layer 101 is not separated in the separation region SP. Thereby, the insulating layers 101 function, in the separation region SP, as linking portions that link portions of the insulating layers 101 (portions of the insulating layers 101 that are stacked so as to alternate with the interconnect layers 102) provided on both sides of the separation region SP. It is thereby possible to suppress a decrease in mechanical strength caused by formation of the air gaps AG2. Accordingly, it is possible to suppress occurrence of a physical failure such as a crack caused by the air gaps AG2.

Furthermore, according to the configuration of the present embodiment, dummy pillars HR need not be provided.

4. Fourth Embodiment

Next, a fourth embodiment will be described. According to the fourth embodiment, two example configurations of the separation region SP that are different from that of the third embodiment will be described. Hereinafter, the description will focus mainly on matters different from those of the third embodiment.

4.1 First Example

A first example will be described with reference to FIG. 30.

Figure 30:
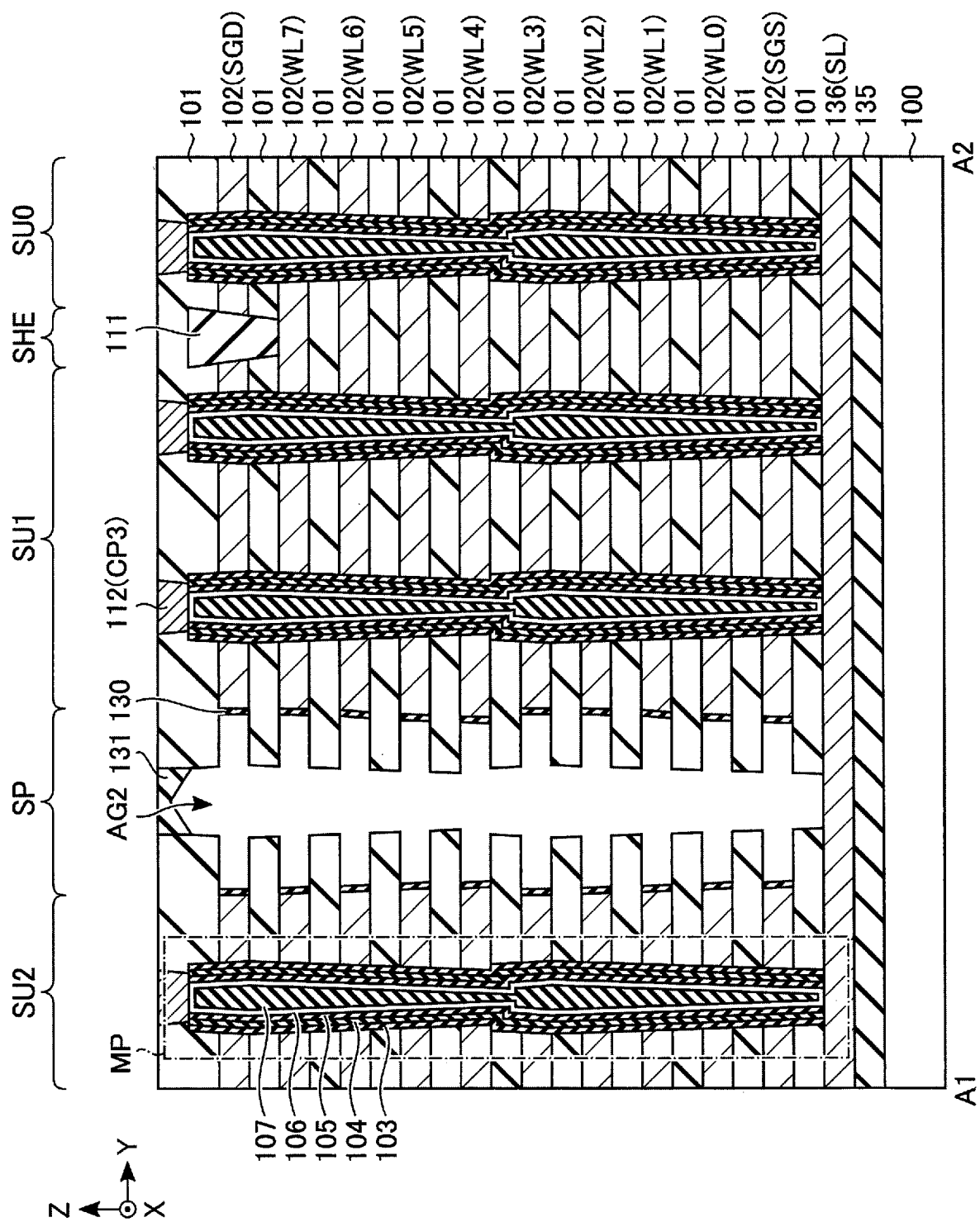
FIG. 30 is a cross-sectional view of a memory cell array included in a semiconductor memory device according to a first example of a fourth embodiment.

In the present example, insulating layers 130 are formed, in the separation region SP, on side surfaces of the interconnect layers 102, but are not formed on top surfaces and bottom surfaces of the air gaps AG2, or on side surfaces, top surfaces, and bottom surfaces of the insulating layers 101, as shown in FIG. 30. In other words, the insulating layers 130 are locally formed between the air gaps AG2 and the interconnect layers 102. The insulating layers 130 are not formed between the air gaps AG2 and the insulating layers 101 and the interconnect layer 136. The insulating layer 130 is formed on surfaces of the exposed interconnect layers 102 by selective ALD, as described in the third embodiment with reference to FIG. 28. The above-described configuration may be formed thereby.

4.2 Second Example

Next, the second example will be described with reference to FIG. 31.

Figure 31:
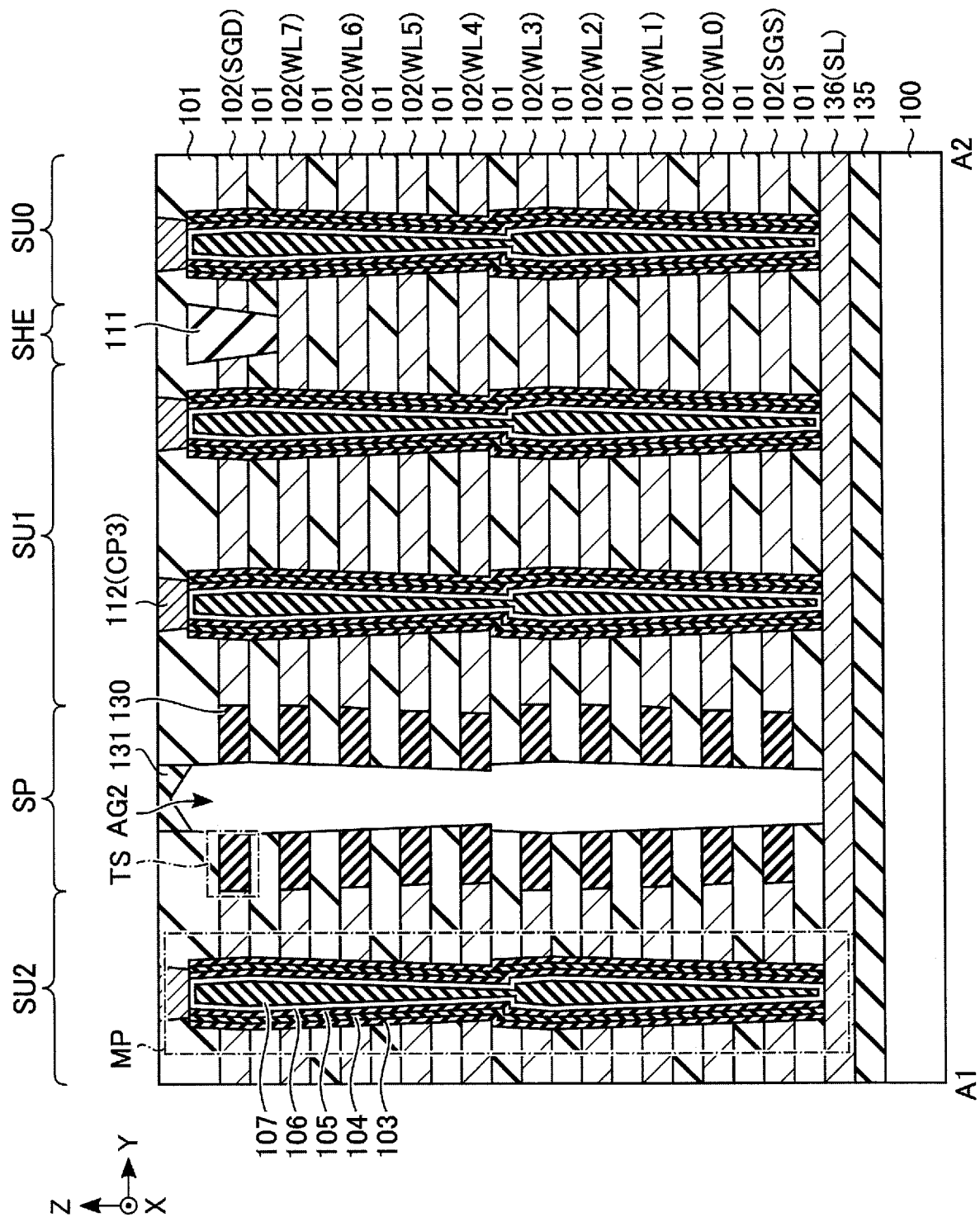
FIG. 31 is a cross-sectional view of a memory cell array included in a semiconductor memory device according to a second example of the fourth embodiment.

As shown in FIG. 31, in the present example, protruding portions TS are filled with insulating layers 130, and the insulating layers 130 are not formed on side surfaces and bottom surfaces of the pillar portions HB. The insulating layer 130 is formed, for example, with a thickness that allows the protruding portions TS to be filled in, but does not allow the pillar portions HB to be filled in, as described in the third embodiment with reference to FIG. 28. The insulating layer 130 on side surfaces and bottom surfaces of the pillar portions HB is removed by, for example, wet etching or chemical dry etching (CDE). The above-described configuration may be formed thereby.

4.3 Effects of Present Embodiment

According to the configuration of the present embodiment, it is possible to obtain effects similar to those of the first to third embodiments.

5. Fifth Embodiment

Next, a fifth embodiment will be described. In the fifth embodiment, a structure of a separation region SP provided at an end portion of a memory cell array 11 and contact plugs CP2 different from that of the first embodiment will be described. Hereinafter, the description will focus mainly on matters different from those of the first to fourth embodiments.

5.1 Planar Configuration of Semiconductor Memory Device

Figure 32:
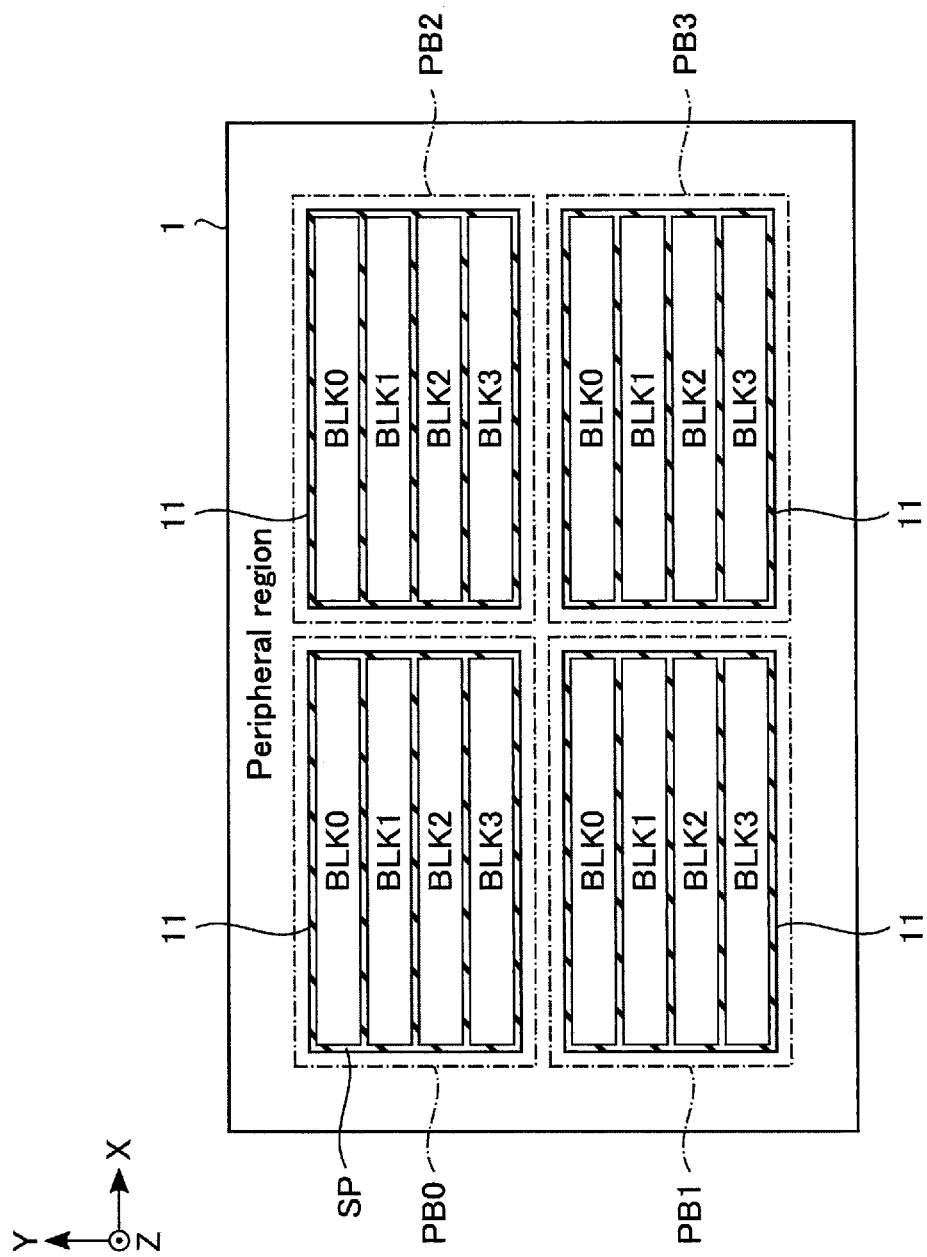
FIG. 32 is a plan view of a semiconductor memory device according to a fifth embodiment.

First, an example planar configuration of a semiconductor memory device 1 will be described with reference to FIG. 32. As shown in FIG. 32, the semiconductor memory device 1 of the present embodiment includes, for example, four planes PB (PB0 to PB3). Each plane PB is a unit that includes a memory core unit 10, namely, a memory cell array 11, and performs a write operation, a read operation, etc. The planes PB0 to PB3 are independently operable, and can operate at the same time. In the present embodiment, the planes PB0 to PB3 have the same configuration. The planes PB0 to PB3 are, for example, arranged in a matrix of 2 rows×2 rows. The number and arrangement of the planes PB may be freely designed.

In the present embodiment, the separation region SP described with reference to the third embodiment is provided in the outer periphery of the memory cell array 11 and between the blocks BLK in each plane PB.

In the description that follows, a region that does not include the memory cell arrays 11 in a planar configuration of the semiconductor memory device 1 will be referred to as a peripheral region. In the peripheral region, one of the circuits other than the memory cell arrays 11 or an electrode pad that is used for coupling between the semiconductor memory device 1 and an external device, for example, is provided.

5.2 Planar Configuration of Memory Cell Array

Figure 33:
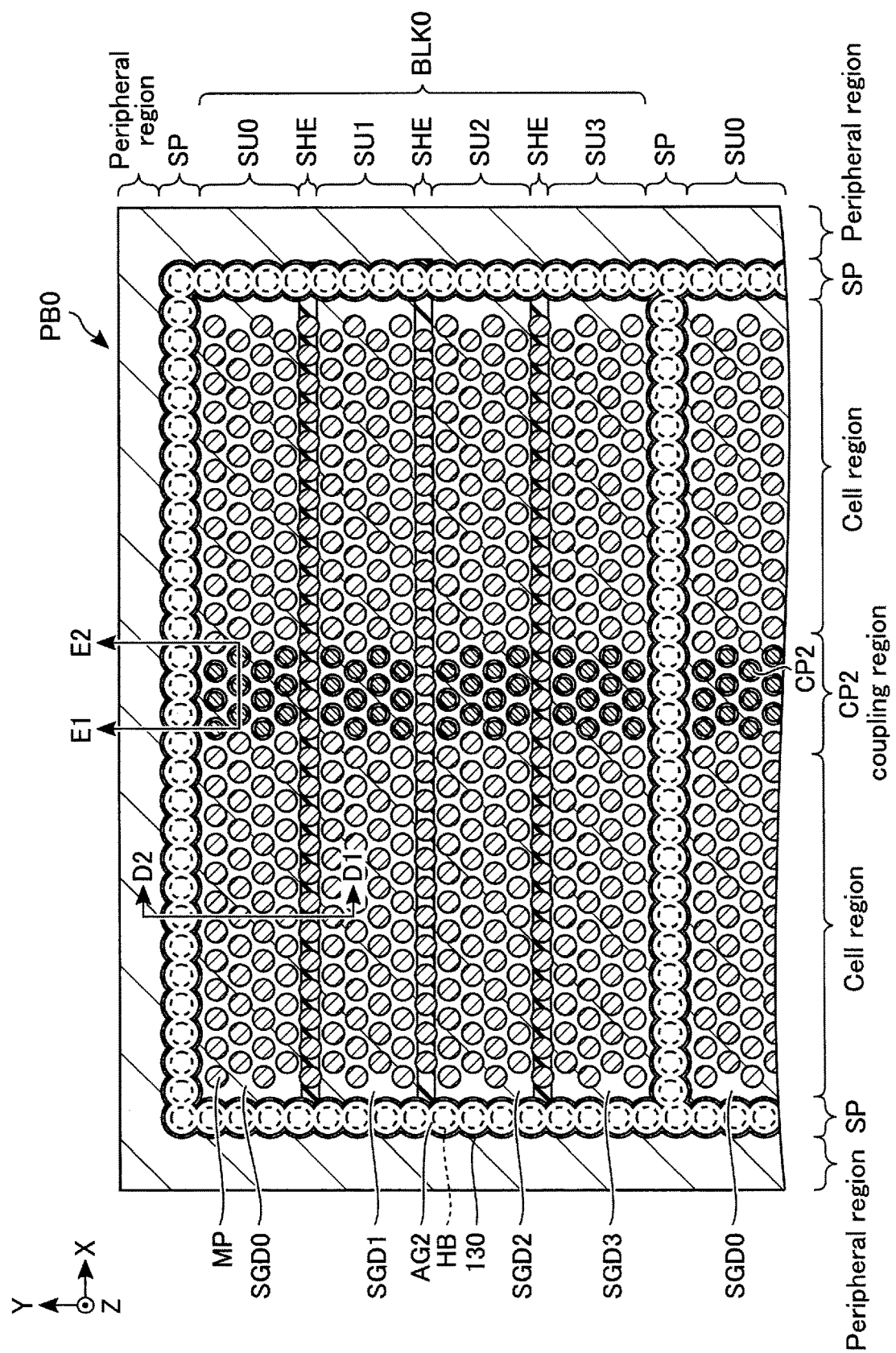
FIG. 33 is a plan view of a memory cell array included in the semiconductor memory device according to the fifth embodiment.

Next, an example planar configuration of the memory cell array 11 will be described with reference to FIG. 33. FIG. 33 is a plan view of a block BLK0 in a plane PB0. In the present embodiment, a case will be described where four string units SU0 to SU3 share word lines WL0 to WL7 and a select gate line SGS. In the example of FIG. 33, interlayer insulating films are omitted.

As shown in FIG. 33, a separation region SP is provided to surround each block BLK.

That is, interconnect layers 102 corresponding to the select gate lines SGD and SGS and the word lines WL are separated from the peripheral region by the separation region SP. The separation region SP that is provided in the outer periphery of the memory cell array 11 and separates the memory cell array 11 from the peripheral region will also be referred to as an "outer peripheral separation region SP". In the example of FIG. 33, the separation region SP has a structure similar to that of the third embodiment, and air gaps AG2 are provided in the pillar portions HB and the protruding portions TS. The separation region SP may have a structure similar to those of the other embodiments. In other words, the outer peripheral separation region SP may have a structure substantially the same as that of the separation region SP provided in the memory cell array 11.

In the present embodiment, a CP2 coupling region is provided between two cell regions in the X direction, and terraces are not provided. The arrangement of the CP2 coupling region may be freely designed. The CP2 coupling region may be provided at end portions of the interconnect layers 102 in the X direction. A plurality of CP2 coupling regions may be provided in such a manner that the CP2 coupling regions and a plurality of cell regions are arranged in an alternating manner. In the example of FIG. 33, the diameter of the contact plugs CP2 and the diameter of the memory pillars MP may be equal to or different from each other.

At the same layer as the select gate lines SGD and SGS and the word lines WL, protruding portions are provided outside each contact plug CP2. In the CP2 coupling region, protruding portions of adjacent contact plugs CP2 are not linked to each other, so as not to separate the interconnect layers 102 in the X direction, unlike the separation region SP.

Slits SHE are provided between the select gate line SGD0 and the select gate line SGD1, between the select gate line SGD1 and the select gate line SGD2, and between the select gate line SGD2 and the select gate line SGD3. Memory pillars MP are also provided on the slits SHE, similarly to FIG. 3 of the first embodiment; however, such memory pillars need not be provided. In addition, the memory pillars MP on the slits SHE need not function as NAND strings NS.

In the present embodiment, since the interconnect layers 102 are not formed by the replacement technique, dummy pillars HR are not provided in the CP2 coupling region.

5.3 Cross-Sectional Configuration of Memory Cell Array

Figure 34:
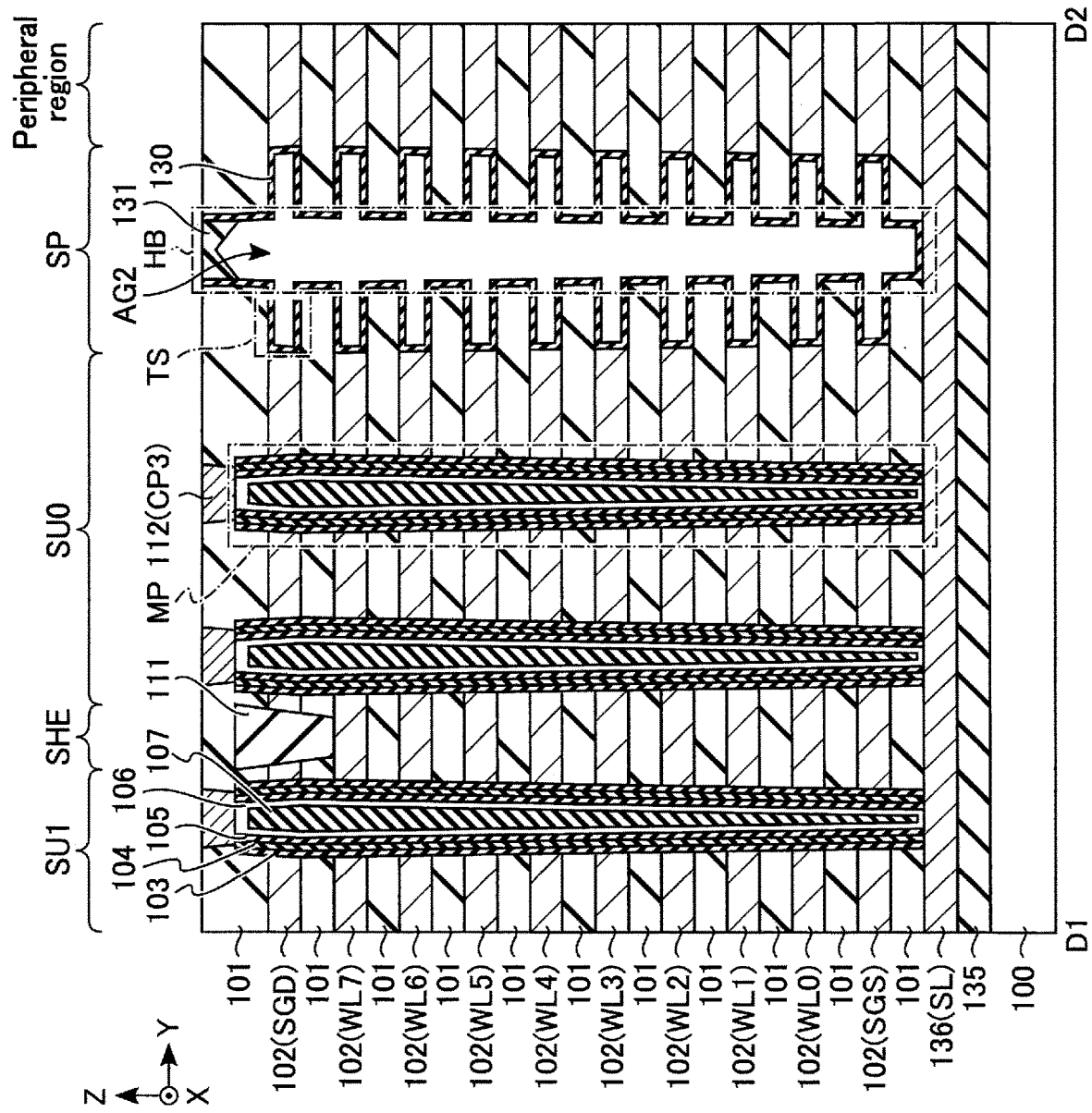
FIG. 34 is a cross-sectional view taken along line D1-D2 of FIG. 33.
Figure 35:
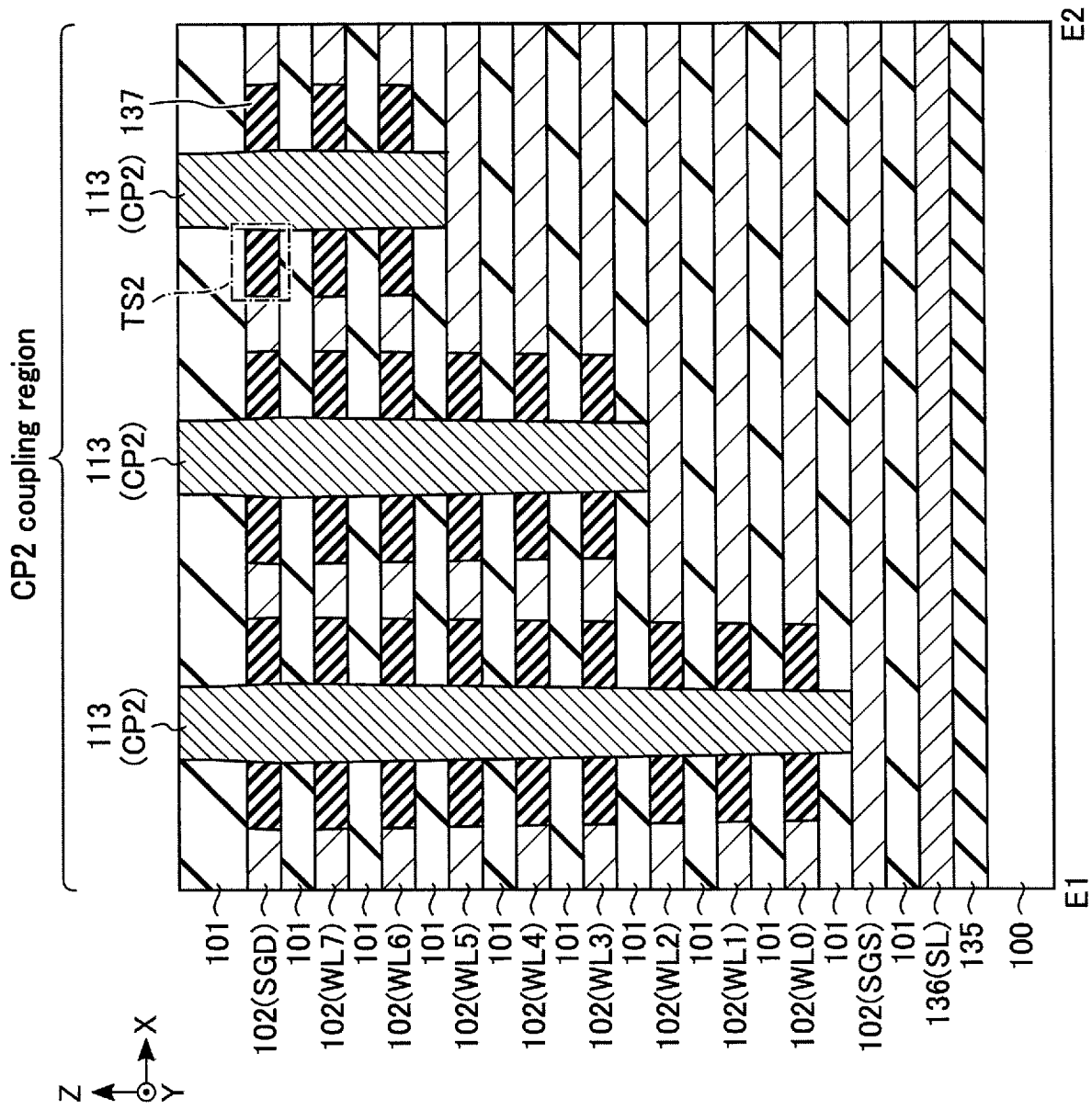
FIG. 35 is a cross-sectional view taken along line E1-E2 of FIG. 33.

Next, a cross-sectional configuration of the memory cell array 11 will be described with reference to FIGS. 34 and 35. FIG. 34 is a cross-sectional view taken along line D1-D2 of FIG. 33. FIG. 35 is a cross-sectional view taken along line E1-E2 of FIG. 33.

In the present embodiment, as shown in FIG. 34, eleven insulating layers 101 and ten interconnect layers 102 are stacked in an alternating manner on an interconnect layer 136, similarly to FIG. 21 of the third embodiment.

Pillar portions HB and protruding portions TS in a separation region SP have a structure similar to that of the third embodiment described with reference to FIG. 21.

In the peripheral region, eleven insulating layers 101 and ten interconnect layers 102 are stacked in an alternating manner, similarly to the memory cell array 11. In the present embodiment, the memory cell array 11 and the peripheral region are separated by the separation region SP. Accordingly, a region in which the insulating layers 101 and the interconnect layers 102 are stacked without the interconnect layers 102 being removed remains at least in a part of the peripheral region.

Next, a cross-sectional configuration of the CP2 coupling region will be described.

As shown in FIG. 35, protruding portions TS2 are provided between side surfaces of contact plugs CP2 and interconnect layers 102, and the protruding portions TS2 are filled with insulating layers 137. The insulating layers 137 are formed using, for example, $SiO_2$. Accordingly, each contact plug CP2 is electrically coupled to an interconnect layer 102 with which a bottom portion of the contact plug CP2 is in contact, and is not electrically coupled to the interconnect layers 102 on a side surface of the contact plug CP2. Protruding portions TS2 that are provided outside the adjacent contact plugs CP2 are not linked to one another.

5.4 Method of Manufacturing Memory Cell Array

Next, an example of a method of manufacturing the memory cell array 11 will be described with reference to FIGS. 36 to 45. In the present embodiment, a case will be described where holes corresponding to the memory pillars MP, the pillar portions HB in the separation region SP, and the contact plugs CP2 are simultaneously etched. Also, a case will be described where the contact plugs CP2 and CP3 are simultaneously filled with a conductive material. In order to simplify the description, a case will be described where each of the memory pillars MP, the pillar portions HB in the separation region SP, and the contact plugs CP2 is formed in a single tier.

Figure 36:
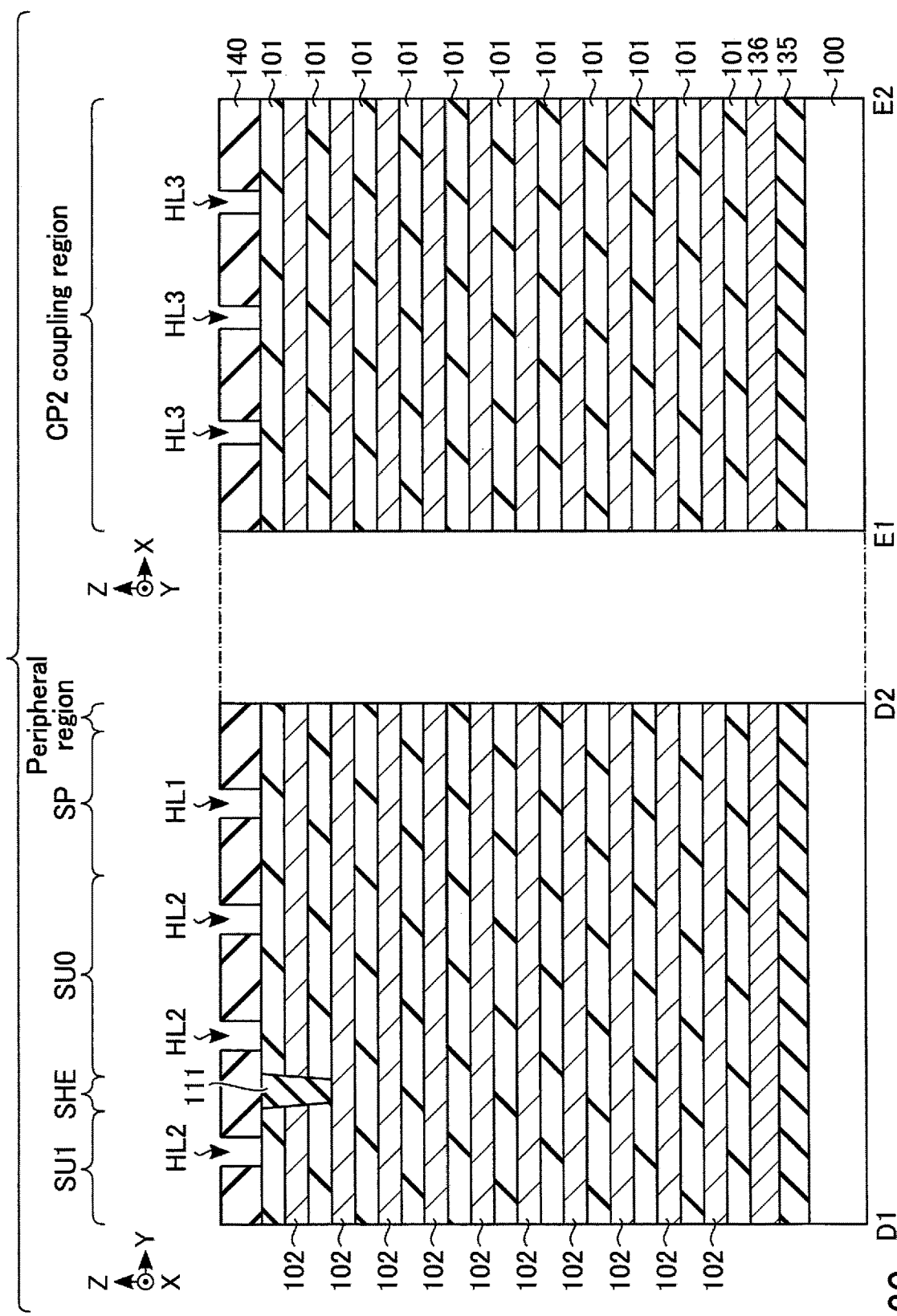
FIGS. 36-45 are diagrams showing a process of manufacturing the memory cell array included in the semiconductor memory device according to the fifth embodiment.

As shown in FIG. 36, an insulating layer 135 is formed on a semiconductor substrate 100. Subsequently, an interconnect layer 136 is formed on the insulating layer 135. Thereafter, eleven insulating layers 101 and ten interconnect layers 102, for example, are stacked in an alternating manner on the interconnect layer 136.

Subsequently, a slit SHE is formed in such a manner that its bottom surface reaches the second topmost interconnect layer 102, which corresponds to the word line WL7, and is filled with an insulating layer 111.

Thereafter, a hard mask layer 140 is formed on the topmost insulating layer 101. The hard mask layer 140 functions as a mask material at the time of etching holes corresponding to the memory pillars MP, pillar portions HB in the separation region SP, and contact plugs CP2. The hard mask layer 140 may be configured of any material that allows the insulating layers 101 and the interconnect layers 102 to have a sufficiently high etching selectivity for the hard mask layer 140 at the time of dry etching of the insulating layers 101 and the interconnect layers 102; such a material may be an insulating material, a semiconductor, and a conductive material.

Subsequently, the hard mask layer 140 is etched, and holes HL1 corresponding to pillar portions HB in the separation region SP, holes HL2 corresponding to memory pillars MP, and holes HL3 corresponding to contact plugs CP2 are formed. The diameters of the holes HL1 to HL3 may be equal to or different from one another.

Figure 37:
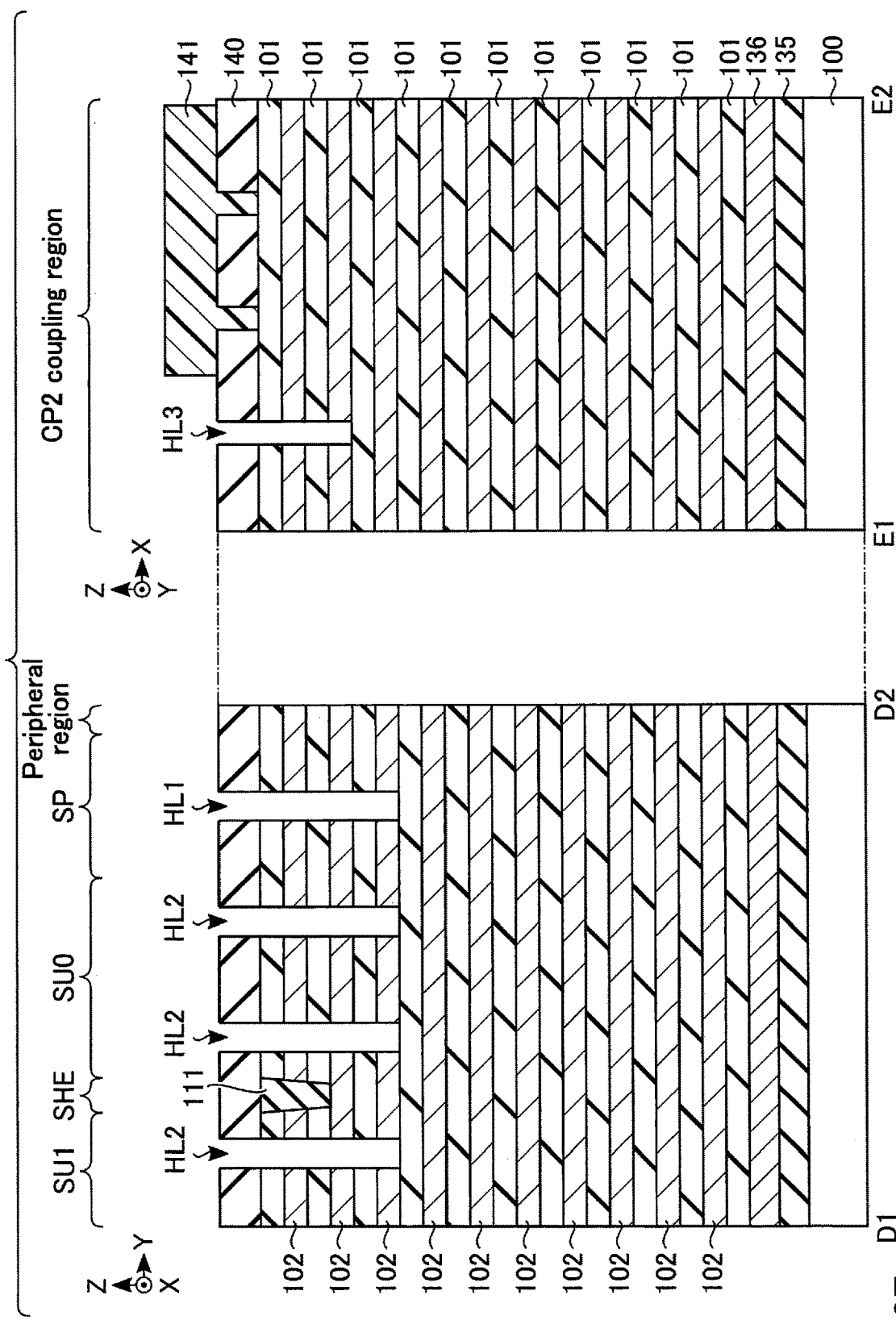
Figure 38:
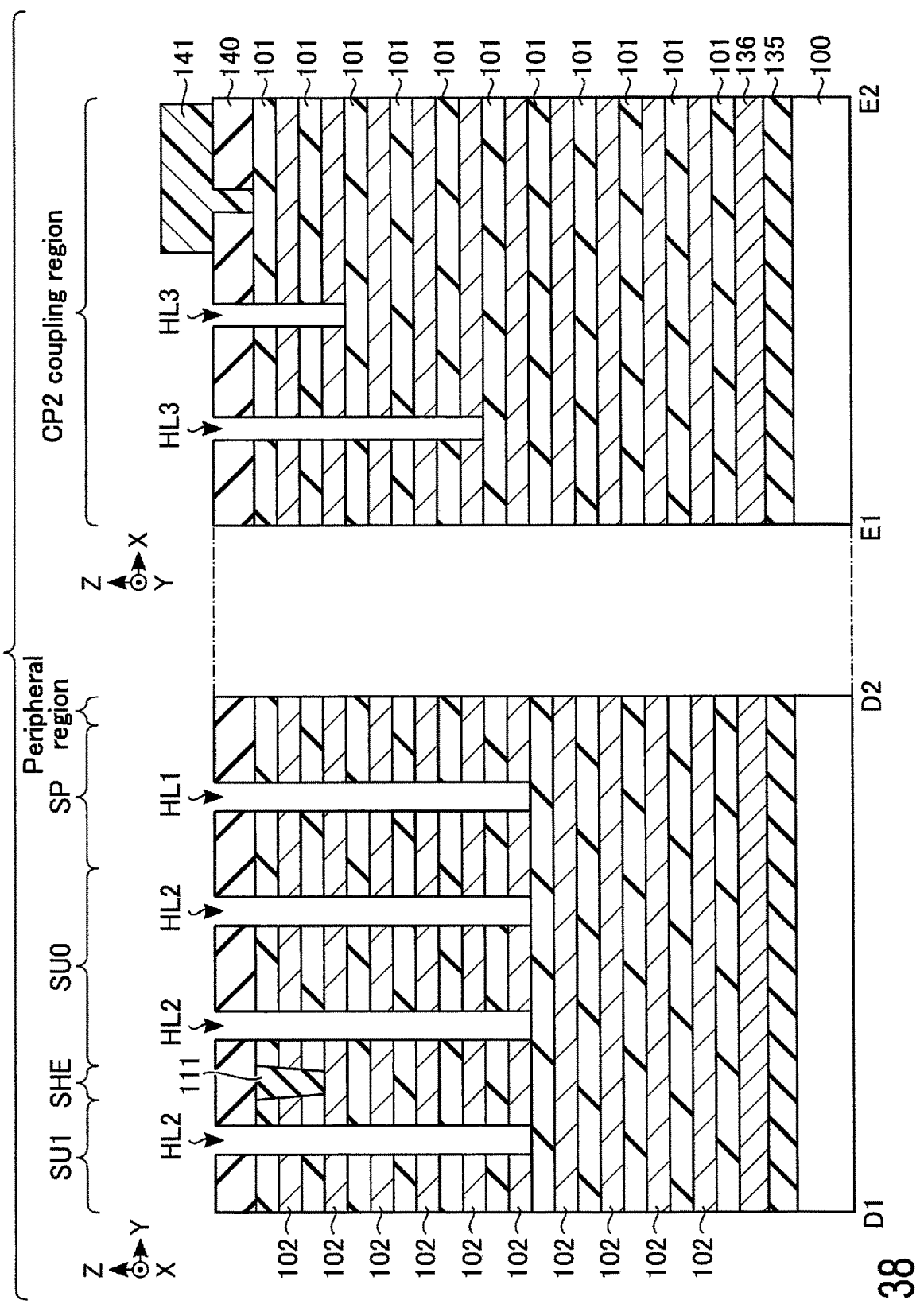
Figure 39:
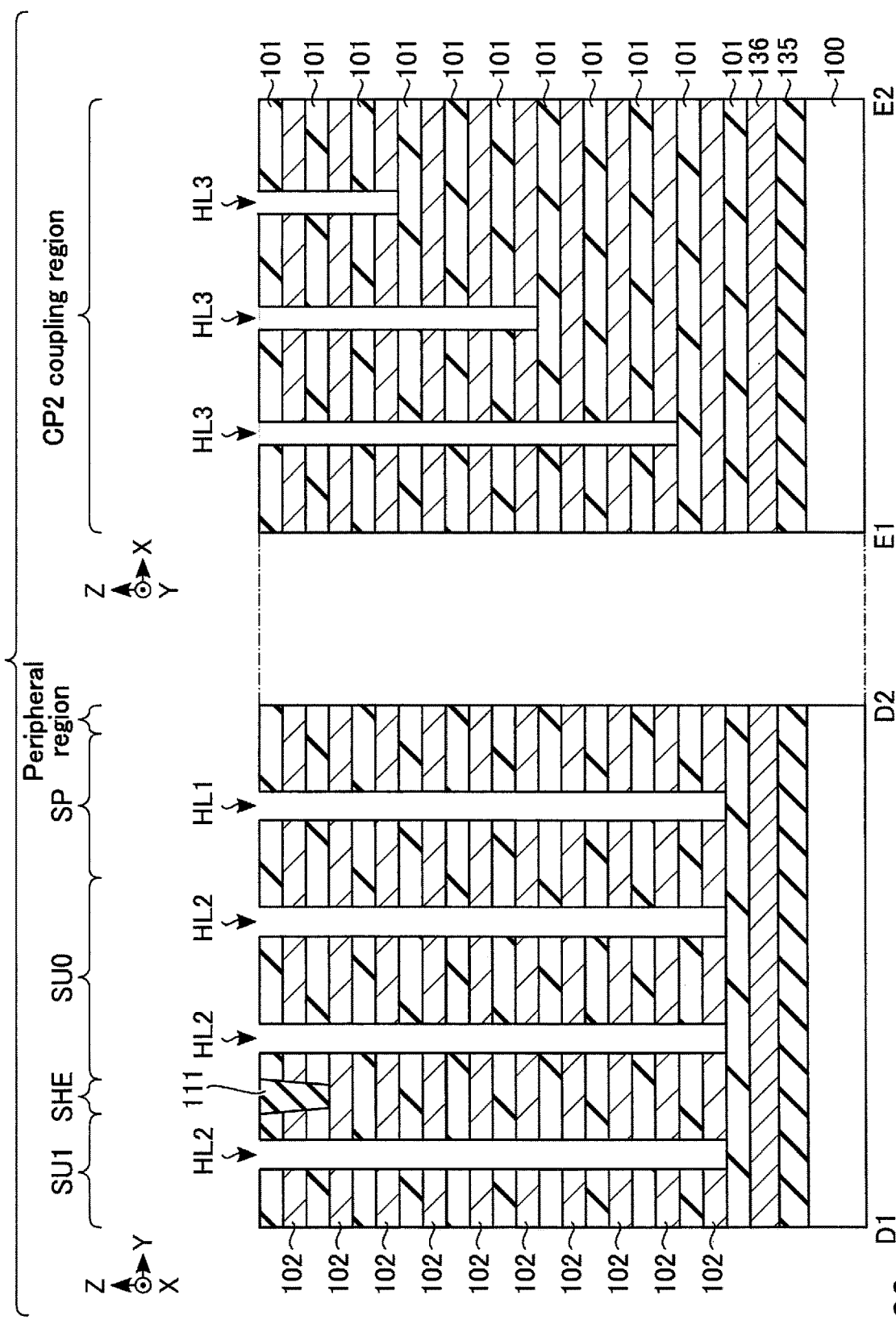

By repeating mask formation with a resist 141 using photolithography and dry etching, as shown in FIGS. 37 to 39, holes HL1 and HL2 that reach, at its bottom surface, the bottommost insulating layer 101, and holes HL3 with different depths are formed. More specifically, while the holes HL3 of the CP2 coupling region are covered with the resist 141, the insulating layer 101 and the interconnect layer 102 at the bottom portions of the holes HL1 and HL2 are etched. After the resist 141 is peeled, a resist 141 is formed to expose the holes HL1 and HL2 and the holes HL3 corresponding to the bottommost interconnect layer 102. The insulating layer 101 and the interconnect layer 102 at the bottom portions of the holes HL1 and HL2 and the exposed holes HL3 are etched. Thereafter, the resist 141 is peeled.

Subsequently, as shown in FIG. 37, a mask is formed using a resist 141 to expose the holes HL1 and HL2, and the holes HL3, which respectively correspond to the bottommost and second bottommost interconnect layers 102. The insulating layer 101 and the interconnect layer 102 at the bottom portions of the holes HL1 and HL2 and the exposed holes HL3 are etched.

Similarly, the mask formation using a resist 141 and the operation of etching the insulating layer 101 and the interconnect layer 102 that are exposed to the bottom portions of the holes HL1 to HL3 are repeated.

As shown in FIG. 38, a mask is formed, for example, using a resist 141 to expose the holes HL1 and HL2 and holes HL3 corresponding to the bottommost to fourth bottommost interconnect layers 102. The insulating layer 101 and the interconnect layer 102 at the bottom portions of the holes HL1 and HL2 and the exposed holes HL3 are etched.

As shown in FIG. 39, the hard mask layer 140 is removed after the etching of the holes HL1 to HL3. In the examples of FIGS. 37 to 39, a case has been described where mask formation with a resist 141 and dry etching are repeated; however, the method is not limited thereto. For example, instead of the resist 141, a template transfer layer including steps corresponding to holes HL3 with different depths may be formed using nanoimprint lithography, thereby repeating etching of the holes HL1 to HL3 and etching of the template transfer layer. Also, by varying, for example, the size of the mask pattern of the resist 141 using a slimming process, holes HL3 with different depths may be formed.

Figure 40:
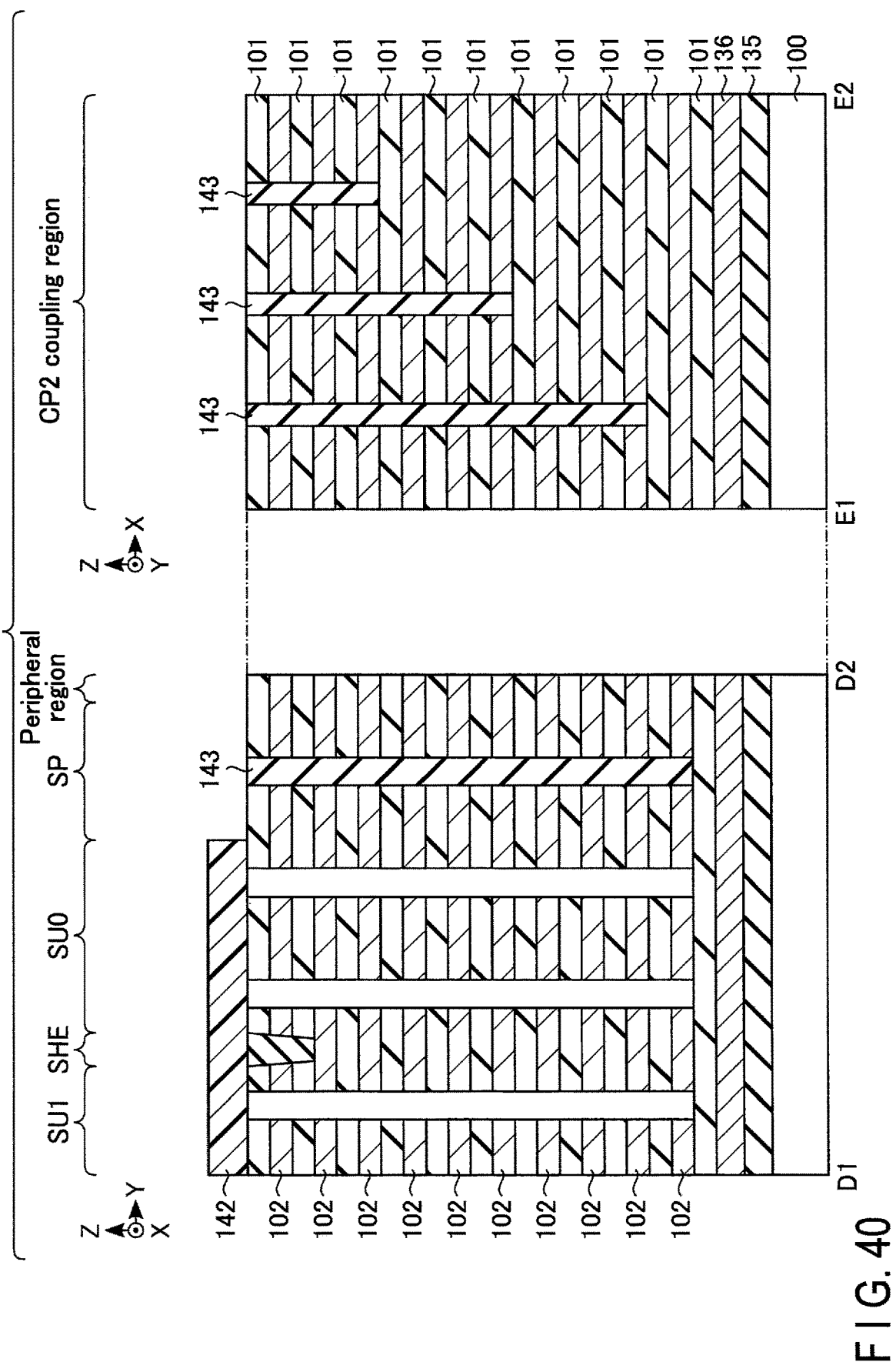

As shown in FIG. 40, a mask is formed, for example, with a resist 142 on holes HL2 corresponding to memory pillars MP. Subsequently, the exposed holes HL1 and HL3 are filled with sacrificial layers 143. The sacrificial layers 143 may be configured of any material that has a sufficiently high wet-etching selectivity for the insulating layers 101 and the interconnect layers 102.

Figure 41:
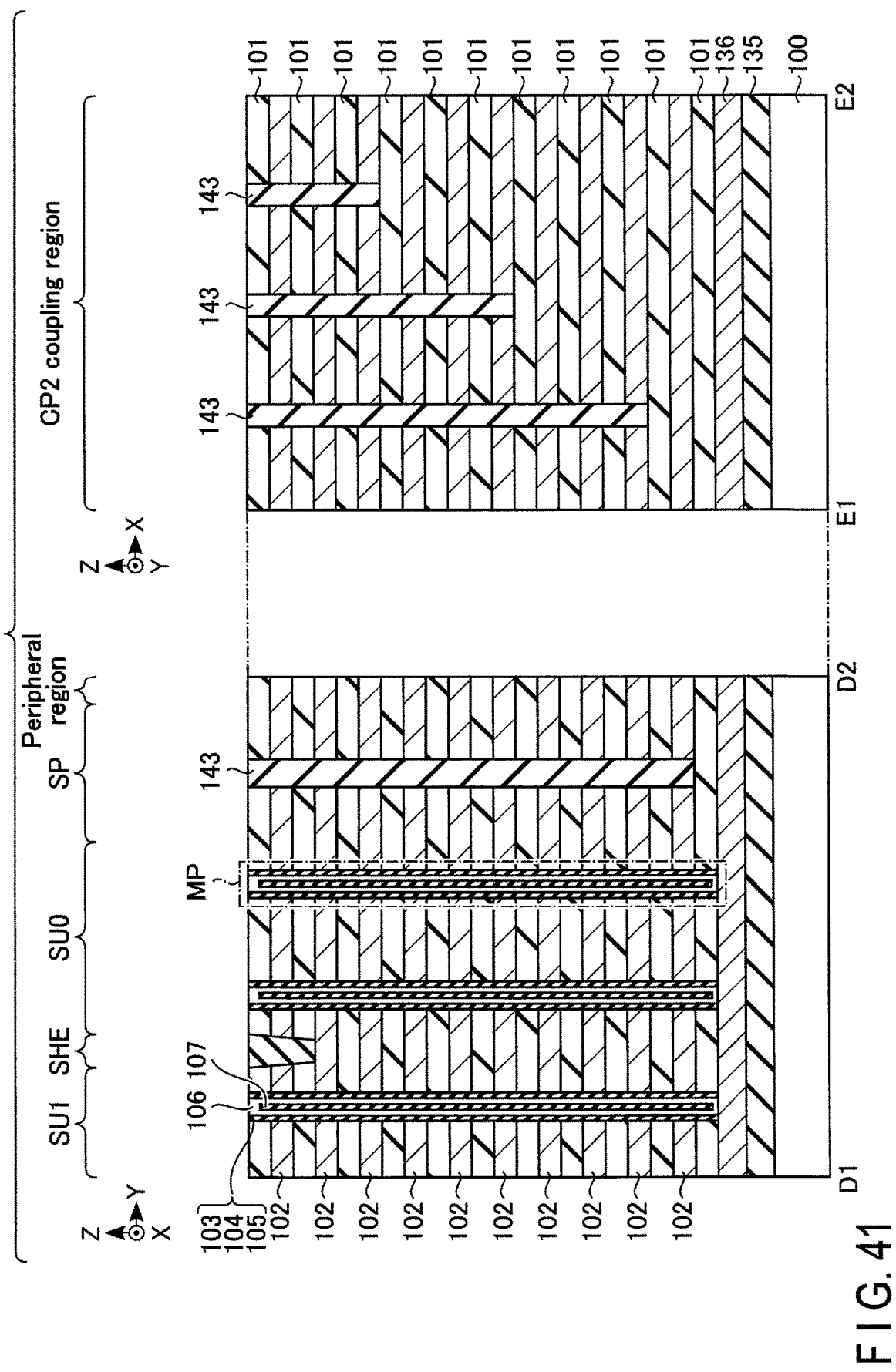

As shown in FIG. 41, after the resist 142 is removed, etching is performed in such a manner that bottom portions of the holes HL2 reach the interconnect layer 136. Subsequently, a block insulating film 103, a charge storage layer 104, a tunnel insulating film 105, a semiconductor layer 106, and a core layer 107 are formed in each hole HL2, and thereby memory pillars MP are formed.

Figure 42:
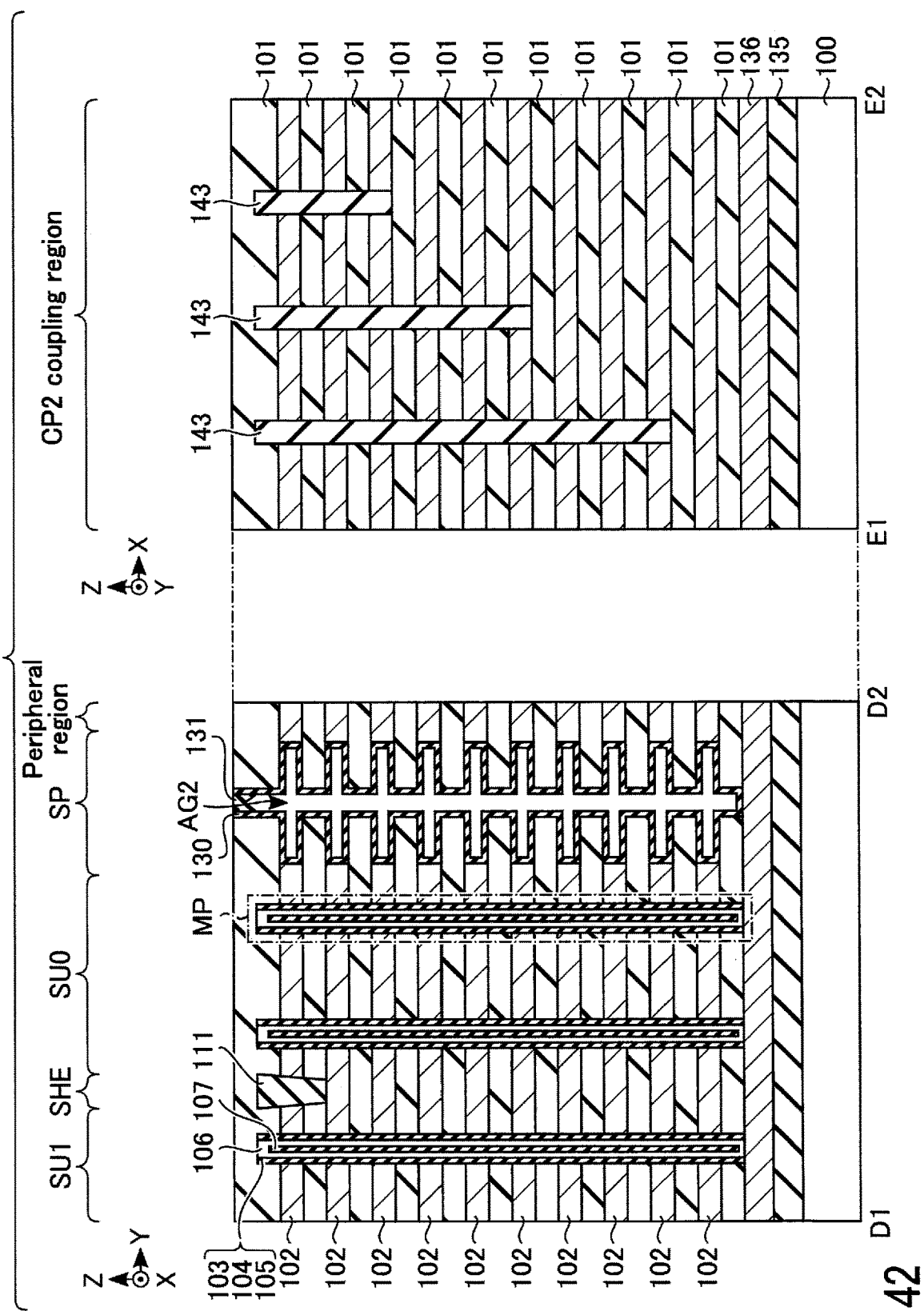

As shown in FIG. 42, an insulating layer 101 is formed so as to cover top surfaces of the memory pillars MP, the insulating layer 111, and the sacrificial layers 143. Thereafter, the insulating layer 101 on the sacrificial layer 143 corresponding to the hole HL1 in the separation region SP is removed, and then the sacrificial layer 143 in the hole HL1 is removed by, for example, wet etching. Thereby, holes HL1 are formed.

Subsequently, bottom portions of the holes HL1 are etched so as to reach the interconnect layer 136. Thereafter, air gaps AG2 are formed in pillar portions HB and protruding portions TS, in a procedure similar to that of the third embodiment described with reference to FIGS. 27 to 29.

Figure 43:
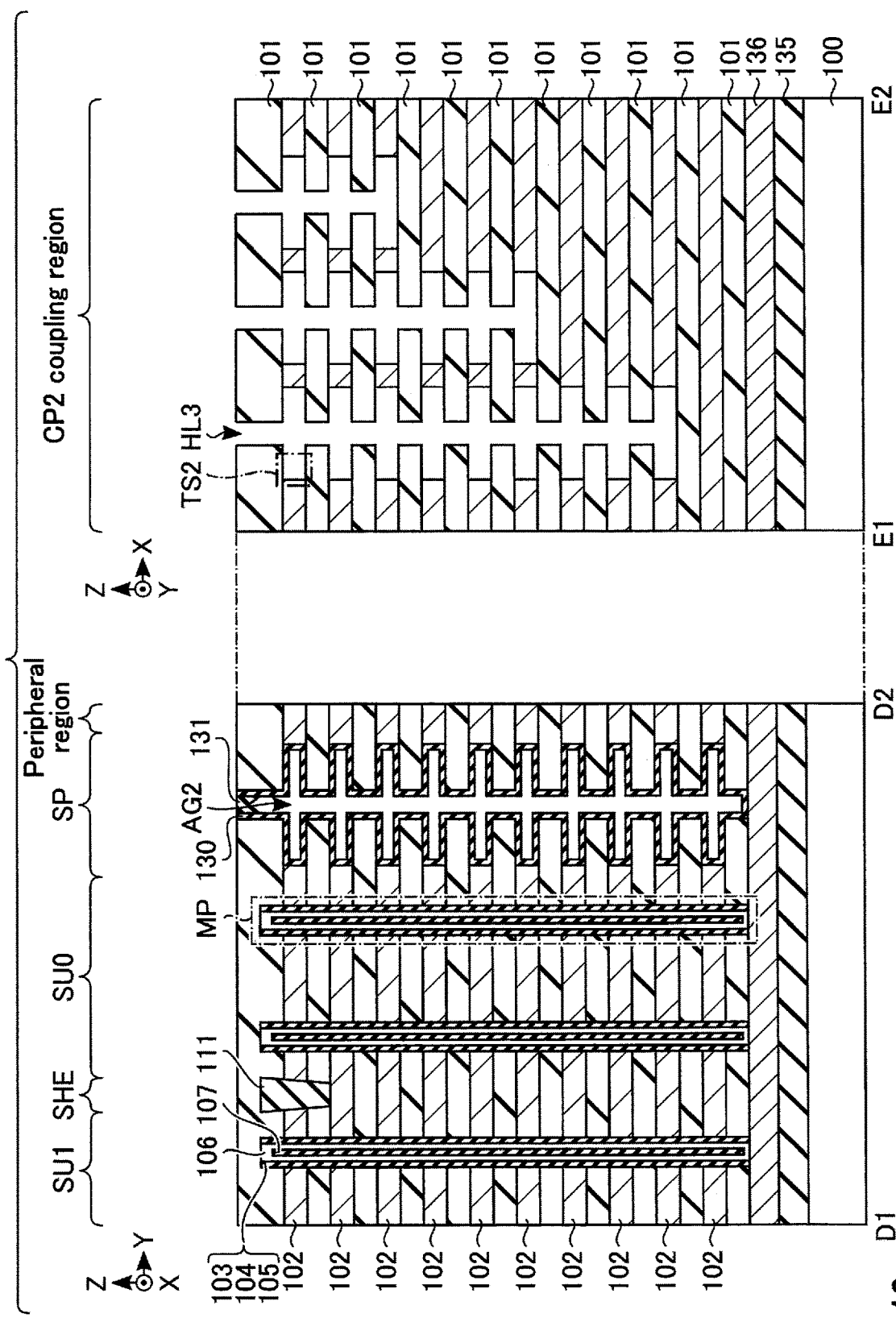

As shown in FIG. 43, the insulating layer 101 on the sacrificial layers 143 corresponding to the holes HL3 in the CP2 coupling region is removed, and then the sacrificial layers 143 in the holes HL3 are removed by, for example, wet etching. Thereby, the holes HL3 are formed. Thereafter, the interconnect layer 102 is partially removed from a side surface of the hole HL3 by, for example, wet etching, thereby forming portions corresponding to the protruding portions TS2. At this time, the amount of etching is adjusted in such a manner that protruding portions TS2 provided outside adjacent holes HL3 are not linked to one another.

Figure 44:
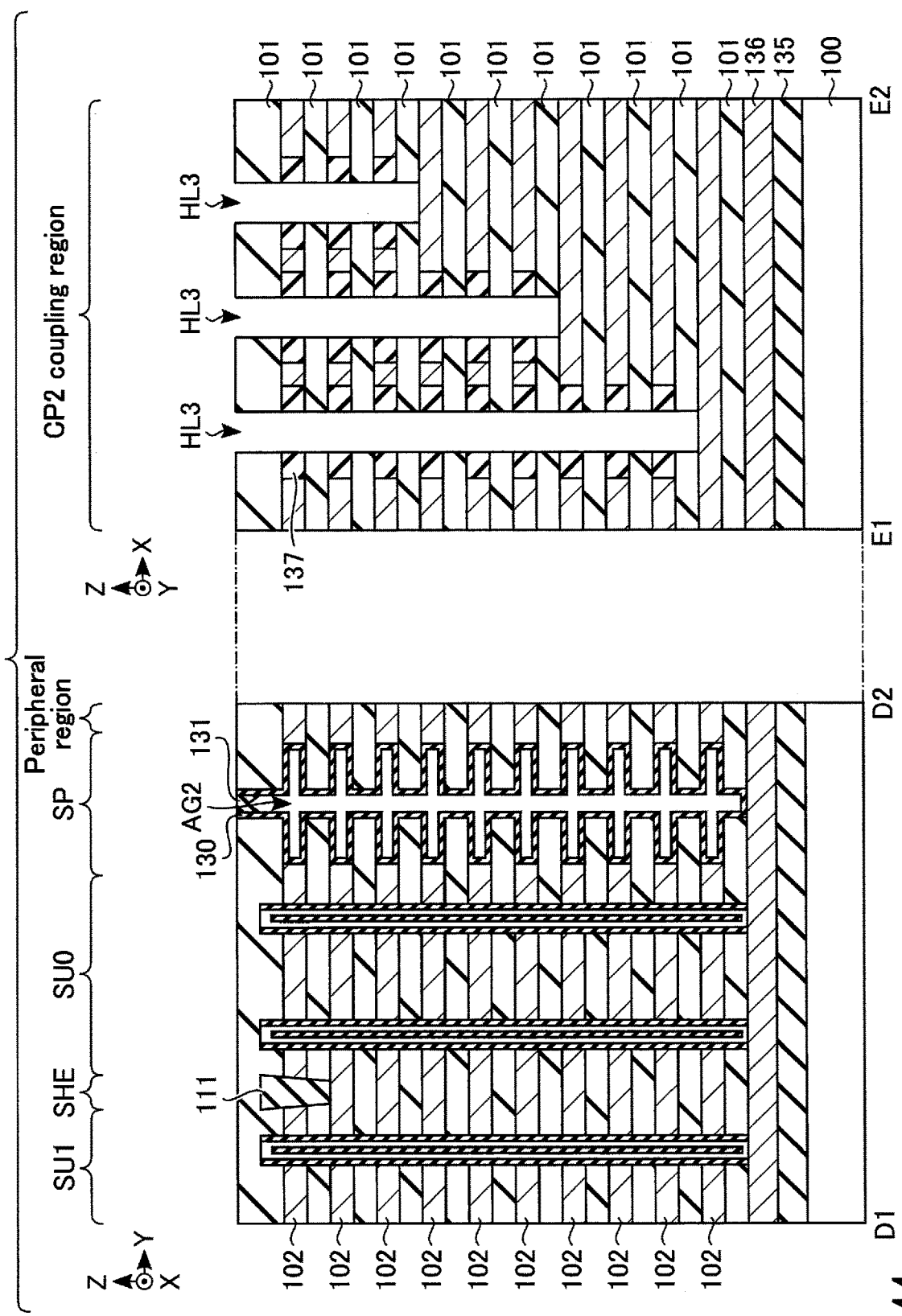

As shown in FIG. 44, an insulating layer 137 with a thickness that allows the protruding portions TS2 to be filled in but does not allow the holes HL3 to be filled in is formed. Subsequently, the insulating layer 137 on a side surface of the hole HL3 and the insulating layer 101 on a bottom surface of the hole HL3 are removed by wet etching using, for example, a solution containing hydrogen fluoride (HF), CDE, etc. Thereby, the interconnect layers 102 are exposed at the bottom portions of the holes HL3. Since wet etching, CDE, etc. are isotropic etching, the diameter of the opening of the holes HL3 increases, compared to that of the holes HL3 before wet etching, CDE, etc. is performed.

Figure 45:
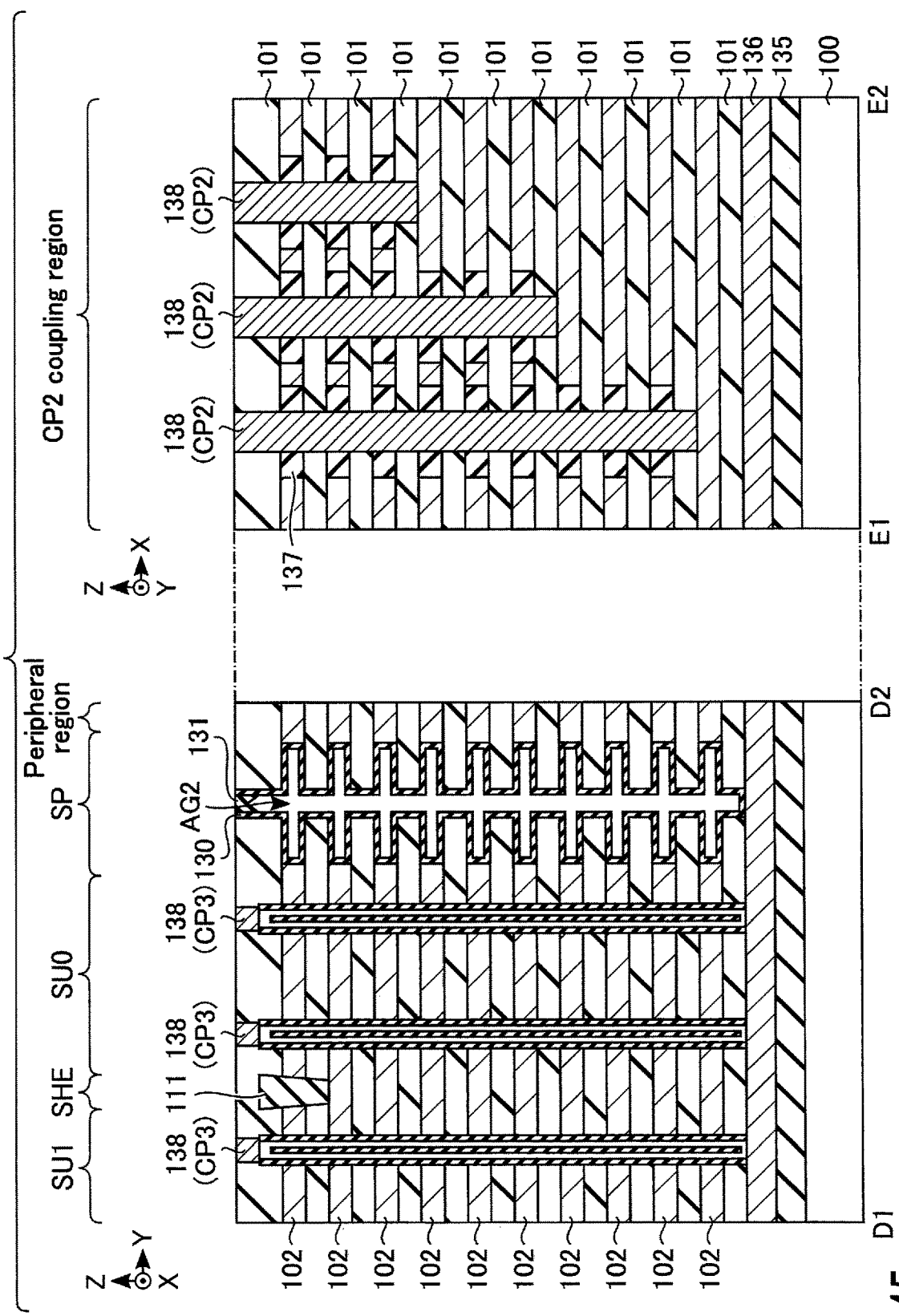

As shown in FIG. 45, holes corresponding to the contact plugs CP3 are formed on the memory pillars MP. Subsequently, the holes HL3 and the holes on the memory pillars MP are filled with conductive layers 138, and thereby contact plugs CP2 and CP3 are formed. The conductive layers 138 are configured of a conductive material using, for example, an n-type semiconductor, a p-type semiconductor, or a metal material.

5.5 Effects of Present Embodiment

According to the configuration of the present embodiment, it is possible to obtain effects similar to those of the first to third embodiments.

Moreover, according to the configuration of the present embodiment, it is possible to suppress an increase in the chip area.

For example, when terraces are formed at end portions of the interconnect layers 102 in the X direction, steps that do not function as devices are formed at end portions of the interconnect layers 102 at which terraces are not formed in the Y direction. This results in an increase in the size of the memory cell array 11.

There is also a case where, for example, slits are formed to surround the interconnect layers 102, thereby separating the interconnect layers 102. In this case, the pattern may be bent at the time of etching the slits, or the slits may have different depths at intersections of the slits.

On the other hand, according to the configuration of the present embodiment, it is possible to separate the memory cell array 11 from the peripheral region by providing the separation region SP. Since unnecessary steps are not formed, it is possible to suppress an increase in the area of the memory cell array 11, namely, suppress an increase in the chip area. Moreover, in the separation region SP, protruding portions TS provided outside the pillar portions HB are linked so as to separate the interconnect layers 102, and it is thus possible to suppress deformation in pattern and variations in depth in the separation region SP.

Furthermore, according to the configuration of the present embodiment, it is possible to provide protruding portions TS2 between the contact plug CP2 and the interconnect layers 102. It is thereby possible to form contact plugs CP2 without forming terraces. It is thereby possible to suppress an increase in area of the CP2 coupling region. In addition, since holes corresponding to the memory pillars MP, the pillar portions HB, and the contact plugs CP2 can be simultaneously etched, it is possible to suppress an increase in the manufacturing cost.

6. Sixth Embodiment

Next, a sixth embodiment will be described. In the sixth embodiment, a case will be described where local interconnects are formed by coupling upper portions of a plurality of contact plugs CP1 provided in the separation region SP. Hereinafter, the description will focus mainly on matters different from those of the first to fifth embodiments.

6.1 Planar Configuration of Memory Cell Array

First, an example planar configuration of a memory cell array 11 will be described with reference to FIGS. 46 to 47.

Figure 46:
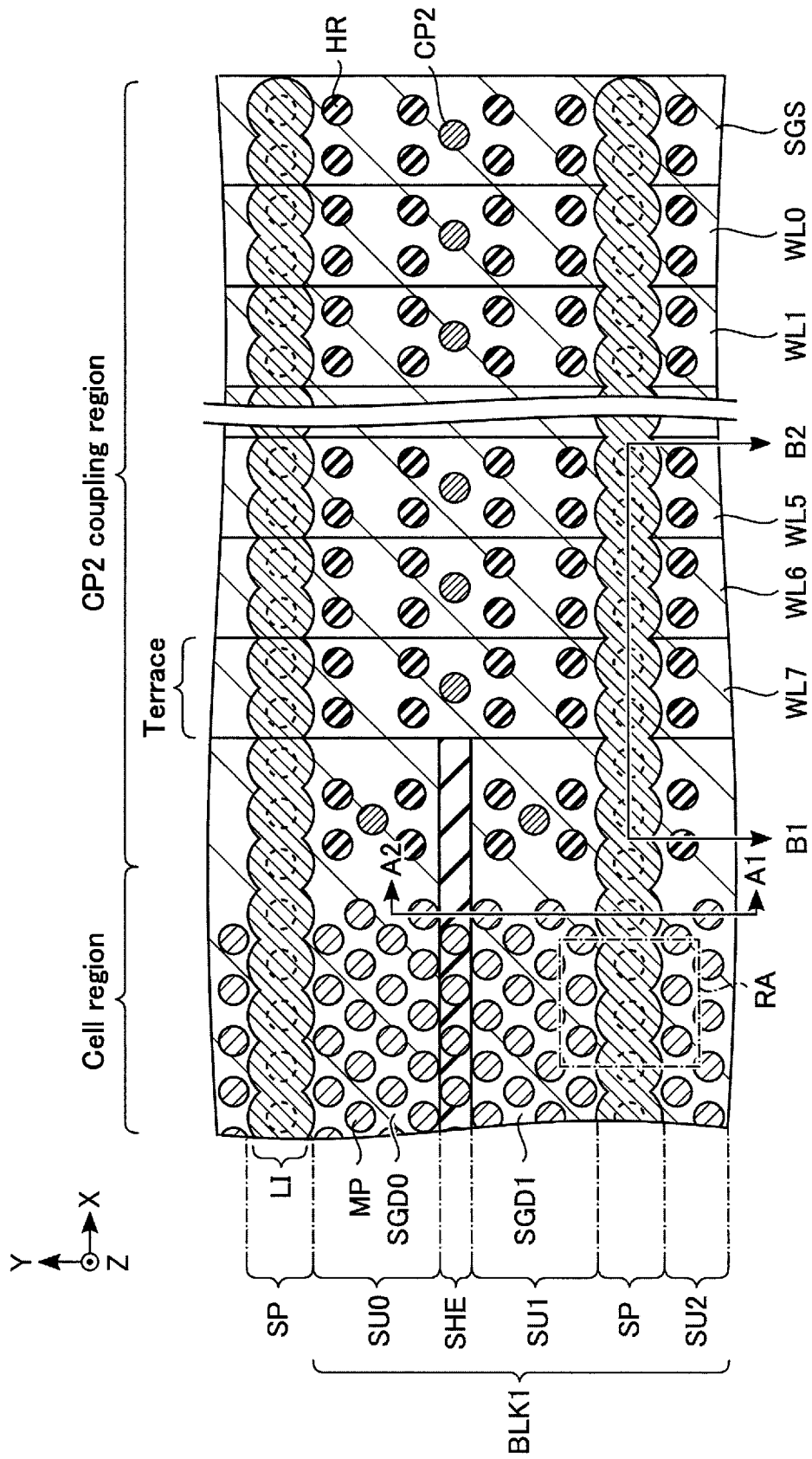
FIG. 46 is a plan view of a memory cell array included in a semiconductor memory device according to a sixth embodiment.

FIG. 46 is a plan view of string units SU0 and SU1 in a block BLK1. In the example of FIG. 46, interlayer insulating films are omitted. FIG. 47 is an enlarged view of a region RA in FIG. 46.

As shown in FIG. 46, in the separation region SP, contact plugs CP1 are arranged in a single line along the X direction. Circular coupling portions, for example, are provided on the contact plugs CP1. Coupling portions on the contact plugs CP1 that are adjacent to each other in the X direction are linked to each other, and a local interconnect LI that extends in the X direction is provided. The other configurations are similar to that of the first embodiment described with reference to FIG. 3.

In the example of FIG. 46, a case is shown where the contact plugs CP1 are arranged in a single line along the X direction; however, the arrangement of the contact plugs CP1 may be freely designed. The contact plugs CP1 may be provided, for example, in a two-row staggered arrangement along the X direction, as shown in FIG. 3 of the first embodiment. It suffices if the coupling portions on the contact plugs CP1 are linked to one another in the X direction so that a local interconnect LI is provided.

Next, a planar configuration of the local interconnect LI and the separation region SP will be described in detail. In the example of FIG. 47, a top surface of the local interconnect LI (hereinafter also referred to as an "LI plane"), a WL7 plane, and a WL6-WL7 plane in the region RA are shown. In the present embodiment, the insulating layer 110 described in the first embodiment is not provided, similarly to, for example, the third embodiment described with reference to FIG. 20.

Figure 47:
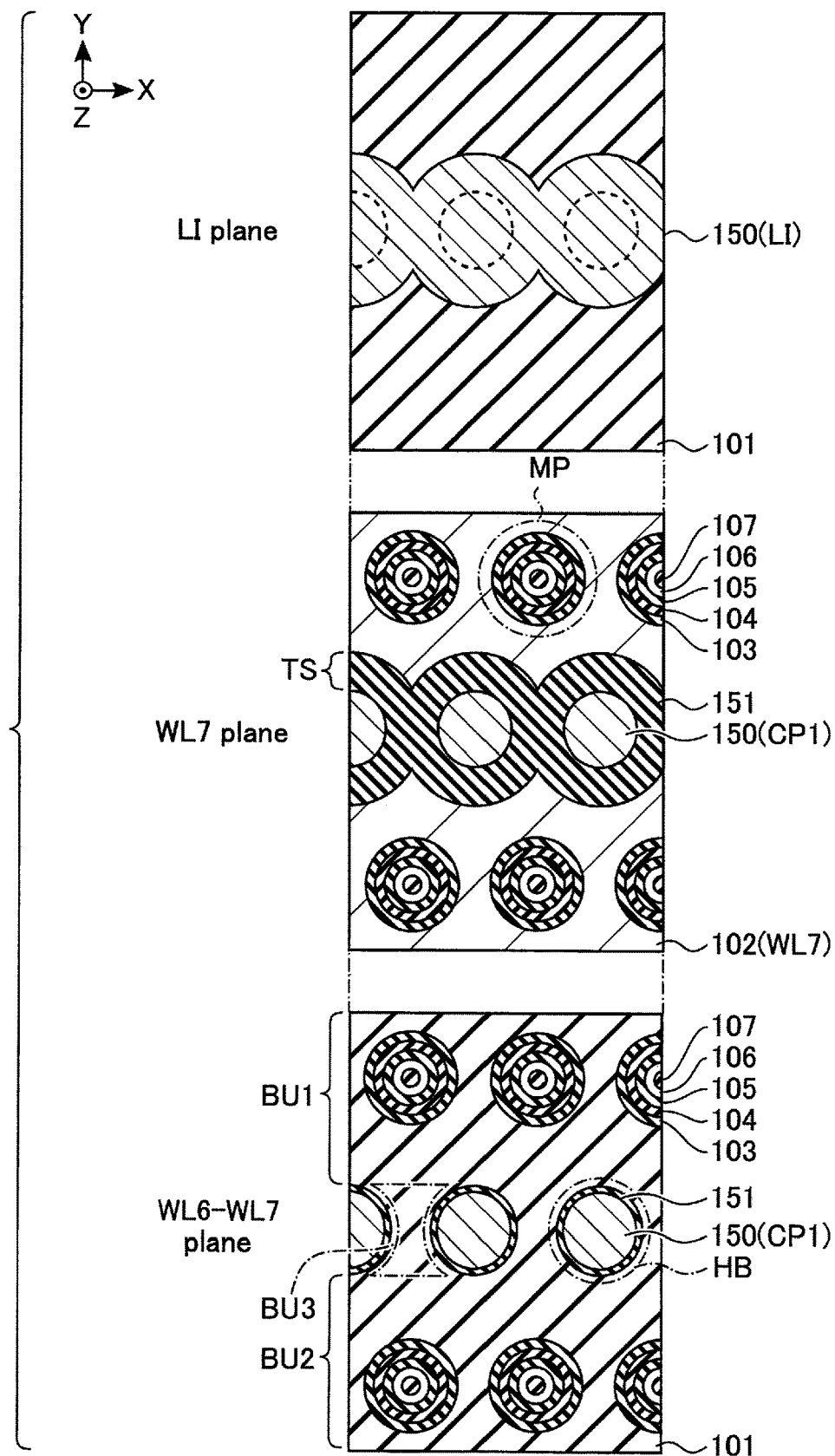
FIG. 47 is an enlarged view of a region RA shown in FIG. 46.

As shown in FIG. 47, circular coupling portions are provided on the respective contact plugs CP1 in the LI plane. The coupling portions are linked to one another in the X direction, and thereby a local interconnect LI is formed. A top surface of the local interconnect LI is above upper surfaces of the memory pillars MP in the Z direction. Accordingly, the top surfaces of the memory pillars MP are not shown in the LI plane.

Let us assume, for example, that a distance between central axes of contact plugs CP1 that are adjacent to each other in the X direction is L1, and a distance from a central axis of a contact plug CP1 (coupling portion) to an outer periphery of the coupling portion in the LI plane is L4. In this case, the distances L1 and L4 satisfy the relation of $((L1)/2)<(L4)$. Let us also assume that a distance between a central axis of a contact plug CP1 and a memory pillar MP adjacent thereto is L5. In this case, the distances L4 and L5 satisfy the relation of $(L4)<(L5)$.

Similarly to the first embodiment described with reference to FIG. 4, insulating layers 151 corresponding to protruding portions TS are provided outside the contact plugs CP1 in the WL7 plane. The insulating layers 151 (protruding portions TS) provided outside the respective contact plugs CP1 are linked to one another in the X direction.

On the other hand, the insulating layers 151 provided outside the contact plugs CP1 in the WL6-WL7 plane have a small diameter, compared to that in the WL7 plane, and are not linked to one another, similarly to the first embodiment described with reference to FIG. 4. Accordingly, the insulating layer 101 that is provided between the word line WL6 and the word line WL7 is not separated in the Y direction. That is, in the separation region SP, the insulating layer 101 is provided between adjacent contact plugs CP1. In other words, the insulating layers 101 include a stack portion BU1 which is provided on one side of the separation region. SP in which the insulating layers 101 are stacked so as to alternate with the interconnect layers 102, a stack portion BU2 which is provided on another side of the separation region SP and in which the insulating layers 101 are stacked so as to alternate with the interconnect layers 102, and a plurality of bridge portions BU3 that link the portions BU1 and BU2 in the separation region SP.

6.2 Cross-sectional Configuration of Memory Cell Array

Figure 48:
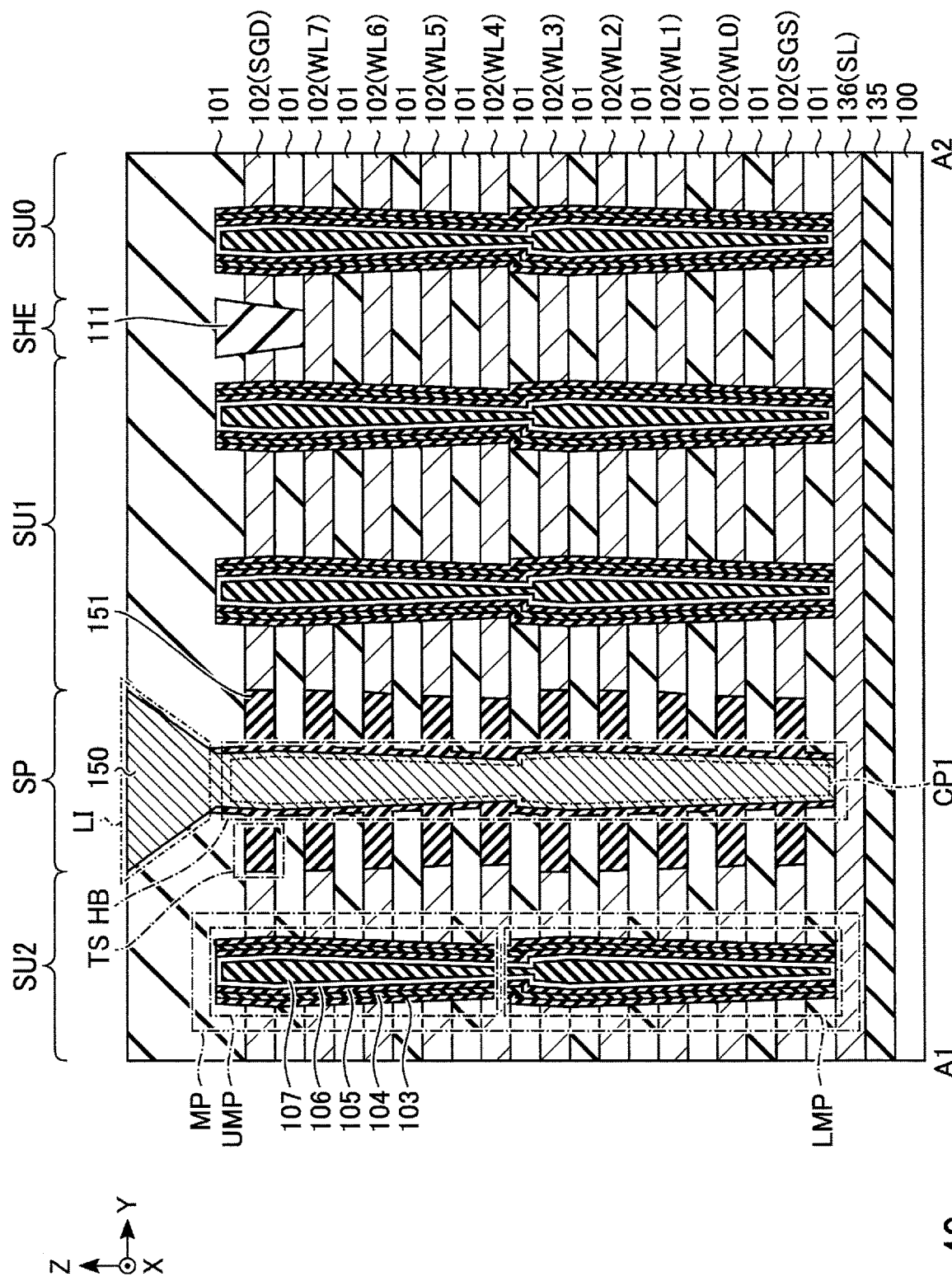
FIG. 48 is a cross-sectional view taken along line A1-A2 of FIG. 46.
Figure 49:
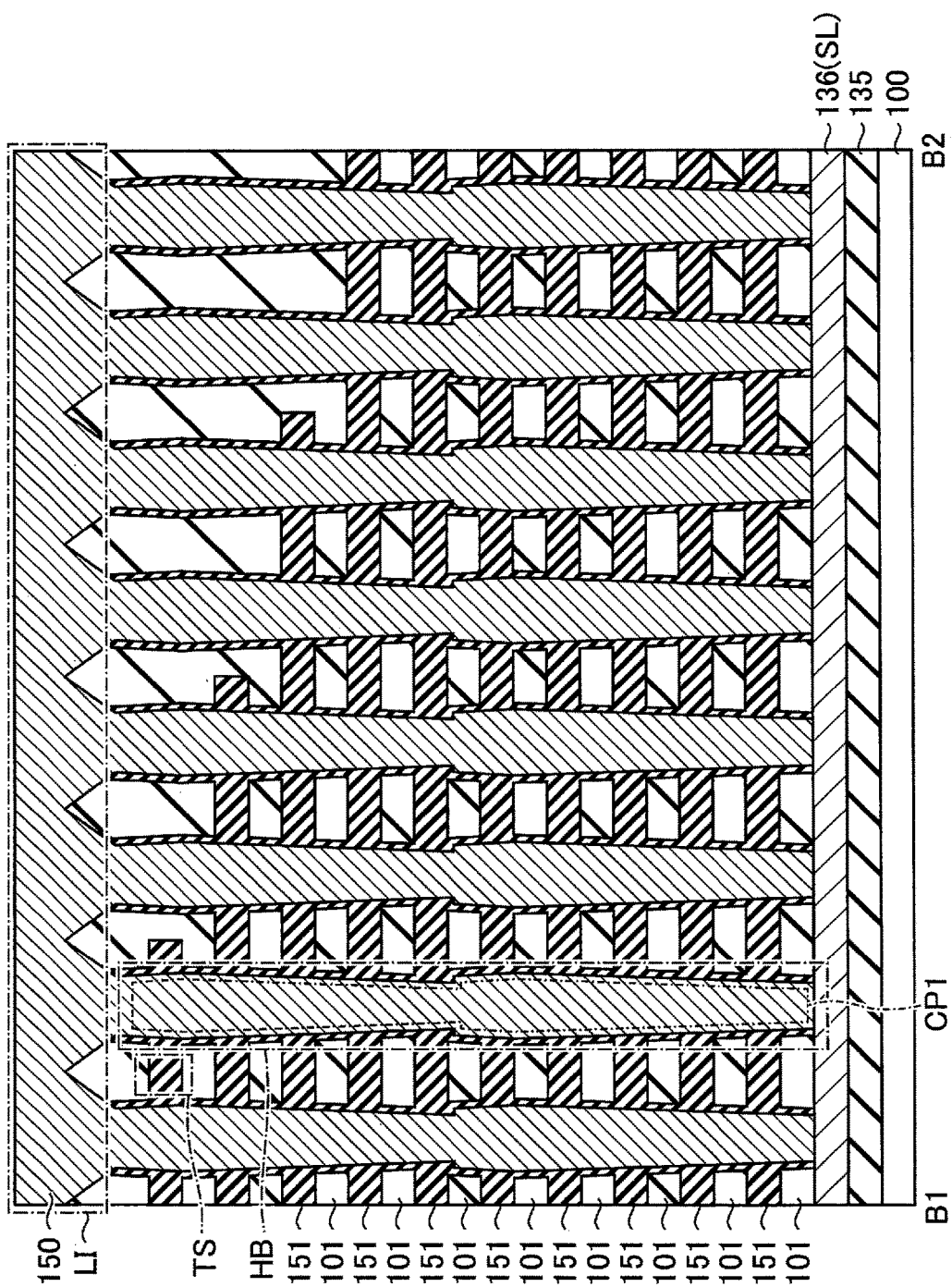
FIG. 49 is a cross-sectional view taken along line B1-B2 of FIG. 46.

Next, a cross-sectional configuration of the memory cell array 11 will be described with reference to FIGS. 48 and 49. FIG. 48 is a cross-sectional view taken along line A1-A2 of FIG. 46. FIG. 49 is a cross-sectional view taken along line B1-B2 of FIG. 46. In the example of FIGS. 48 and 49, contact plugs CP3 are omitted, in order to simplify the description.

As shown in FIG. 48, an insulating layer 135 is provided on a semiconductor substrate 100, similarly to the first example of the second embodiment described with reference to FIG. 17. An interconnect layer 136 is provided on the insulating layer 135. On the interconnect layer 136, eleven insulating layers 101 and ten interconnect layers 102, for example, are stacked in an alternating manner.

In the present embodiment, contact plugs CP1 that extend in the Z direction are formed in pillar portions HB, similarly to the first embodiment. A conical coupling portion is provided on each contact plug CP1 with its vertex facing downward (with increasing diameter toward the opening). Each contact plug CP1 and the corresponding coupling portion are filled with a conductive layer 150. A void may be formed in the conductive layer 150 in the contact plug CP1. The conductive layer 150 is formed of a conductive material, using an n-type semiconductor, a p-type semiconductor, a metal material, etc. In the description that follows, a case will be described where the conductive layer 150 is formed using a stacked structure of TiN and W.

In the pillar portion HB, an insulating layer 151 is provided to cover a side surface of the contact plug CP1 (conductive layer 150). That is, the pillar portion HB is formed of the contact plug CP1 and the insulating layer 151 that is formed on a side surface of the contact plug CP1. The insulating layer 151 is formed using, for example, $SiO_2$. A bottom surface of the contact plug CP1 is in contact with an interconnect layer 136.

At the same layers as the interconnect layers 102, protruding portions TS that protrude in the XY plane are provided on side surfaces of the respective pillar portions HB. The protruding portion TS is filled with an insulating layer 151.

The configuration of memory pillars MP, interconnect layers 102, etc. is similar to that of the third embodiment described with reference to FIG. 20. That is, in the present embodiment, the insulating layer 110 described in the first embodiment is not provided.

Next, a cross-sectional configuration of the separation region SP will be described.

As shown in FIG. 49, pillar portions HB, namely, contact plugs CP1 (conductive layers 150) are, for example, arranged at approximately equal intervals in the X direction. At the same layers as the interconnect layers 102, portions between the pillar portions HB (contact plugs CP1 are filled with insulating layers 151 (protruding portions TS). That is, in the separation region SP, the interconnect layers 102 are replaced with the insulating layers 151.

Coupling portions provided on the respective contact plugs CP1 are linked to one another in the X direction, and form a local interconnect LI. In the example of FIG. 49, a bottom surface of the local interconnect LI forms a zig-zag shape in the X direction.

6.3 Method of Manufacturing Memory Cell Array

Next, an example of a method of manufacturing the memory cell array 11 will be described with reference to FIGS. 50 to 59. Each of FIGS. 50 to 59 shows a cross-section taken along line A1-A2 and a cross-section taken along line B1-B2 in the manufacturing process.

As shown in FIG. 50, after memory pillars MP are formed, an insulating layer 101 is formed so as to cover top surfaces of the memory pillars MP, an insulating layer 111, and sacrificial layers 121, similarly to the third embodiment described with reference to FIGS. 23 to 25. In the present embodiment, since interconnect layers 102 are formed by the replacement technique, eleven insulating layers 101 and ten sacrificial layers 120 are stacked in an alternating manner on an interconnect layer 136.

Figure 51:
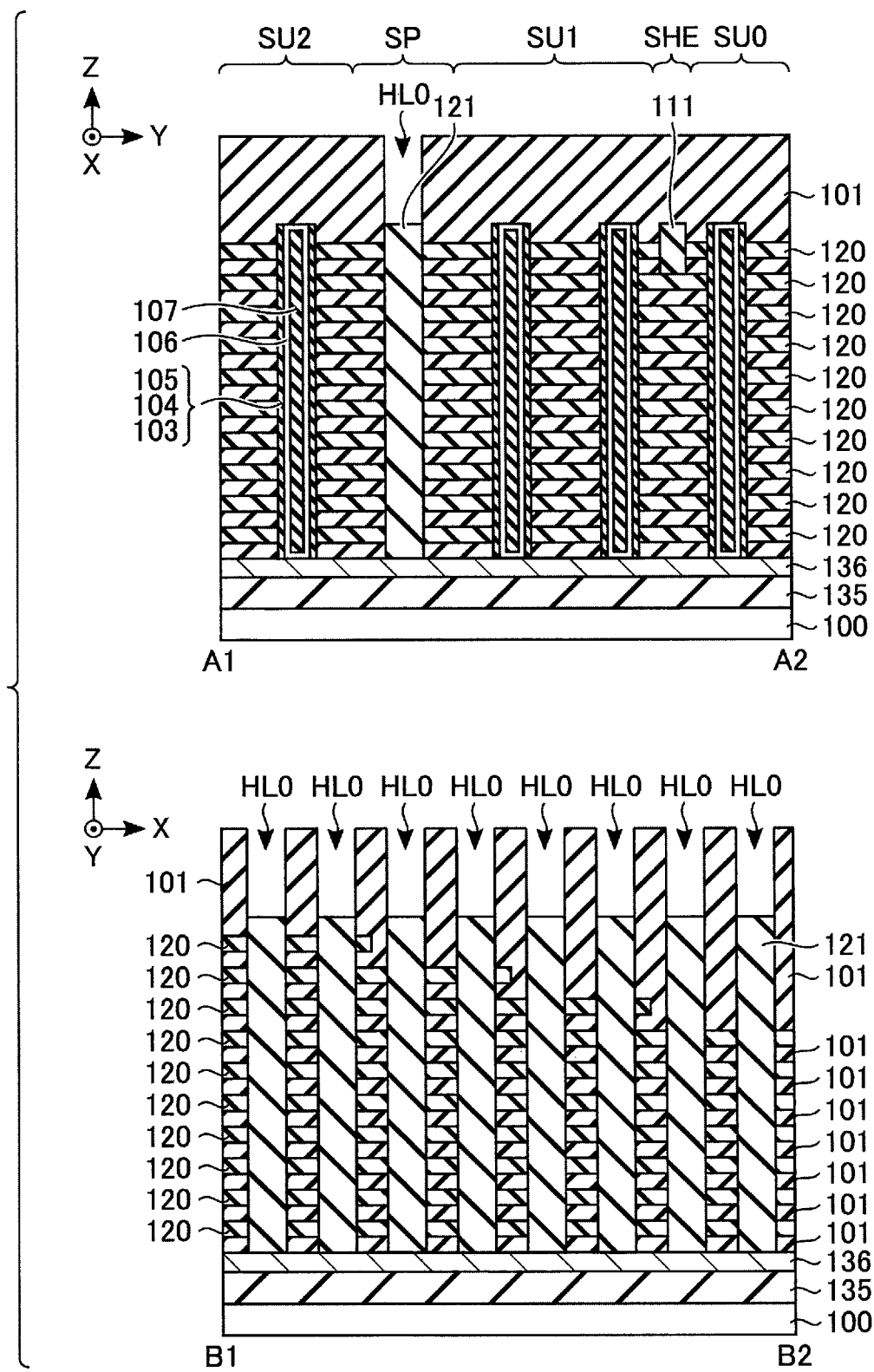

As shown in FIG. 51, the topmost insulating layer 101 is etched, thereby forming holes HL0 on sacrificial layers 121 corresponding to the respective pillar portions HB.

Figure 52:
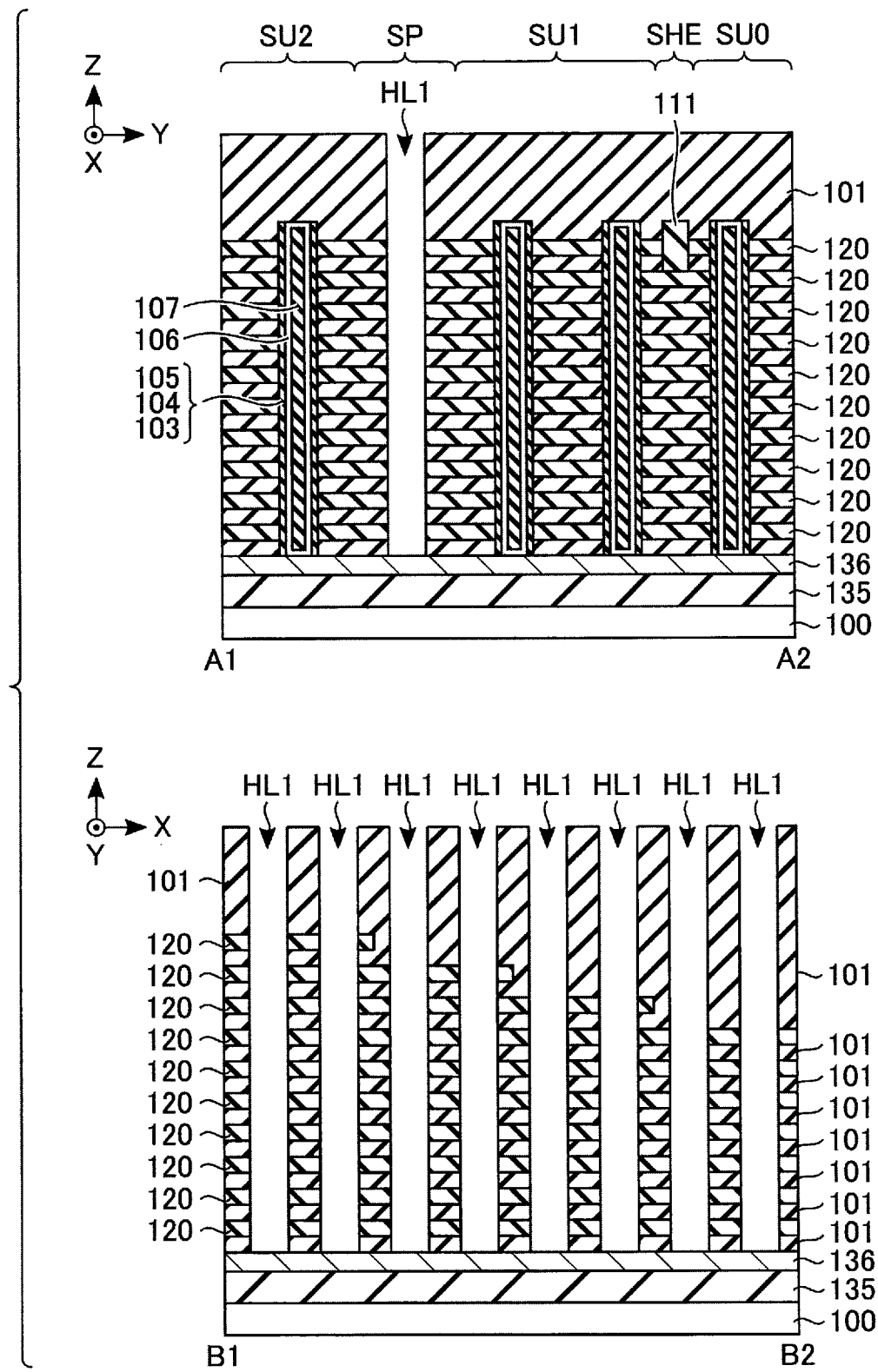

As shown in FIG. 52, the sacrificial layers 121 at bottom portions of the holes HL0 are removed by, for example, wet etching. Thereby, holes HL1 are formed.

Figure 53:
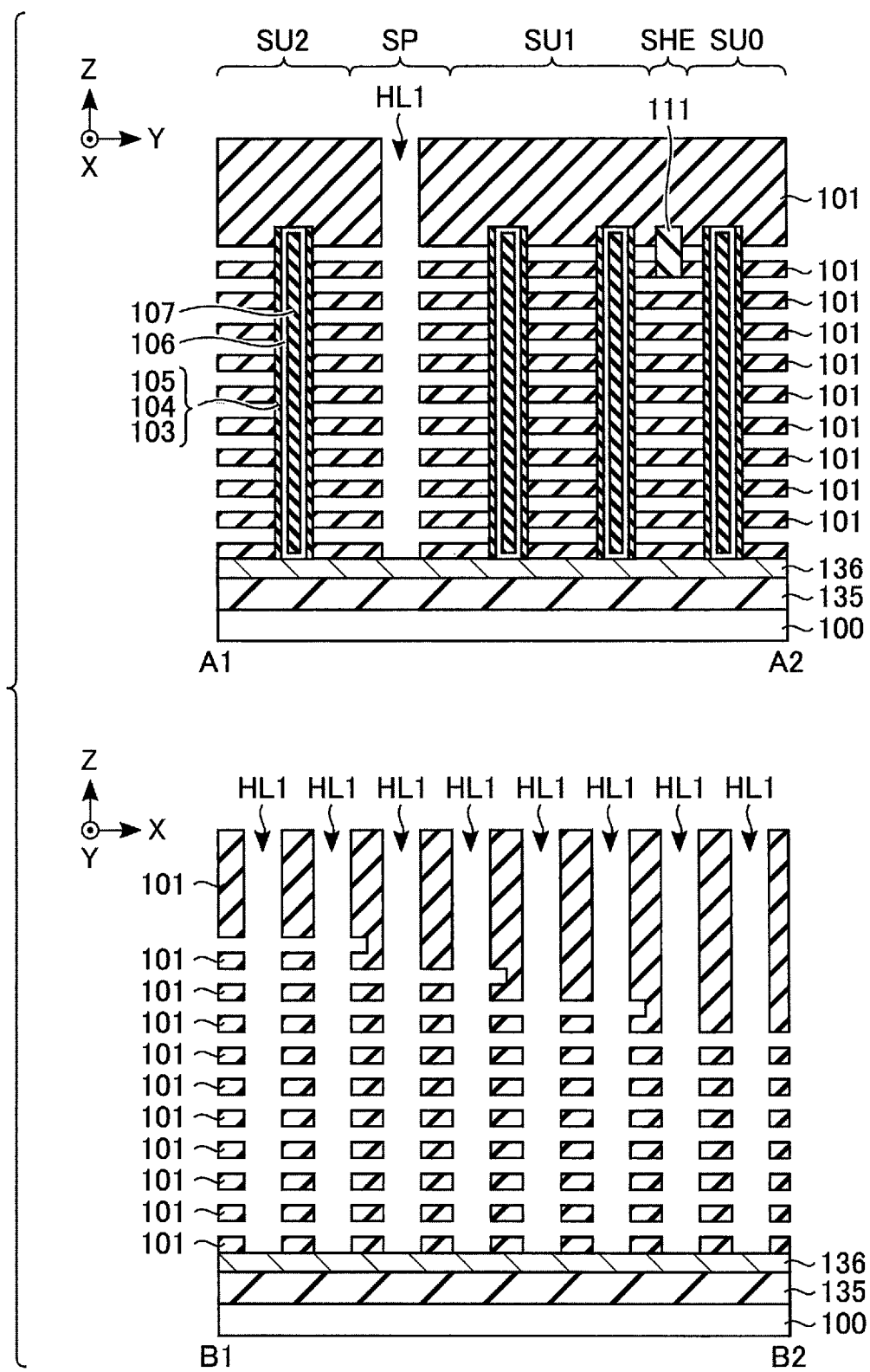

As shown in FIG. 53, the sacrificial layers 120 are removed from side surfaces of the respective holes HL1 by, for example, wet etching. Thereby, air gaps are formed between the insulating layers 101 in the Z direction.

Figure 54:
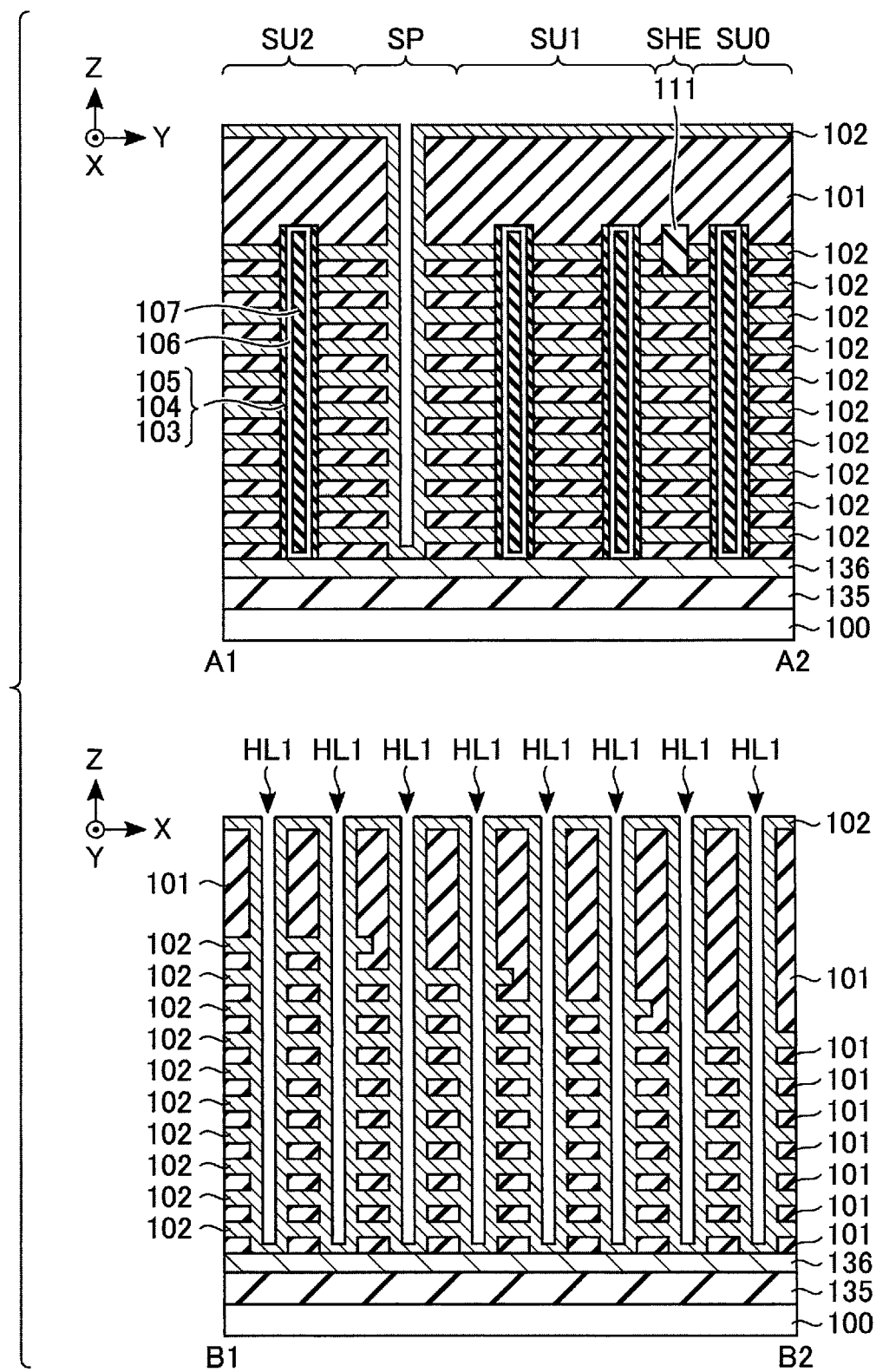

As shown in FIG. 54, an interconnect layer 102 with a thickness that allows the air gaps between the insulating layers 101 to be filled in but does not fill in the holes HL1 is formed.

Figure 55:
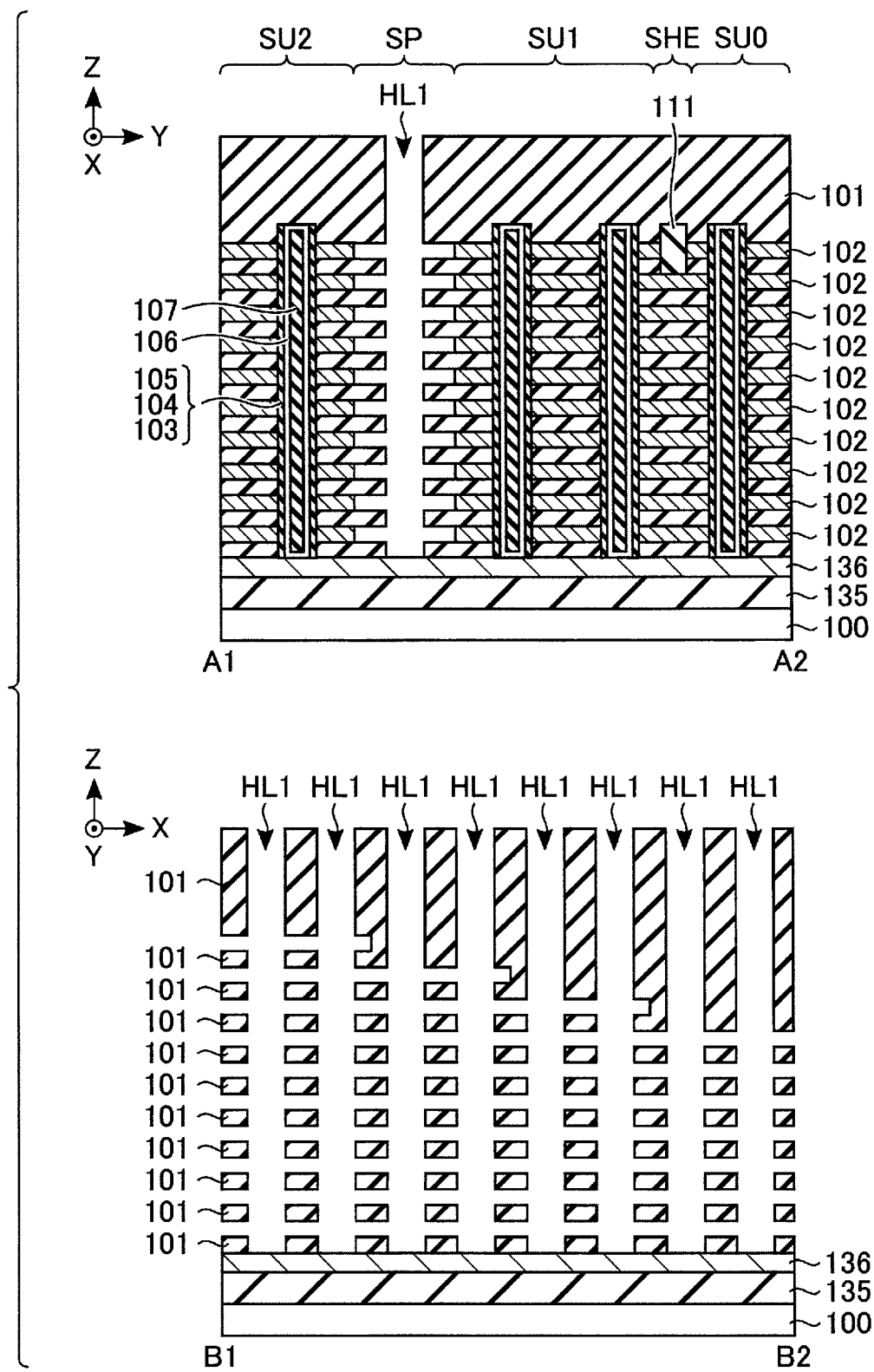

As shown in FIG. 55, the interconnect layer 102 formed on the topmost insulating layer 101 and side surfaces of the holes HL1 is removed by, for example, wet etching. At this time, the interconnect layers 102 are partially removed from the side surfaces of the holes HL1, thereby forming portions corresponding to the protruding portions TS. Thereby, the interconnect layer 102 in the separation region SP is removed.

As shown in FIG. 56, an insulating layer 151 is formed using, for example, a technique that has a good step coverage, such as CVD and ALD, thereby filling in the portions corresponding to the protruding portions TS. At this time, the insulating layer 151 is formed to have a thickness that does not allow the hole HL1 to be filled in. The insulating layer 151 may be a stacked structure of two or more layers.

As shown in FIG. 57, the insulating layer 151 formed on the topmost insulating layer 101 and a bottom surface of the hole HL1 is removed by, for example, RIE. At this time, the etching is performed in such a manner that the diameter of the opening of the hole HL1 becomes wide at its top, thereby forming a funnel-shaped hole HL1. The diameter of the opening of each hole HL1 is formed to be greater than a pitch of the holes HL1 in such a manner that the holes HL1 that are adjacent to each other in the X direction are linked to each other at their upper portions, but that the holes HL1 do not overlap adjacent memory pillars MP in the XY plane.

Figure 58:
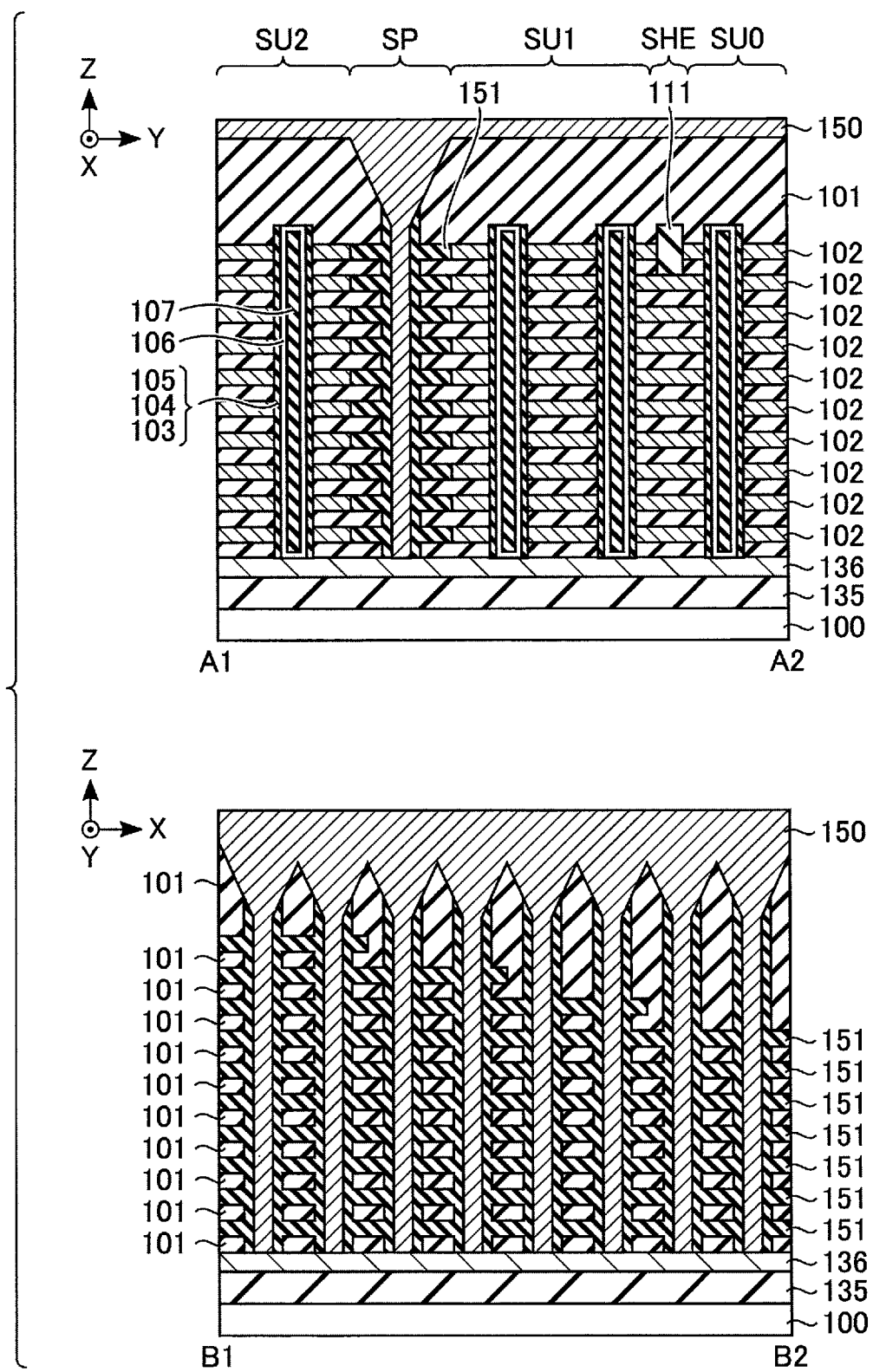

As shown in FIG. 58, the holes HL1 are filled with a conductive layer 150. The conductive layer 150 is formed of TiN and W by, for example, CVD or ALD.

Figure 59:
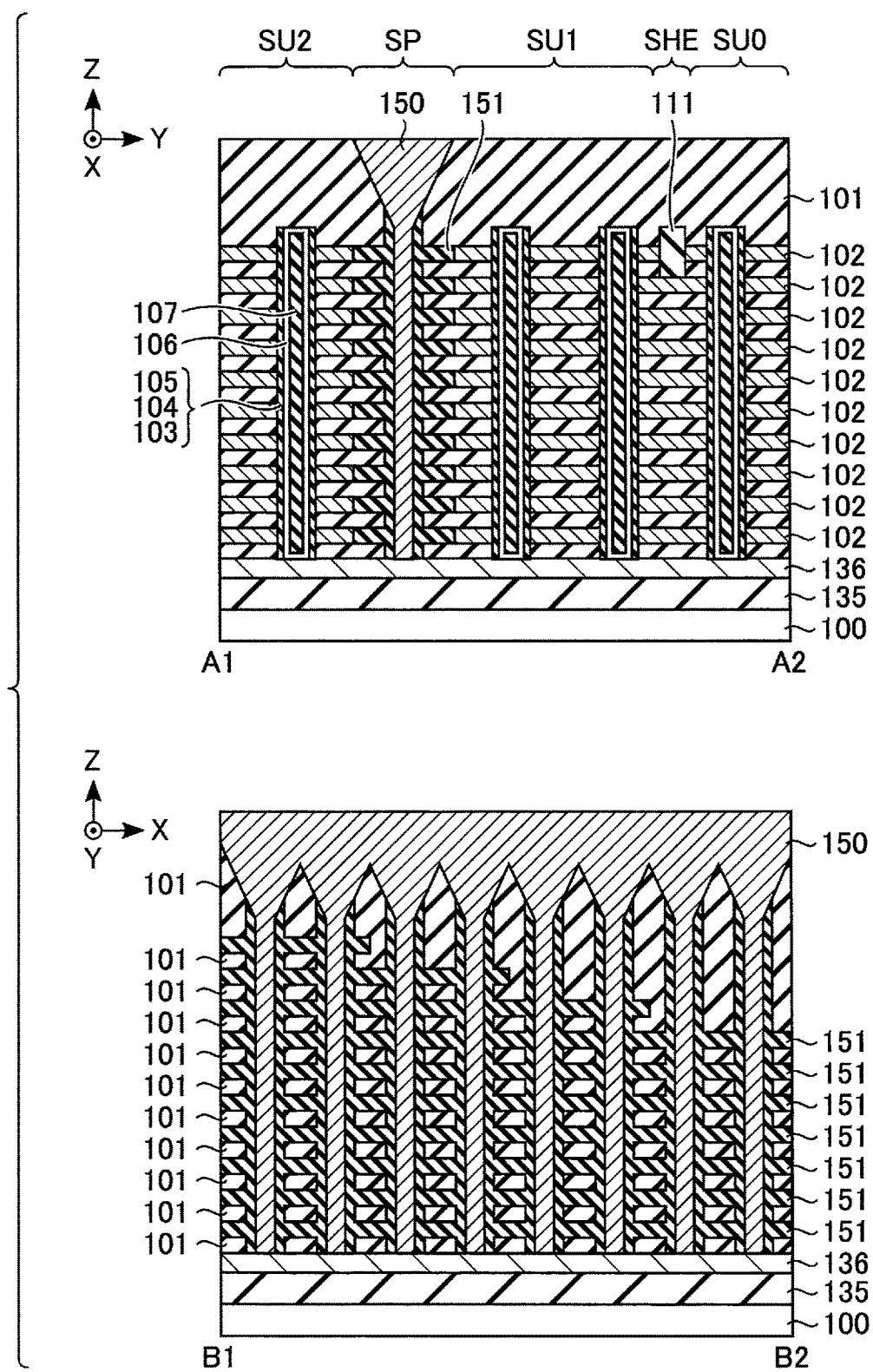

As shown in FIG. 59, the conductive layer 150 on the insulating layer 101 is removed by, for example, CMP. Thereby, the contact plugs CP1 and the local interconnect LI are formed.

6.4 Effects of Present Embodiment

According to the configuration of the present embodiment, effects similar to those of the first embodiment are achieved.

Moreover, according to the configuration of the present embodiment, it is possible to suppress a decrease in deflective strength of the semiconductor memory device. The effects will be described in detail below.

In the case where, for example, a line-shaped slit that extends in the X direction (direction in which the word lines WL extend) is formed in the separation region SP and the slit is filled with a conductive layer 150, a void extending in the X direction may be formed, causing a possible decrease in deflective resistance.

On the other hand, in the configuration of the present embodiment, since hole-shaped contact plugs CP1 are formed in the separation region SP, even when a void is formed in each contact plug CP1, the voids of the contact plugs CP1 are separated from one another in the X direction. This suppresses a decrease in deflective strength.

Furthermore, according to the configuration of the present embodiment, it is possible to simultaneously form the contact plugs CP1 and the local interconnect LI provided thereon, using the conductive layer 150. It is thereby possible to decrease the number of manufacturing steps, compared to when the contact plugs CP1 and the local interconnect LI are separately formed using different conductive layers.

7. Seventh Embodiment

Next, a seventh embodiment will be described. In the seventh embodiment, a configuration and a forming method of a local interconnect LI different from those of the sixth embodiment will be described. Hereinafter, the description will focus mainly on matters different from those of the first to sixth embodiments.

7.1 Planar Configuration of Memory Cell Array

Figure 60:
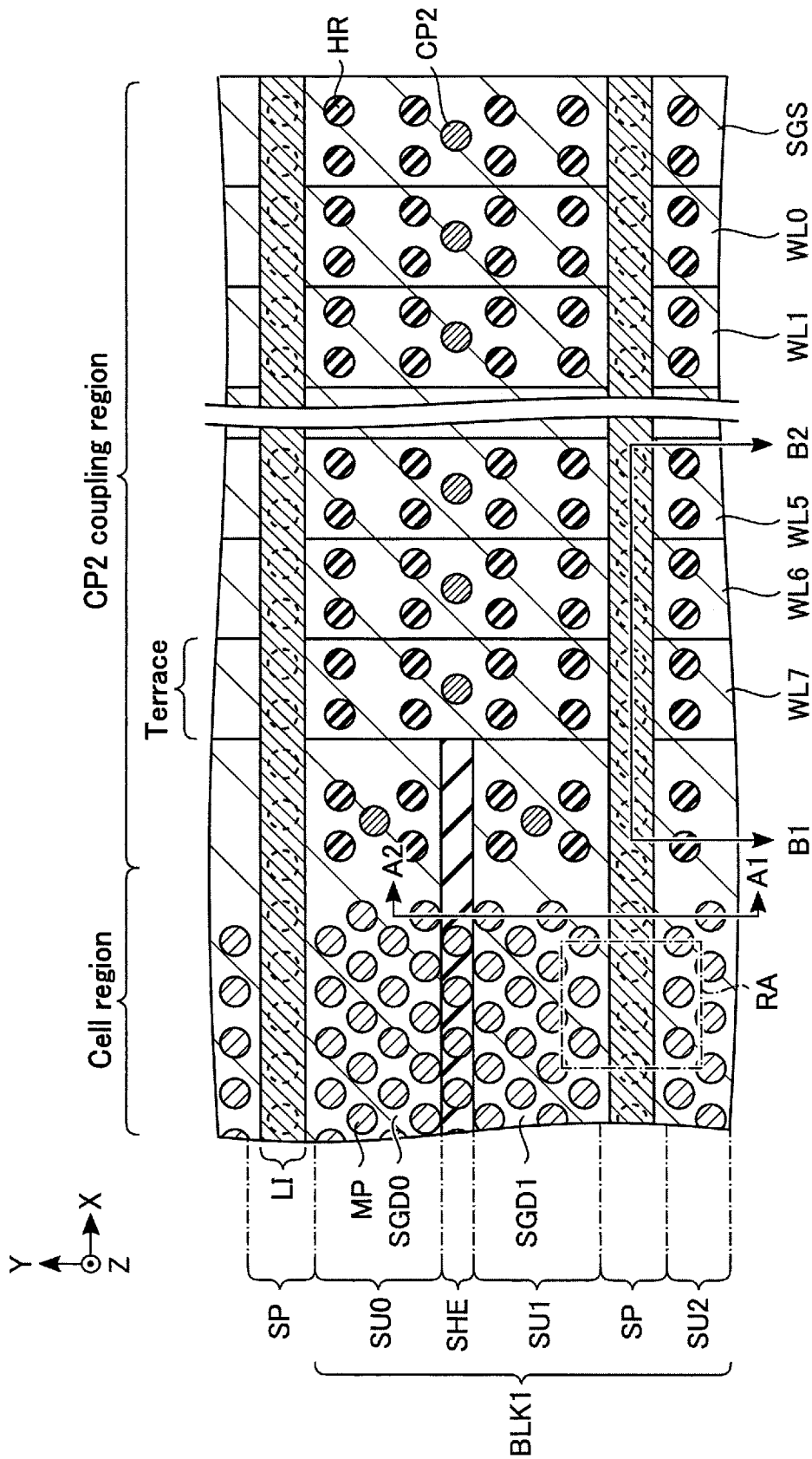
FIG. 60 is a plan view of a memory cell array included in a semiconductor memory device according to a seventh embodiment.
Figure 61:
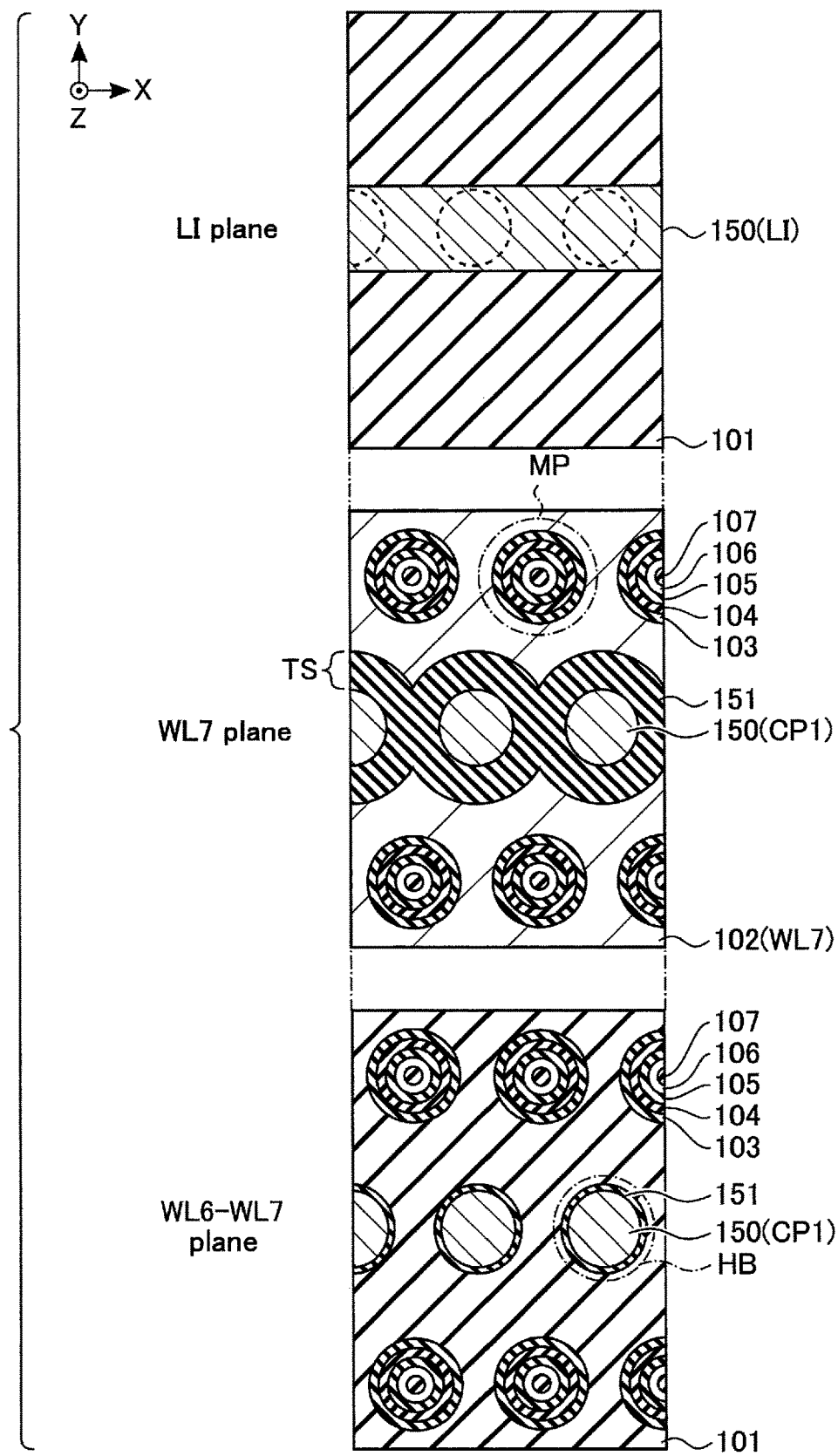
FIG. 61 is an enlarged view of a region RA shown in FIG. 60.

First, an example planar configuration of a memory cell array 11 will be described with reference to FIGS. 60 to 61. FIG. 60 is a plan view of string units SU0 and SU1 in a block BLK1. In the example of FIG. 60, interlayer insulating films are omitted. FIG. 61 is an enlarged view of a region RA in FIG. 60.

As shown in FIG. 60, a line-shaped local interconnect LI that extends in the X direction is formed in the present embodiment. The other configurations are similar to that of the sixth embodiment described with reference to FIG. 46.

Next, a planar configuration of the local interconnect LI and the separation region SP will be described in detail. In the example of FIG. 61, an LI plane, a WL7 plane, and a WL6-WL7 plane in a region RA are shown.

As shown in FIG. 61, a line-shaped coupling portion (a local interconnect LI) that extends in the X direction is provided on the contact plugs CP1 in the LI plane. A width of the local interconnect LI in the Y direction is, for example, greater than a diameter of each contact plug CP1 in the Y direction, but is not great enough to overlap the memory pillars MP in the XY plane.

7.2 Cross-Sectional Configuration of Memory Cell Array

Next, a cross-sectional configuration of the memory cell array 11 will be described with reference to FIGS. 62 and 63.

Figure 62:
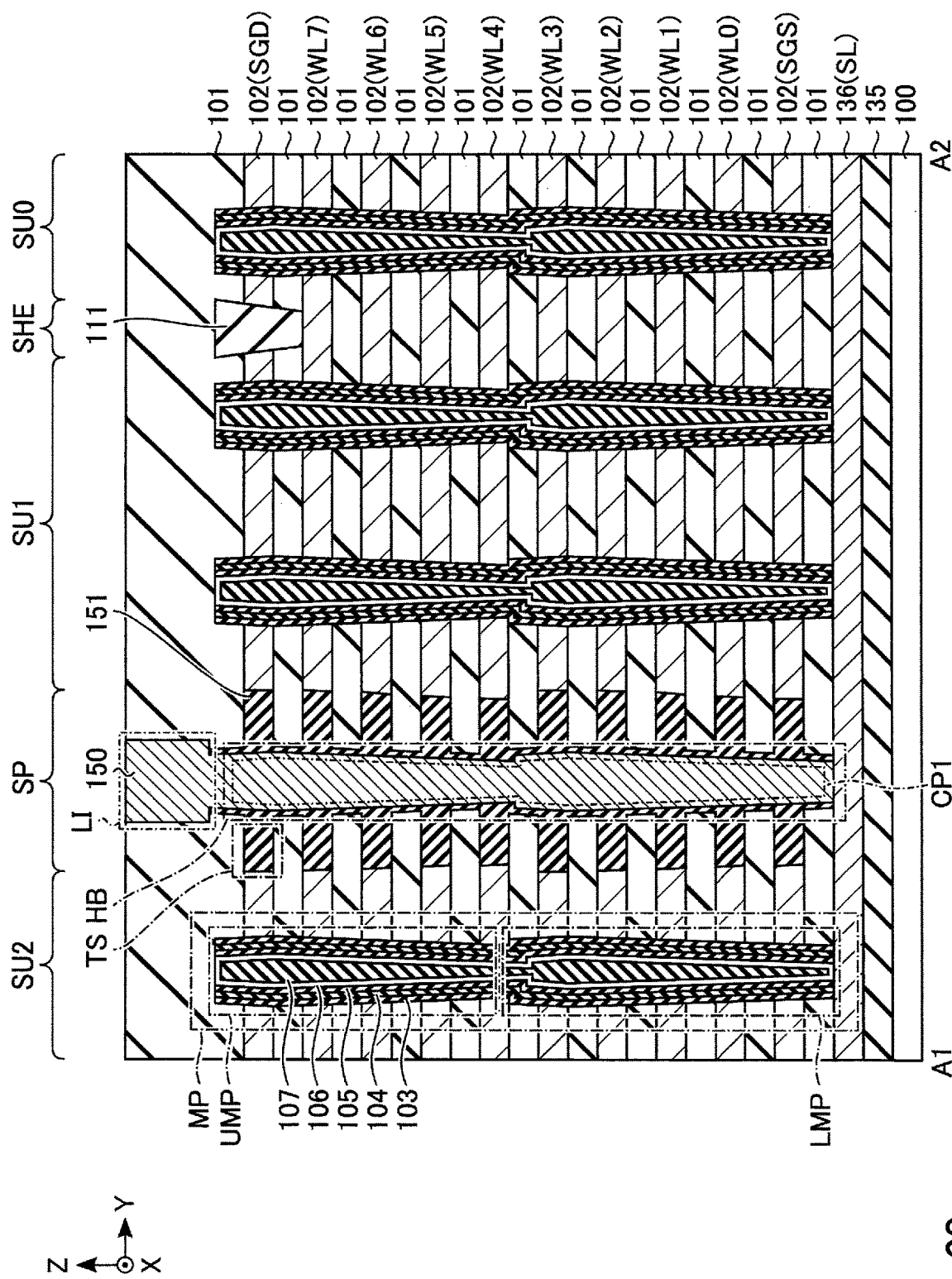
FIG. 62 is a cross-sectional view taken along line A1-A2 of FIG. 60.

FIG. 62 is a cross-sectional view taken along line A1-A2 of FIG. 60. FIG. 63 is a cross-sectional view taken along line B1-B2 of FIG. 60. In the example of FIGS. 62 and 63, contact plugs CP3 are omitted, in order to simplify the description.

Figure 63:
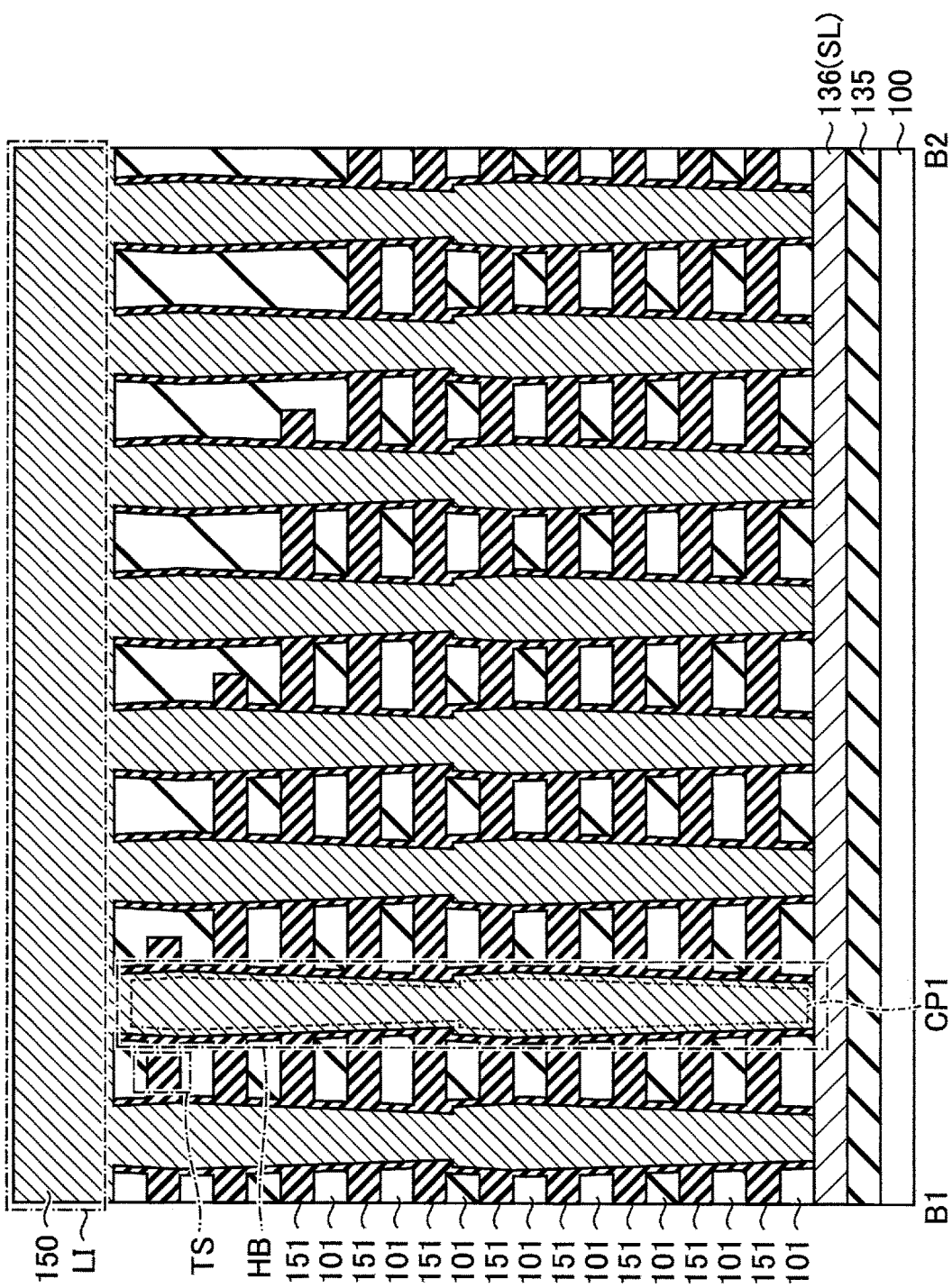
FIG. 63 is a cross-sectional view taken along line B1-B2 of FIG. 60.

As shown in FIGS. 62 and 63, in the present embodiment, a rectangular local interconnect LI that extends in the X direction is provided on the contact plugs CP1. That is, a top surface of each contact plug CP1 is in contact with a bottom surface of the local interconnect LI. Each contact plug CP1 and the corresponding coupling portion (local interconnect LI) are filled with a conductive layer 150.

7.3 Method of Manufacturing Memory Cell Array

Next, an example of a method of manufacturing the memory cell array 11 will be described with reference to FIGS. 64 to 72. Each of FIGS. 64 to 72 shows a cross-section taken along line A1-A2 and a cross-section taken along line B1-B2 in the manufacturing process.

Figure 64:
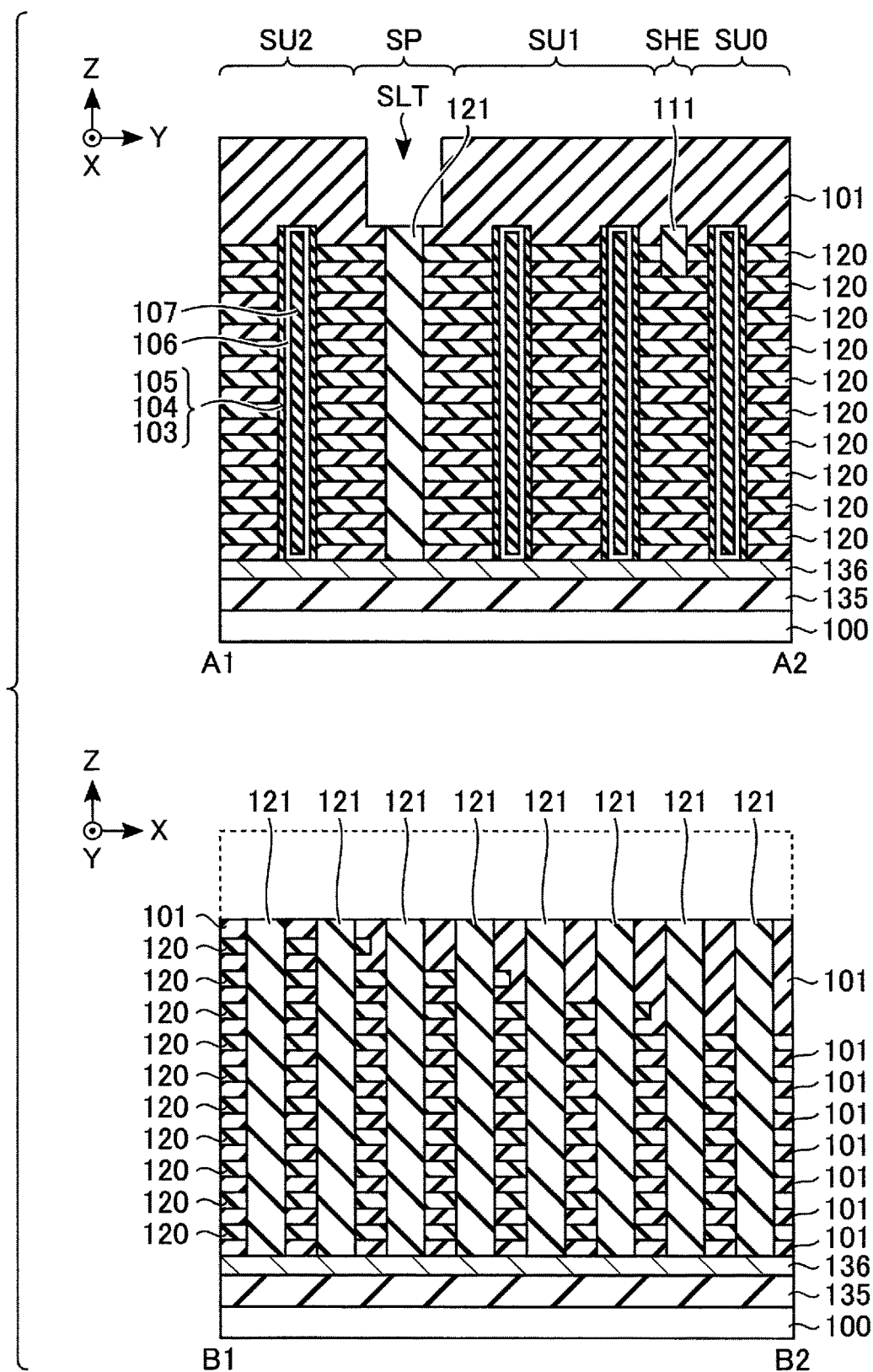

As shown in FIG. 64, after memory pillars MP are formed, an insulating layer 101 is formed so as to cover top surfaces of the memory pillars MP, an insulating layer 111, and sacrificial layers 121, similarly to the sixth embodiment described with reference to FIG. 50. Subsequently, the topmost insulating layer 101 is etched, thereby forming a slit SLT corresponding to a local interconnect LI on the sacrificial layers 121.

Figure 65:
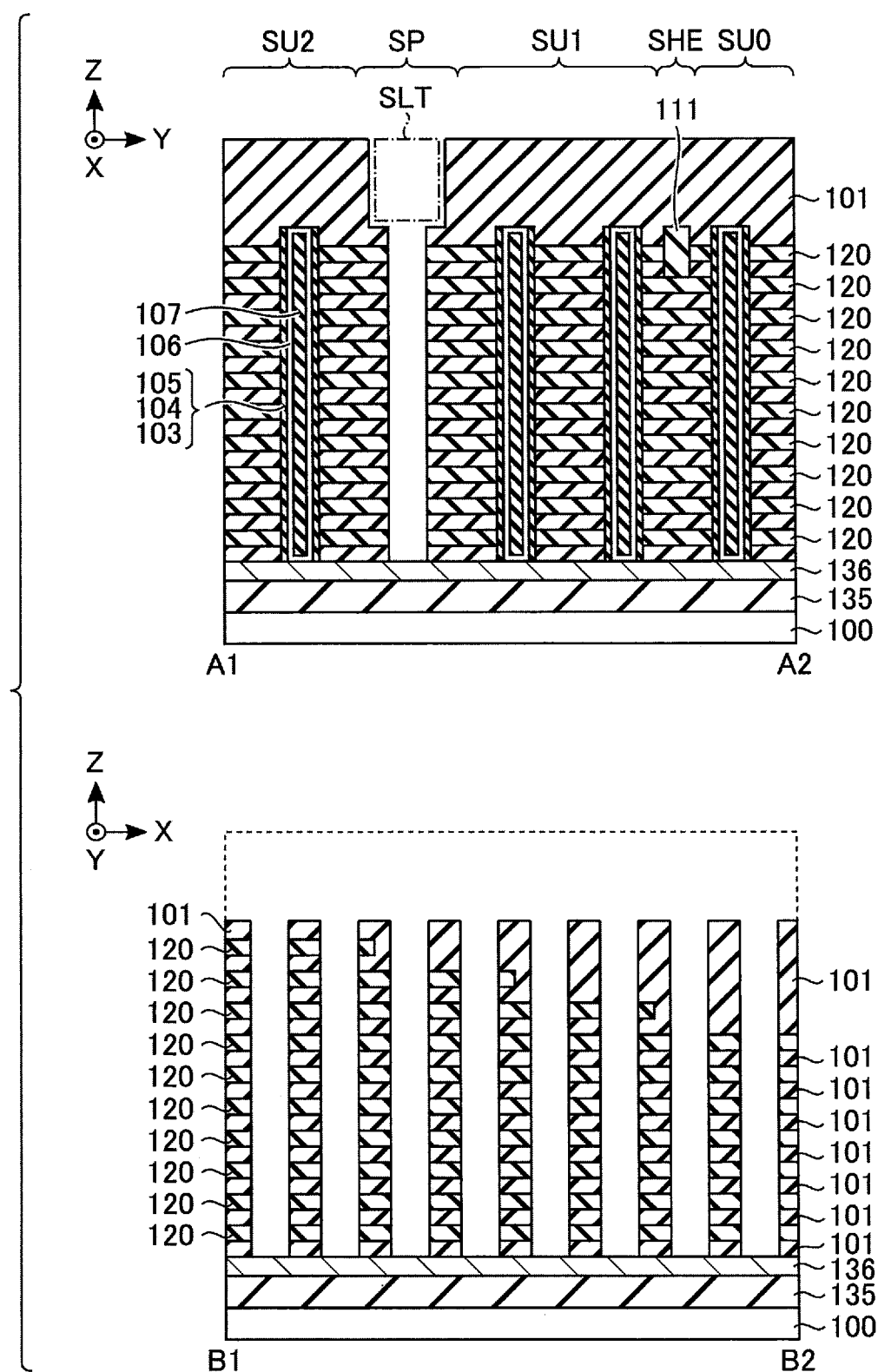

As shown in FIG. 65, the sacrificial layer 121 at a bottom portion of the slit SLT is removed by, for example, wet etching. Thereby, holes HL1 are formed.

Figure 66:
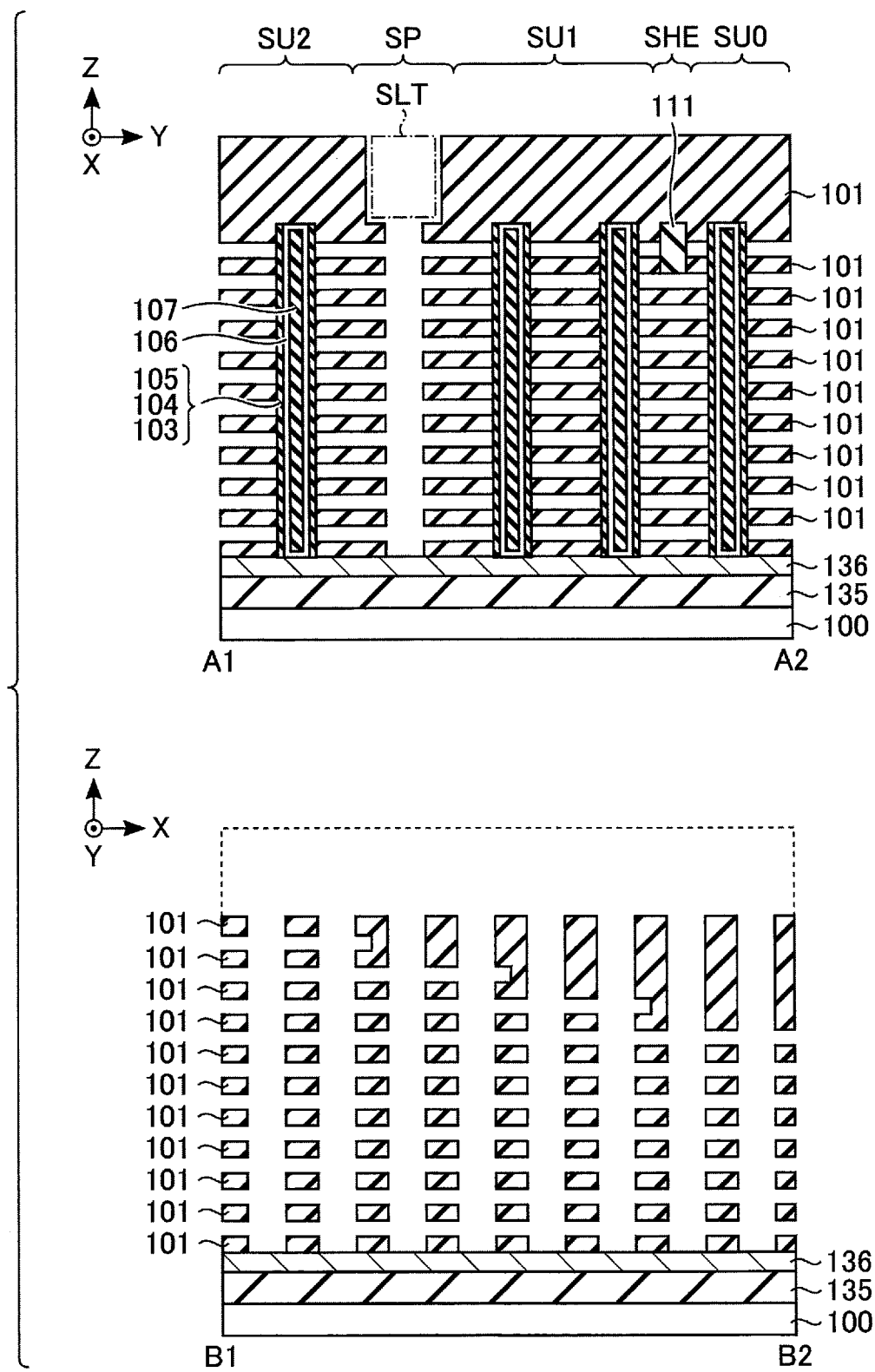

As shown in FIG. 66, the sacrificial layers 120 are removed from side surfaces of the holes HL1 by, for example, wet etching. Thereby, air gaps are formed between the insulating layers 101 in the Z direction.

Figure 67:
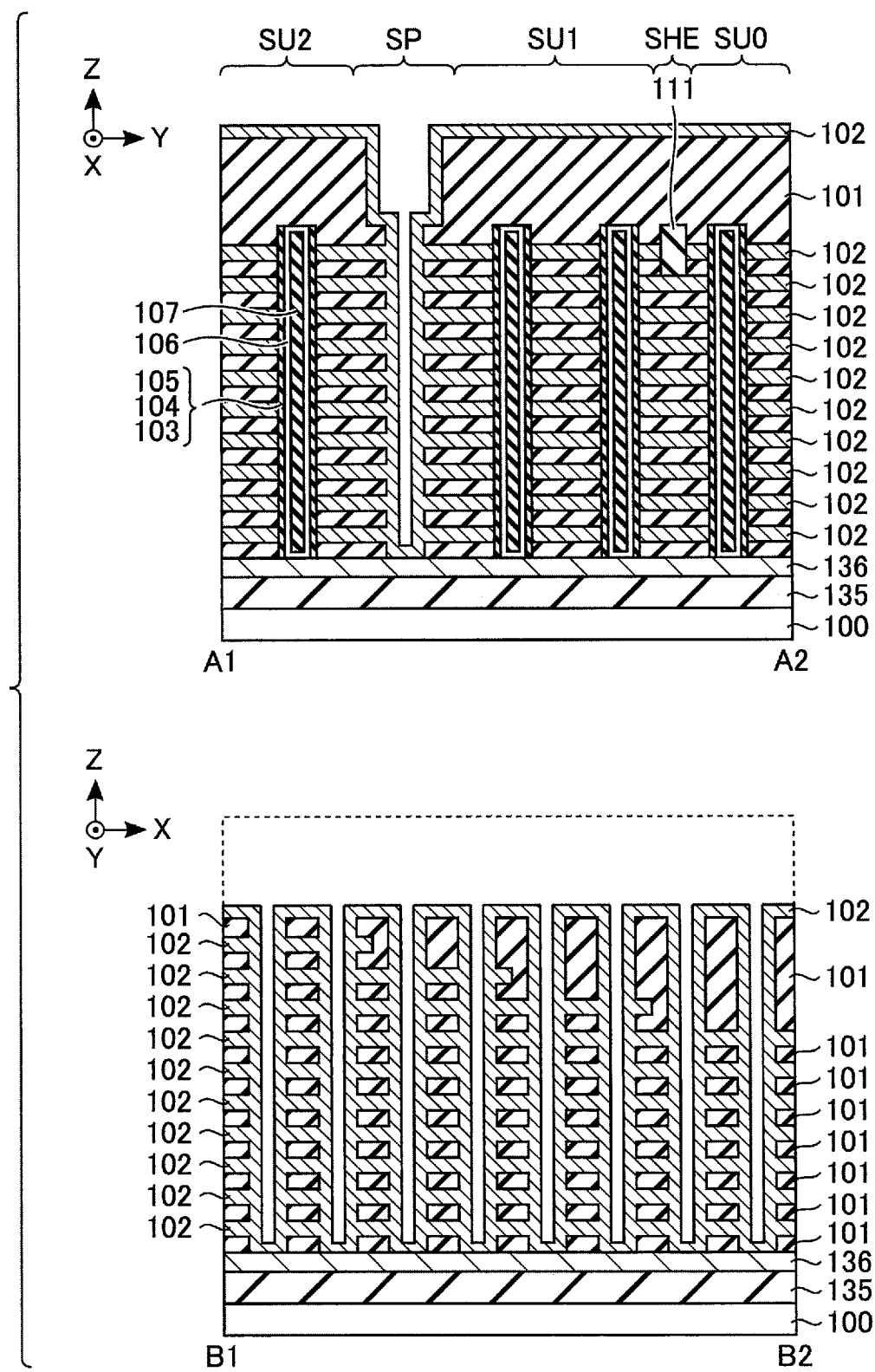

As shown in FIG. 67, an interconnect layer 102 with a thickness that allows the air gaps between the insulating layers 101 to be filled in but does not fill in the holes HL1 is formed.

Figure 68:
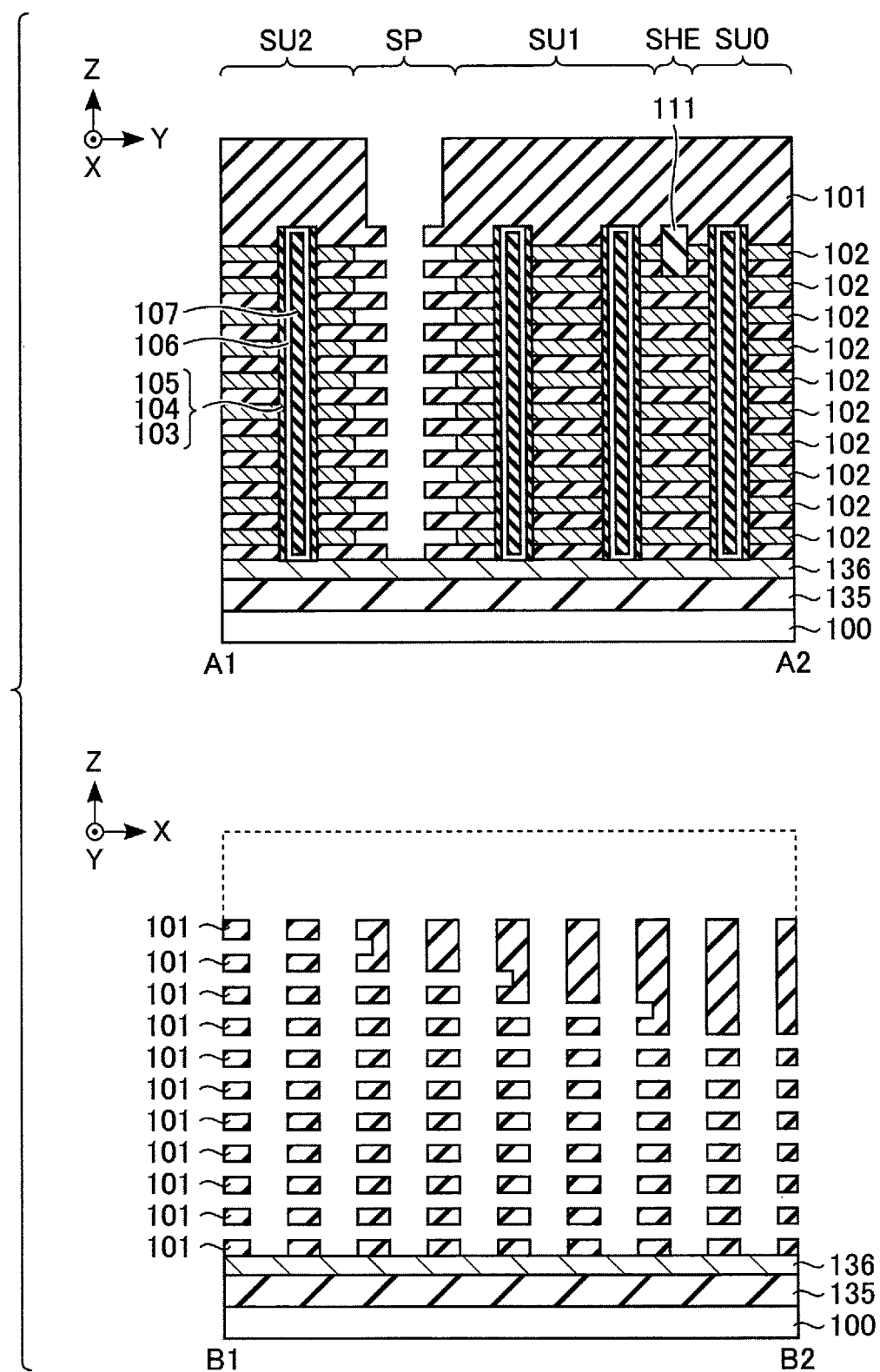

As shown in FIG. 68, the interconnect layer 102 formed on the topmost insulating layer 101 and side surfaces of the holes HL1 is removed by, for example, wet etching. At this time, the interconnect layers 102 are partially removed from the side surfaces of the holes HL1, thereby forming portions corresponding to the protruding portions TS. Thereby, the interconnect layer 102 in the separation region SP is removed.

Figure 69:
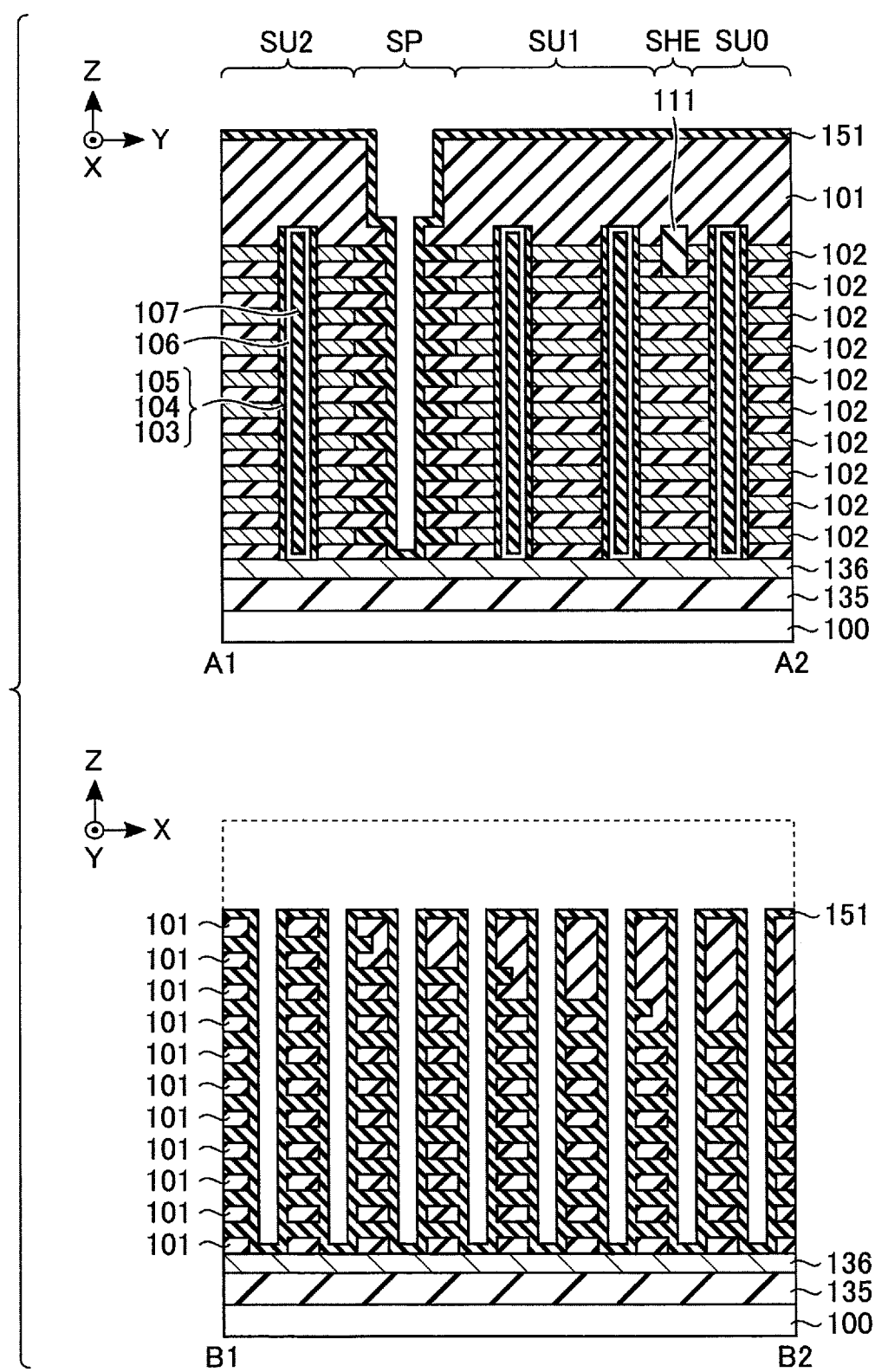

As shown in FIG. 69, an insulating layer 151 is formed using, for example, a technique that has a good step coverage, such as CVD and ALD, thereby filling in the portions corresponding to the protruding portions TS. At this time, the insulating layer 151 is formed to have a thickness that does not allow the hole HL1 to be filled in. The insulating layer 151 may be a stacked structure of two or more layers.

As shown in FIG. 70, the insulating layer 151 formed on the topmost insulating layer 101 and bottom surfaces of the holes HL1 is removed by, for example, RIE.

Figure 71:
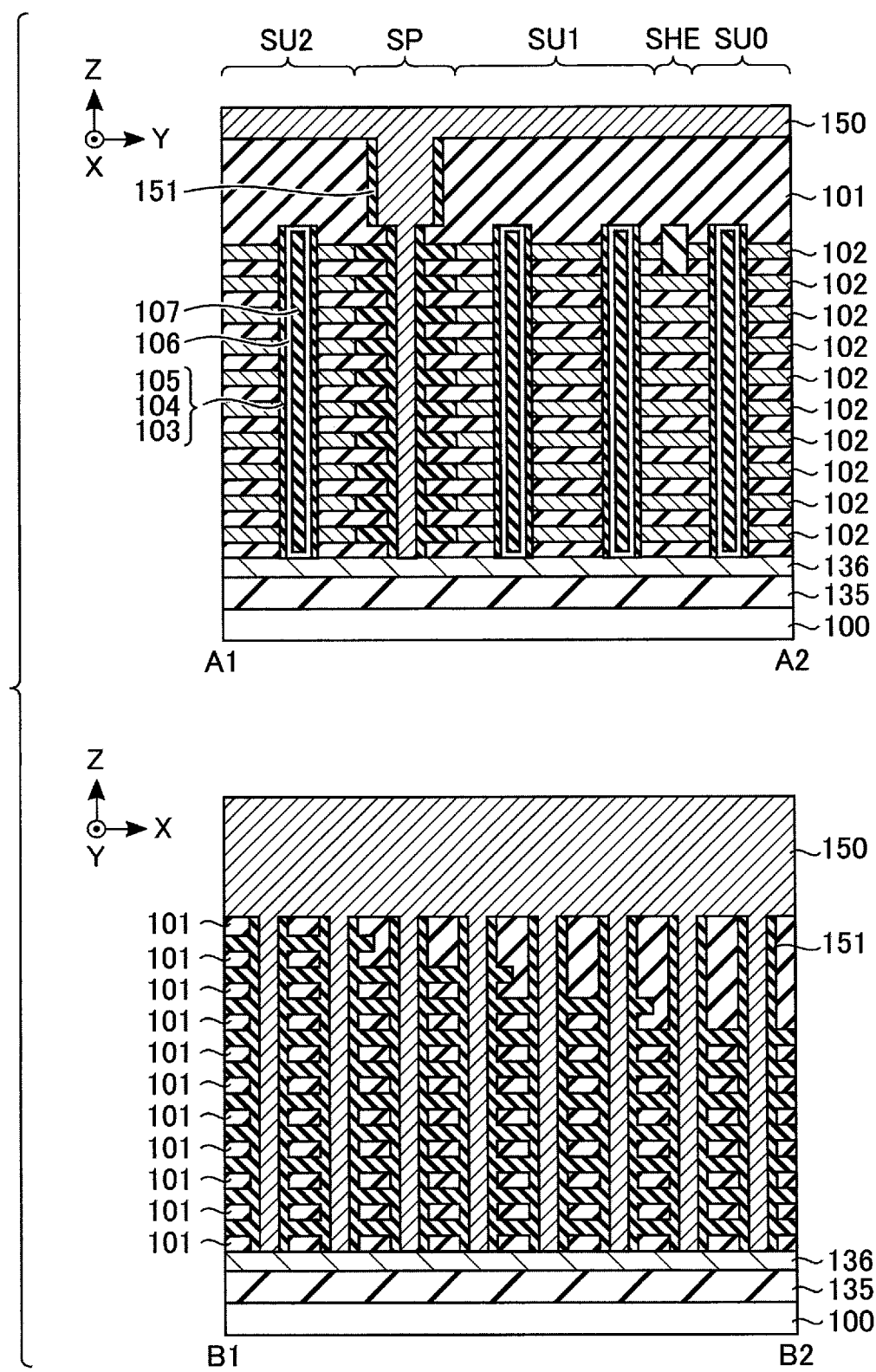

As shown in FIG. 71, the holes HL1 and the slit SLT are filled with a conductive layer 150.

As shown in FIG. 72, the conductive layer 150 on the insulating layer 101 is removed by, for example, CMP. Thereby, the contact plugs CP1 and the local interconnect LI are formed.

7.4 Effects of Present Embodiment

According to the configuration of the present embodiment, it is possible to obtain effects similar to those of the first and sixth embodiments.

Moreover, according to the configuration of the present embodiment, since a line-shaped local interconnect LI is formed on the contact plugs CP1, it is possible to reduce the aspect ratio of the slit SLT. It is thereby possible to reduce the possibility that a void will occur when the slit SLT is filled with the conductive layer 150.

8. Modifications, Etc

A semiconductor memory device according to above embodiments includes: a plurality of first insulating layers (101) arranged apart from each other in a first direction (Z direction); a plurality of first interconnect layers (102) stacked alternately with the first insulating layers, and extending in a second direction (X direction) intersecting the first direction; a plurality of second interconnect layers (102) stacked alternately with the first insulating layers, arranged adjacently to the first interconnect layers in a third direction (Y direction) intersecting the first and second directions, and extending in the second direction; a plurality of first semiconductor layers (106) extending in the first direction and passing through the first interconnect layers and the first insulating layers; a plurality of second semiconductor layers (106) extending in the first direction and passing through the second interconnect layers and the first insulating layers; and a separation region (SP) including a plurality of first portions (HB) and a plurality of second portions (TS) The first portions extend in the first direction, pass through the first insulating layers, are provided between the first interconnect layers and the second interconnect layers, and are arranged apart from each other in the second direction. The second portions are provided between the first interconnect layers and the second interconnect layers, and protrude from an outer periphery of each of the first portions. The second portions protruding from adjacent ones of the first portions are linked to each other. The first interconnect layers and the second interconnect layers are separated from each other in the third direction by the first portions and the linked second portions.

By applying the above-described embodiments, it is possible to provide a semiconductor memory device with reduced manufacturing cost.

For example, the structures of the separation region SP described in the above embodiments may be replaced wherever possible.

The embodiments are not limited to the aspects described above, and various modifications may be made. The term "couple" in the above-described embodiments includes, for example, indirect coupling with a transistor, a resistor, etc. interposed therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a plurality of first insulating layers arranged apart from each other in a first direction;

a plurality of first interconnect layers stacked alternately with the first insulating layers, and extending in a second direction intersecting the first direction;

a plurality of second interconnect layers stacked alternately with the first insulating layers, arranged adjacently to the first interconnect layers in a third direction intersecting the first and second directions, and extending in the second direction;

a plurality of first semiconductor layers extending in the first direction and passing through the first interconnect layers and the first insulating layers;

a plurality of second semiconductor layers extending in the first direction and passing through the second interconnect layers and the first insulating layers; and a separation region including a plurality of first portions and a plurality of second portions, the first portions extending in the first direction, passing through the first insulating layers, being provided between the first interconnect layers and the second interconnect layers, and being arranged apart from each other in the second direction, the second portions being provided between the first interconnect layers and the second interconnect layers, and protruding from an outer periphery of each of the first portions, wherein the second portions protruding from adjacent ones of the first portions are linked to each other, the first interconnect layers and the second interconnect layers are separated from each other in the third direction by the first portions and the linked second portions, and a first length between centers of two adjacent ones of the first portions is less than double a second length from a center of one of the first portions to an outer periphery of one of the second portions corresponding to the one of the first portions, in a cross section intersecting the first direction and including one of the first interconnect layers and one of the second interconnect layers.

2. The device according to claim 1, wherein
each of the first portions includes a first conductive layer, and each of the second portions includes a second insulating layer.

3. The device according to claim 1, wherein
a part of the first insulating layers is provided between one of the first portions and another one of the first portions that is adjacent to the one of the first portions.

4. The device according to claim 1, further comprising:
a charge storage layer provided between one of the first semiconductor layers and one of the first interconnect layers.

5. The device according to claim 1, wherein
the first portions and the second portions include a second insulating layer, and do not include any conductive layers.

6. The device according to claim 5, wherein
at least one of the second portions includes an air gap surrounded by the second insulating layer.

7. A semiconductor memory device comprising:
a plurality of first insulating layers arranged apart from each other in a first direction;

a plurality of first interconnect layers stacked alternately with the first insulating layers, and extending in a second direction intersecting the first direction;

a plurality of second interconnect layers stacked alternately with the first insulating layers, arranged adjacently to the first interconnect layers in a third direction intersecting the first and second directions, and extending in the second direction;

a plurality of first semiconductor layers extending in the first direction and passing through the first interconnect layers and the first insulating layers;

a plurality of second semiconductor layers extending in the first direction and passing through the second interconnect layers and the first insulating layers; and a separation region including a plurality of first portions and a plurality of second portions, the first portions extending in the first direction, passing through the first insulating layers, being provided between the first interconnect layers and the second interconnect layers, and being arranged apart from each other in the second direction, the second portions being provided between the first interconnect layers and the second interconnect layers, and protruding from an outer periphery of each of the first portions, wherein the second portions protruding from adjacent ones of the first portions are linked to each other, the first interconnect layers and the second interconnect layers are separated from each other in the third direction by the first portions and the linked second portions, and each of the first portions and the second portions includes an air gap.

8. The device according to claim 7, wherein
the separation region includes an insulating film provided on a side surface and a bottom surface of the air gap.

9. The device according to claim 7, wherein
the separation region includes an insulating film that is locally provided between the air gap and the first interconnect layers, and between the air gap and the second interconnect layers.

10. The device according to claim 1, wherein
each of the first portions includes an air gap, and each of the second portions does not include an air gap.

11. The device according to claim 1, wherein
each of the first semiconductor layers and the second semiconductor layers is formed in a plurality of first tiers that are coupled in the first direction; and
each of the first portions is formed in a plurality of second tiers different from the plurality of first tiers that are coupled in the first direction.

12. The device according to claim 1, further comprising:
an outer peripheral separation region that separates a memory cell array from a peripheral region thereof,
the first insulating layers, the first interconnect layers, the second interconnect layers, the first semiconductor layers, and the second semiconductor layers form a part of the memory cell array, and
the outer peripheral separation region has a structure that is substantially identical to a structure of the separation region.

13. The device according to claim 1, further comprising:
a third interconnect layer extending in the second direction and provided on the first portions, wherein
the third interconnect layer and the first portions include a first conductive layer.

14. A semiconductor memory device comprising:
a plurality of first insulating layers arranged apart from each other in a first direction;

a plurality of first interconnect layers stacked alternately with the first insulating layers, and extending in a second direction intersecting the first direction;

a plurality of second interconnect layers stacked alternately with the first insulating layers, arranged adjacently to the first interconnect layers in a third direction intersecting the first and second directions, and extending in the second direction;

a plurality of first semiconductor layers extending in the first direction and passing through the first interconnect layers and the first insulating layers;

a plurality of second semiconductor layers extending in the first direction and passing through the second interconnect layers and the first insulating layers; and a separation region including an air gap extending in the first and second directions and separating the first interconnect layers and the second interconnect layers in the third direction, wherein each of the first insulating layers includes a first stack portion that is stacked alternately with the first interconnect layers, a second stack portion that is stacked alternately with the second interconnect layers, and a coupling portion that is provided in the separation region and that couples the first stack portion and the second stack portion, respective coupling portions of the first insulating layers are arranged apart from each other in the first direction, the air gap includes a plurality of first portions and a plurality of second portions, the first portions extending in the first direction, passing through the first insulating layers, being provided between the first interconnect layers and the second interconnect layers, and being arranged apart from each other in the second direction, the second portions being provided between the first interconnect layers and the second interconnect layers, and protruding from an outer periphery of each of the first portions, the second portions protruding from adjacent ones of the first portions being linked to each other, each of the first semiconductor layers and the second semiconductor layers is formed in a plurality of first tiers that are coupled in the first direction, and each of the first portions is formed in a plurality of second tiers different from the plurality of first tiers that are coupled in the first direction.

15. The device according to claim 14, wherein
the separation region includes an insulating film provided on a side surface and a bottom surface of the air gap.

16. The device according to claim 14, wherein
the separation region includes an insulating film that is locally provided between the air gap and each of the first interconnect layers, and between the air gap and each of the second interconnect layers.

17. The device according to claim 14, further comprising:
a charge storage layer provided between one of the first semiconductor layers and one of the first interconnect layers.

* * * * *